(12) United States Patent
Nielsen et al.

(10) Patent No.: US 10,879,875 B2
(45) Date of Patent: *Dec. 29, 2020

(54) VARIABLE FILTER

(71) Applicant: Anlotek Limited, London (GB)

(72) Inventors: Jorgen Staal Nielsen, Calgary (CA); Richard Nichols, Manhattan Beach, CA (US)

(73) Assignee: Anlotek Limited, London (GB)

(*) Notice: Subject to any disclaimer, the term of this patent is extended or adjusted under 35 U.S.C. 154(b) by 0 days.

This patent is subject to a terminal disclaimer.

(21) Appl. No.: 16/031,911

(22) Filed: Jul. 10, 2018

(65) Prior Publication Data

US 2018/0323770 A1 Nov. 8, 2018

Related U.S. Application Data

(63) Continuation of application No. 15/360,813, filed on Nov. 23, 2016, now Pat. No. 10,050,604.

(60) Provisional application No. 62/258,867, filed on Nov. 23, 2015.

(51) Int. Cl.
 *H03H 11/12* (2006.01)
 *H03G 3/30* (2006.01)

(52) U.S. Cl.
 CPC ....... *H03H 11/1208* (2013.01); *H03G 3/3042* (2013.01); *H03H 11/1291* (2013.01); *H03H 2210/012* (2013.01); *H03H 2210/015* (2013.01)

(58) Field of Classification Search
 CPC ......... H03H 11/1208; H03H 2210/012; H03H 2210/015; H03H 11/1291; H03G 3/3042
 See application file for complete search history.

(56) References Cited

U.S. PATENT DOCUMENTS

| 5,220,686 A | 6/1993 | Kasperkovitz et al. |
| 5,291,159 A | 3/1994 | Vale |
| 5,311,198 A | 5/1994 | Sutton |

(Continued)

FOREIGN PATENT DOCUMENTS

| CN | 102098018 A | 6/2011 |
| CN | 104538714 A | 4/2015 |

(Continued)

OTHER PUBLICATIONS

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

(Continued)

*Primary Examiner* — Diana J. Cheng
(74) *Attorney, Agent, or Firm* — Christensen O'Connor Johnson Kindness, PLLC

(57) ABSTRACT

A variable filter has a signal loop defined between a signal input and a signal output. A plurality of circuit elements connected in the signal loop, the plurality of circuit elements comprising a frequency tunable resonator, and an adjustable scaling block that applies a gain factor that is adjustable in a range that comprises a positive gain and a negative gain. A controller is connected to 1) tune the frequency tunable resonator; and to 2) adjust the gain factor of the adjustable scaling block between a negative gain factor to a positive gain factor providing for variable Q independent of frequency.

14 Claims, 72 Drawing Sheets

(56) References Cited

U.S. PATENT DOCUMENTS

| | | | |
|---|---|---|---|
| 5,854,593 A | 12/1998 | Dykema et al. | |
| 5,917,387 A | 6/1999 | Rice et al. | |
| 6,057,735 A | 5/2000 | Cloutier | |
| 6,236,281 B1 | 5/2001 | Nguyen et al. | |
| 6,452,465 B1 | 9/2002 | Brown et al. | |
| 6,771,147 B2 | 8/2004 | Mongia | |
| 6,898,450 B2 | 5/2005 | Eden et al. | |
| 6,941,118 B2 | 9/2005 | Yamamoto | |
| 6,954,774 B1 | 10/2005 | Mulbrook | |
| 7,158,010 B2 | 1/2007 | Fischer et al. | |
| 7,174,147 B2 | 2/2007 | Toncich et al. | |
| 7,400,203 B2 | 7/2008 | Ojo et al. | |
| 7,414,779 B2 | 8/2008 | Huber et al. | |
| 7,423,502 B2 | 9/2008 | Razafimandimby et al. | |
| 7,433,668 B2 | 10/2008 | Fischer et al. | |
| 7,522,016 B2 | 4/2009 | Toncich et al. | |
| 7,917,117 B2 | 3/2011 | Zafonte et al. | |
| 8,000,379 B2 | 8/2011 | Kishigami et al. | |
| 8,106,727 B2 | 1/2012 | Kawai et al. | |
| 8,140,033 B2 | 3/2012 | Chan Wai Po et al. | |
| 8,253,514 B2 | 8/2012 | Kharrat et al. | |
| 8,294,537 B2 | 10/2012 | Kawai et al. | |
| 8,565,671 B2 | 10/2013 | Robert et al. | |
| 8,767,871 B2 | 7/2014 | Park et al. | |
| 8,922,294 B2 | 12/2014 | Tsuzuki et al. | |
| 8,981,875 B2 | 3/2015 | Park | |
| 9,024,709 B2 | 5/2015 | Joshi et al. | |
| 9,129,080 B2 | 9/2015 | Tsuzuki et al. | |
| 9,231,712 B2 | 1/2016 | Hahn et al. | |
| 9,407,239 B2 | 8/2016 | White et al. | |
| 10,050,604 B2 | 8/2018 | Nielsen et al. | |
| 2001/0043116 A1 | 11/2001 | Waltman | |
| 2007/0296513 A1 | 12/2007 | Ruile et al. | |
| 2009/0322445 A1 | 12/2009 | Raidl et al. | |
| 2010/0097152 A1 | 4/2010 | Wang et al. | |
| 2010/0141355 A1* | 6/2010 | Kharrat | H03H 9/462 333/197 |
| 2011/0187448 A1 | 8/2011 | Koechlin | |
| 2013/0065542 A1 | 3/2013 | Proudkii | |
| 2013/0142089 A1 | 6/2013 | Azarnaminy et al. | |
| 2013/0293291 A1 | 11/2013 | Shanan | |
| 2014/0266454 A1 | 9/2014 | Testi et al. | |
| 2016/0072442 A1 | 3/2016 | Testi et al. | |
| 2016/0164481 A1 | 6/2016 | Madan et al. | |

FOREIGN PATENT DOCUMENTS

| | | |
|---|---|---|
| EP | 1 675 263 A1 | 6/2006 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2011/103108 A1 | 8/2011 |
| WO | 2015/176041 A1 | 11/2015 |

OTHER PUBLICATIONS

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHz Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems—II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems—II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the IEEE Radio Frequency Integrated Circuits (RFIC) Symposium, Fort Worth, Texas, Jun. 6-8, 2004, pp. 643-646.

International Search Report and Written Opinion dated Feb. 8, 2017, issued in corresponding International Application No. PCT/GB2016/053686, filed Nov. 23, 2016, 10 pages.

Kuhn, W.B., et al., "Q-Enhanced LC Bandpass Filters for Integrated Wireless Applications," IEEE Transactions on Microwave Theory and Techniques 46(12):2577-2586, Dec. 1998.

Luo, X., et al., "Tunable Bandpass Filter With Two Adjustable Transmission Poles and Compensable Coupling," IEEE Transactions on Microwave Theory and Techniques 62(9):2003-2013, Sep. 2014.

Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.

Piazza, G., "MEMS Resonators for Frequency Control and Sensing Applications," presentation, University of Pennsylvania, Philadelphia [at least as early as Apr. 24, 2015], 104 pages.

Psychogiou, D., et al., "V-Band Bandpass Filter With Continuously Variable Centre Frequency," IET Microwaves, Antennas & Propagation 7(8):701-707, Jun. 2013.

Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.

Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.

Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.

Soorapanth, T., and S.S. Wong, "A 0-dB IL 2140±30 MHz Bandpass Filter Utilizing Q-Enhanced Spiral Inductors in Standard CMOS," IEEE Journal of Solid-State Circuits 37(5):579-586, May 2002.

Sunca, A., et al., "A Wide Tunable Bandpass Filter Design Based on CMOS Active Inductor," Proceedings of the Eighth Conference on Ph.D. Research in Microelectronics and Electronics (PRIME), Session TF3-Microwave and RF, Aachen, Germany, Jun. 12-15, 2012, pp. 203-206.

Wang, S., and R.-X. Wang, "A Tunable Bandpass Filter Using Q-Enhanced and Semi-Passive Inductors at S-Band in 0.18-μM CMOS," Progress in Electromagnetics Research B 28:55-73, 2011.

Written Opinion of the International Preliminary Examining Authority dated Feb. 5, 2018, issued in corresponding International Application No. PCT/GB2016/053686, filed Nov. 23, 2016, 6 pages.

(56) References Cited

OTHER PUBLICATIONS

He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.

* cited by examiner

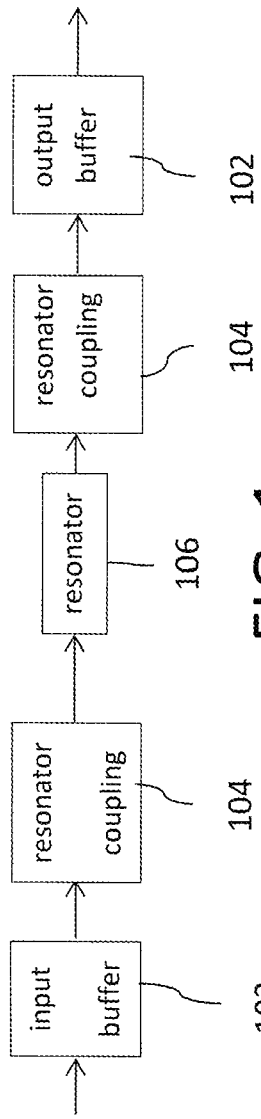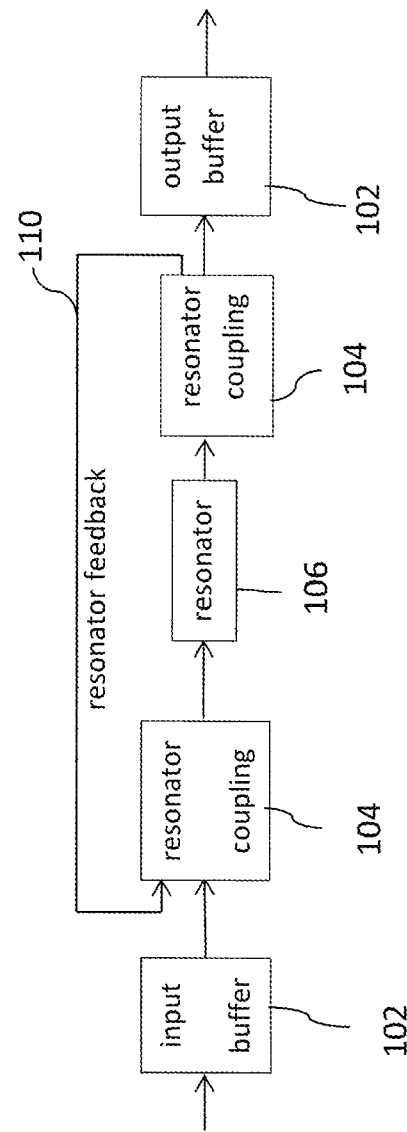

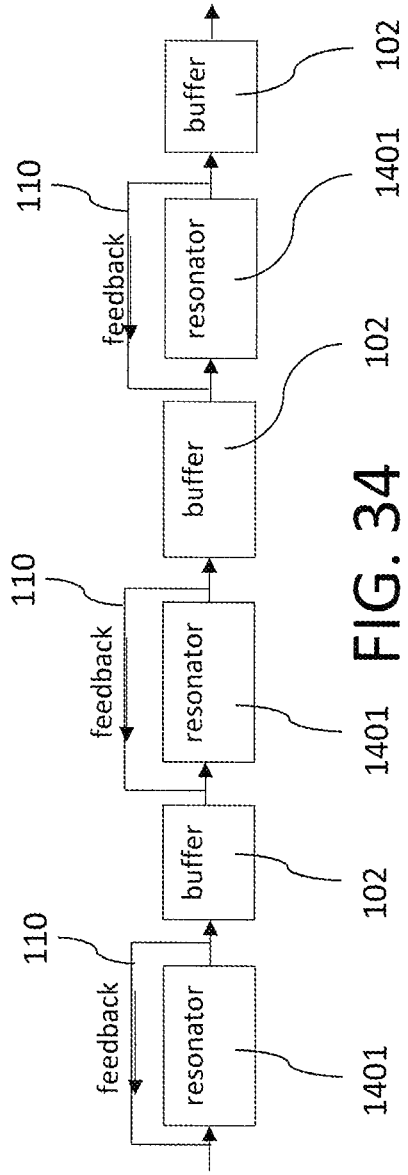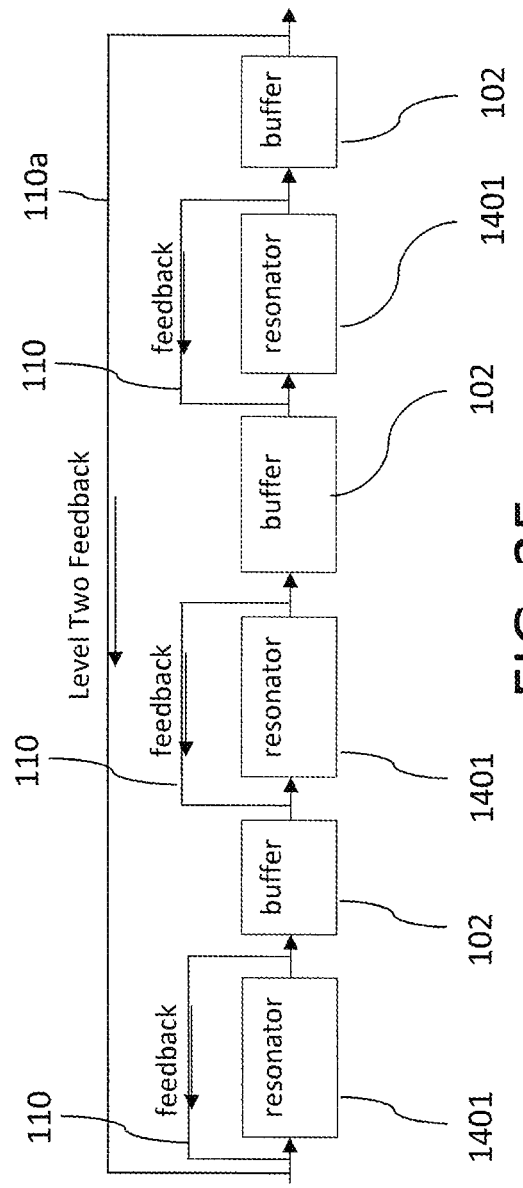

VARIABLE FILTER

CROSS-REFERENCE TO RELATED APPLICATIONS

This application is a continuation of U.S. patent application Ser. No. 15/360,813, filed Nov. 23, 2016, which claims benefit of U.S. Provisional Patent Application No. 62/258,867, filed Nov. 23, 2015, all of which is incorporated by reference herein in their entirety.

TECHNICAL FIELD

This relates to a variable filter that may be used for analog rf (radio frequency), microwave and millimeter wave frequency filtering applications, and may also be extended to higher or lower electromagnetic frequencies. The variable filter may be controllable and applicable in band-pass frequency filtering applications in which it is desirable to be able to electronically adjust the pass-band center frequency, the bandwidth, or both. The variable filter may be reduced to chip size.

BACKGROUND

Bandpass filters (BPF) are commonly used in signal processing for various purposes. A BPF generally involves some form of resonator that stores energy in a given frequency band. This resonator will have an input coupling and an output coupling. Classical filters for electronic circuit applications are built on this principle. The resonator may be, for example, in the form of a transmission line cavity, waveguide cavity, lumped inductor and capacitor components, or a crystal where mechanical resonances of the crystal are coupled via electrodes to the electrical circuit. The crystal could also be in a form of a small block of ceramic material. An active form of a bandpass filter could include buffers associated with the input and output resonator couplers such that the external coupling does not degrade the frequency selectivity of the resonator. Such an active filter is illustrated in FIG. 1, which shows a generic active bandpass filter (BPF) having input and output buffers 102, resonator couplings 104, and a resonator 106.

The BPF of FIG. 1 can be made into a tunable BPF if the properties of the resonator can be adjusted. If they can be adjusted using passive elements, then the BPF is a tunable BPF. The energy storage of the resonator can also be arranged with feedback in which signal from the output coupling is fed back into the input coupling. This is shown in FIG. 2, which depicts a generic BPF with a feedback path 110. Referring to FIG. 3, a gain block 112 and delay block 114 may be added that condition the feedback to modify the resonance slightly. The addition of a gain block will turn a passive tunable BPF into an active tunable BPF. With this active feedback, more control is possible in which the phase and the amplitude of the feedback can be controlled to give a narrower bandwidth and finer control over the center frequency.

More specifically, the resonator feedback can be implemented in which the gain and the delay of the resonator feedback is assumed to be adjustable which modifies the frequency selectivity characteristics of the BPF. FIG. 3 shows control of the BPF feedback being implemented with the delay block 114, where the adjustability of the circuit elements is denoted by a diagonal arrow through the element.

If the overall loop gain (the loop consisting of the feedback path 110, couplers 104 and resonator 106) exceeds unity then the BPF becomes an oscillator, resonating at a frequency determined by the properties of the resonator 106 itself and the feedback loop 110. Backing off the feedback gain such that the loop gain is slightly less than unity results in a BPF with an arbitrarily narrow bandwidth. If the resonator 106 selectivity is reduced such that it has a broader pass band then the feedback can tune the filter over a broader range without becoming an oscillator.

Another general implementation is shown in FIG. 4 wherein the feedback delay element is replaced by a phase shifter 116, the phase shifter implementing control of the feedback. Signal time delay and signal phase shift are approximately analogous for narrow bandpass filters.

The circuit topology of FIG. 4 is essentially that of the super-regenerative amplifier filter that was developed back in the 1930's (Armstrong). If the resonator 106 is based on a single inductor then the feedback results in a Q-enhanced inductor circuit. If a capacitor is placed in parallel with the Q-enhanced inductor then a tunable filter circuit results. Such circuits are published and well known.

The teachings in United States pre-grant publication no. 2013/0065542 (Proudkii) entitled "Spectral Filtering Systems" are based generally on the circuit of FIG. 4 with a fixed resonator element at low Q, often referred to as a comb-line filter.

SUMMARY

There is provided a variable filter, comprising a signal loop defined between a signal input and a signal output, and a plurality of circuit elements connected in the signal loop. The plurality of circuit elements comprises a frequency tunable resonator, and an adjustable scaling block that applies a gain factor that is adjustable in a range that comprises a positive gain and a negative gain. There is also a controller connected to tune the frequency tunable resonator and to adjust the gain factor of the adjustable scaling block between a negative gain factor to a positive gain factor.

According to further aspects, the variable filter may comprise one or more of the following elements, alone or in combination. The frequency tunable resonator may comprise, but is not limited to, adjustable elements such as a varactor diode, variable dielectric capacitors, switched discrete capacitors, a MEMS variable capacitor, a fixed inductor, a variable inductor such as a MEMS variable inductor, or a mechanically adjustable resonator. The plurality of circuit elements may comprise a plurality of frequency tunable resonators. The plurality of circuit elements comprises two or more, or two or three frequency tunable resonators. One or more frequency tunable resonators may be connected in a secondary signal loop that is connected within the signal loop, and each secondary signal loop may comprise a secondary adjustable scaling block. The adjustable scaling block may comprise a main adjustable scaling block and is connected in series with each of the frequency tunable resonators. The plurality of circuit elements may comprise a plurality of adjustable scaling blocks. The controller may be connected to independently tune two or more frequency tunable resonators. The controller may be programmed to selectively Q-spoil or Q-enhance one or more frequency tunable resonators. The variable filter may further comprise a sensor that measures the frequency response of the signal loop, the sensor being in communication with the controller, wherein the controller is programmed to tune the one or more frequency tunable resonator(s), and control the gain factor of the one or more adjustable scaling block(s) in response to the measured frequency response to achieve a desired frequency response in the filter.

According to an aspect, there is provided a method of filtering a signal, comprising the steps of: providing a variable filter as described above; and adjusting the filter by tuning the one or more frequency tunable resonator(s) and adjusting the gain factor of each adjustable scaling block to achieve a desired frequency response in the filter.

According to further aspects, the method may include one or more of the following steps, alone or in combination. Adjusting the filter may comprise independently tuning two or more frequency tunable resonators. Adjusting the filter may comprise Q-spoiling or Q-enhancing at least one frequency tunable resonator. The method may further comprise the step of measuring the frequency response of the signal loop, and using the controller to tune the one or more frequency tunable resonators and adjust the gain factor of each adjustable scaling block in response to the measured frequency to achieve a desired frequency response in the filter.

According to an aspect, there is provided a programmable filter, comprising a plurality of variable filters as described above, and a switch matrix connected to the inputs and the outputs of the plurality of variable filters. The switch matrix is configurable to connect one or more variable filters in more than one signal path configurations. A controller is connected to tune the frequency tunable resonators, adjust the gain factor of the adjustable scaling blocks, and configure the switch matrix between signal path configurations in order to achieve a desired frequency response in the filter.

According to a further aspect, the switch matrix may comprise connections for selectively connecting one or more variable filters in a signal loop.

According to an aspect, there is provided a variable filter, comprising: a signal loop defined between a signal input and a signal output; a plurality of secondary signal loops connected in the signal loop, each secondary signal loop comprising a frequency tunable resonator and a secondary adjustable scaling block that applies a gain factor that is adjustable in a range that comprises a positive gain and a negative gain; a main adjustable scaling block; and a controller connected to tune each of the frequency tunable resonators and to adjust the gain factor of each of the main and secondary adjustable scaling blocks, the gain factors being adjustable in a range that comprises a negative gain factor and a positive gain factor.

According to an aspect, there is provided a multiband filter circuit, comprising a plurality of filter elements, wherein the plurality of filter elements are selected from a group consisting of a variable filter as described above. Two or more filter elements may be connected in parallel or in series.

According to an aspect, there is provided a circuit comprising a plurality of resonators having a variable center frequency that has a means of varying the center frequency of the filter passband, a scaling circuit that can scale the amplitude output of the bandpass filter, a feedback path, an input coupler, and an output coupler wherein the scaling factor or gain of the scaling circuit can be adjusted and controlled.

According to other aspects, there may be a plurality of resonators, such as two or three resonators, and the element to control the frequency may be a variable capacitor, a variable dielectric capacitor, a variable inductor, a variable dimension of a resonator length, a MEMS device, or other known structure. The circuit is preferably a loop circuit, such that the various components may be in series in different orders. The circuit preferably allows for Q-spoiling of at least one resonator of the filter. The resonator may be a series LC, parallel LC, or a third order bandpass filter. If there is more than one resonator, the resonators may be individually tuned such that the resonance frequencies may be staggered. Each resonator may have an individual scaling circuit that affects the Q of the resonator individually. The scaling circuits may be a variable resistor, FET, or other known device that permits for a range of gain factors that includes both positive and negative gains. The resonators may be configured by incrementing or decrementing the resonator parameters based on an output characteristic of the overall filter response of the circuit, such as by measuring the overall filter dominant pole location based on the measured or inferred impulse response. There may be a plurality of filters, switches, and connections in a configurable structure that may be configured in such a manner as to string several filters in series to realize a higher order filter, such as a Butterworth or Chebyshev bandpass filter. The filter may also be used as a band reject filter.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein:

FIG. 1 is a block diagram of a prior art active bandpass filter.

FIG. 2 is a block diagram of a prior art active bandpass filter with a feedback loop.

FIG. 34 is a block diagram of three first order variable filters connected in series FIG. 35 is a block diagram of three first order variable filters connected in series with an additional feedback path.

DETAILED DESCRIPTION

The presently described bandpass filter uses a resonator element of variable frequency that may be adjusted such that the resonator center frequency is coincident with the desired center frequency of the tunable filter with feedback. In this way the resonator bandwidth can be narrow enough to avoid spurious passband responses but still be able to tune over a broad range in frequency. In addition, the gain element, which may also be described herein as a scaling block, is adjustable to provide positive gain, negative gain, or zero gain. As will be described in more detail below, this allows the scaling block to act selectively as a Q-enhancer and a Q-spoiler. This filter architecture is referred to herein as a controllable analog filter (CAF). A block diagram of the simplest form of the CAF with a variable resonator 502 and a variable scaling block 504 in a signal loop is given in FIG. 5. The description below relates primarily to the design and control aspects of the CAF. The CAF is intended to be used in the transmitting, receiving, and/or processing of communications signals for various purposes, some of which are described as examples below. Generally speaking, a communication signal is a modulated signal used to transmit information or data. Typically, this involves an analog carrier frequency that has been encoded with an information signal, using known methods, such as frequency modulation, amplitude modulation, or phase modulation.

Figure 6:
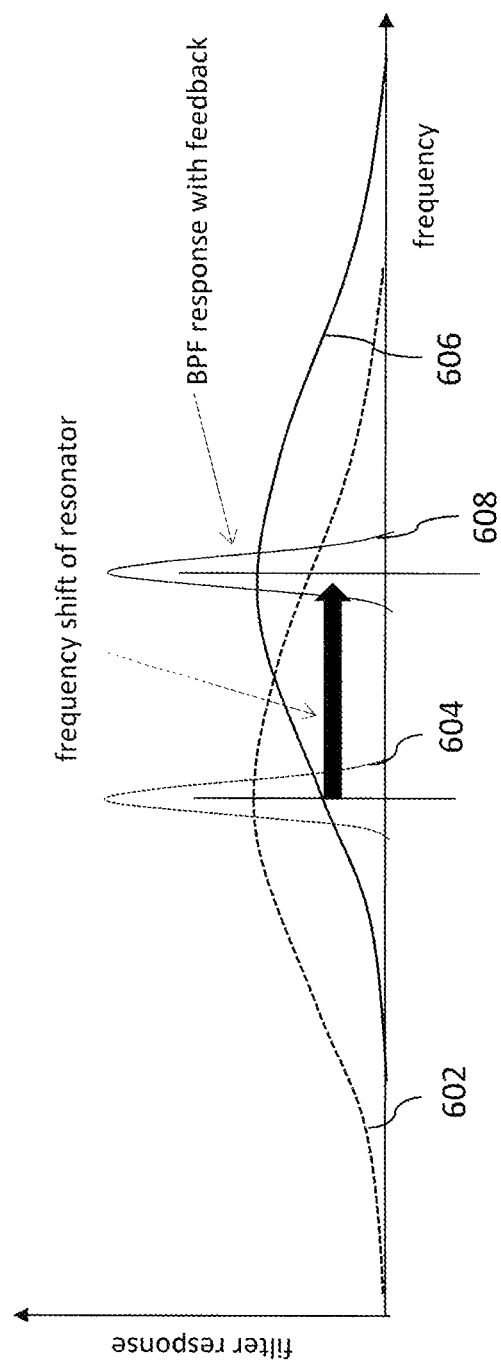
FIG. 6 is a graph showing the bandpass characteristics of a variable filter.

The fundamental operating principle of the CAF, which offers control of bandpass characteristics, is shown in FIG. 6, where the wide dashed trace 602 is the resonator frequency response at an initial setting. The narrow dashed trace 604 is the sharper frequency response of the closed loop filter set for a narrower bandwidth at the initial frequency setting. Assume that the resonator is now tuned upward in frequency to the wide solid trace 606 as indicated by the black arrow. The narrow solid trace 608 is the closed loop response that results at the new resonator response frequency.

The CAF may be of different orders, such as a first, second and third order filter. The order of the CAF depends on the filter order of the resonator. The CAF may be designed with higher orders beyond the third order, although the complexity of controlling higher order circuits will increase. Some general comments on the filter order are given below.
- A first order CAP (CAT-1) would include one resonator that has a single dominant resonance pole pair.
- A second order CAF (CAF-2) would include two such resonators that have two dominant pole pairs, an example being a cascade of two coupled LC tank resonators.
- A third order CAP (CAF-3) would include three such resonators having three dominant pole pairs.
- Fourth and higher order CAFs are possible, however these may result in spurious resonance bands when a scaling block feedback is applied (as in FIG. 5), and generally result in a BPF with more challenging tuning characteristics. This will be discussed in more detail below.

The examples discussed herein will relate primarily to first, second and third order CAFs, although it will be understood that the teachings herein may also apply to higher order filters if desired.

Figure 3:
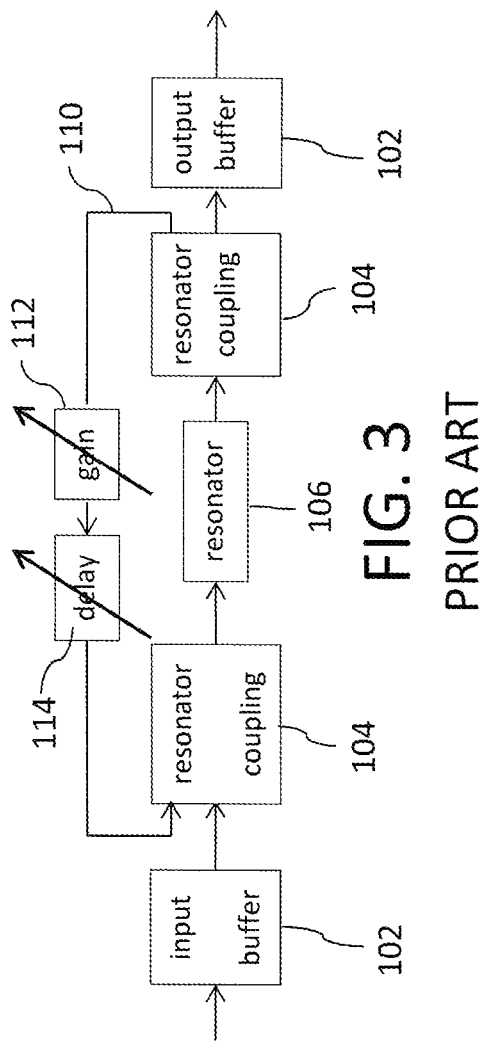
FIG. 3 is a block diagram of a prior art bandpass filter with a delay element in a feedback loop.
Figure 4:
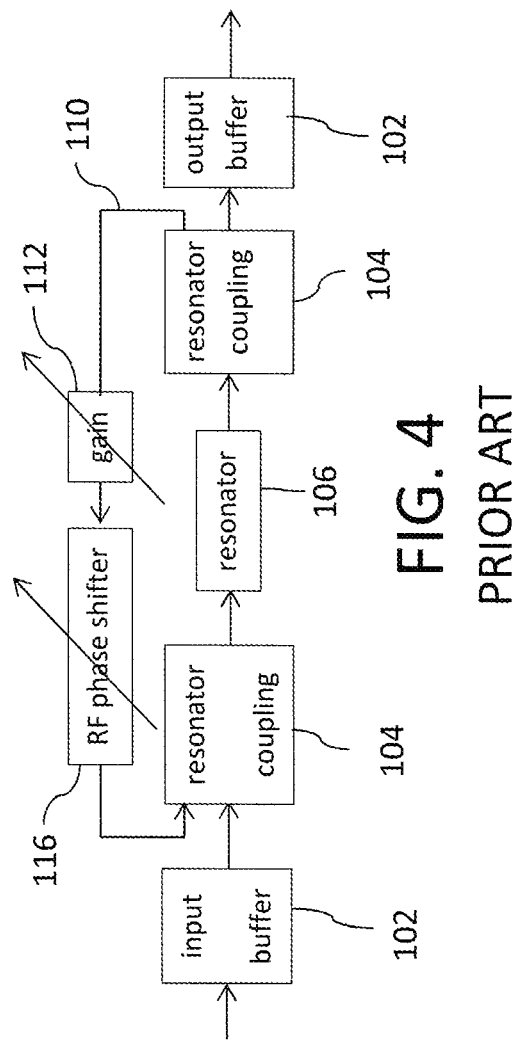
FIG. 4 is a block diagram of a prior art bandpass filter with a phase shifter in the feedback loop.
Figure 5:
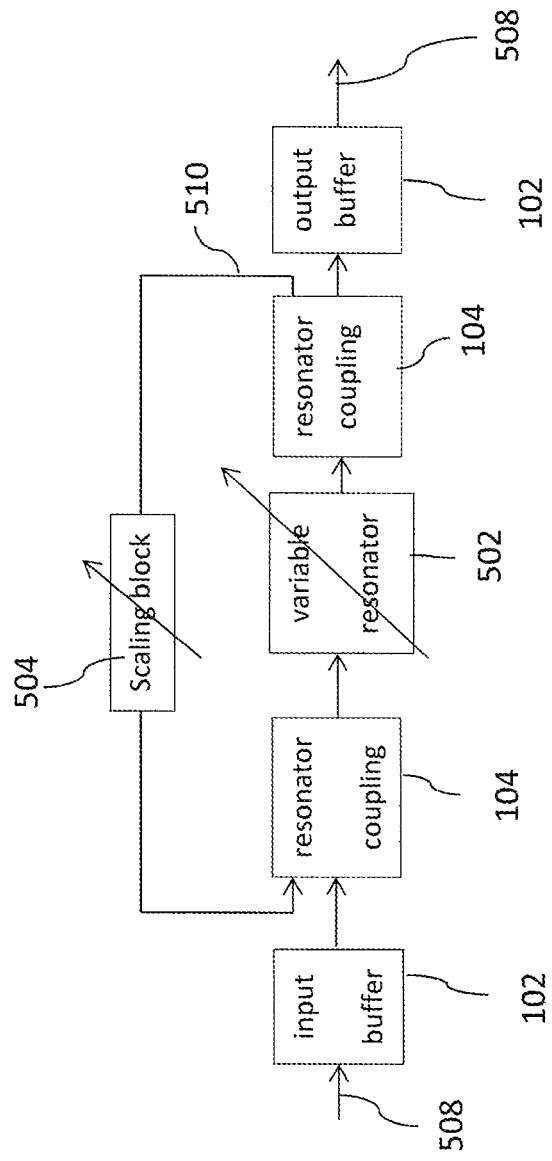
FIG. 5 is a block diagram of a variable filter with a variable resonator and a variable scaling block in a signal loop.
Figure 7:
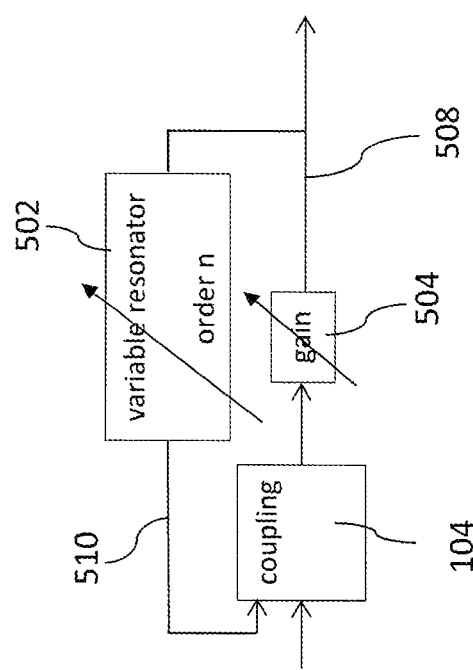
FIG. 7 is a block diagram depicting a possible variant of the variable filter.

In the various examples presented herein, the circuits are, for convenience, typically depicted in the style of FIG. 5, which shows an arrangement having a main path 508 and a feedback path 510, and generally with the gain block 504 (which may also be referred to as a scaling block and which can have both positive or negative values) on the feedback path 510. This is done for consistency and to make it easy to compare circuits. However, the circuit may be more appropriately considered as a loop with appropriate input and output couplings, where the loop is formed from what would otherwise be the main path 508 and the feedback path 510, and the elements are connected in series within the loop. As a loop, the order of the components in the loop can be changed without affecting the resonance characteristics of the CAF-n. An example of a circuit with the elements in a different arrangement shown in FIG. 7, where the gain block 504 is connected in the main path 508, and the variable resonator 502 is connected in the feedback path 510. It will be understood that other variations of the CAF circuit topologies are also possible, and will depend on the number of elements used in the respective circuit.

Theoretical Development of a Bandpass Filter with No Resonator

Figure 8:
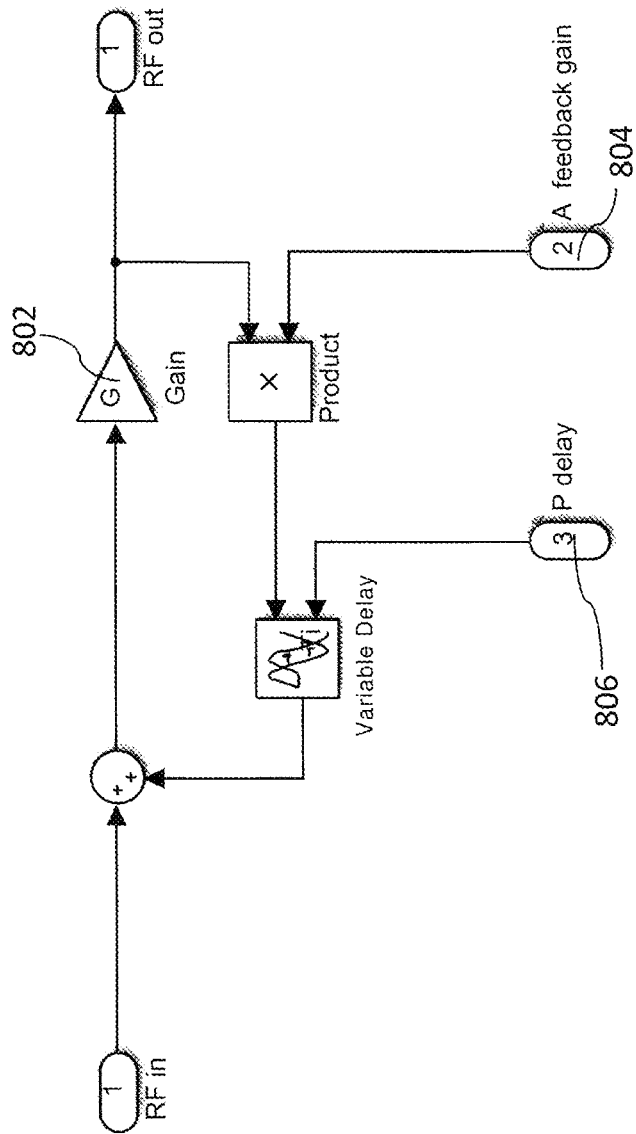
FIG. 8 is a block diagram of a bandpass filter without a resonator block.

Before presenting the theory of the CAF, the theoretical performance of a CAF-0 (a CAF with no resonator) is discussed. This would be a basic bandpass filter of the type shown in FIG. 8, which has a gain block 802, attenuator 804 and variable phase shift or delay 806.

The phase shift 806, either through a transport delay or a phase shifting element, varies with frequency, imparting to the feedback loop its frequency selectivity. Based on this circuit description, the linear transfer function of the depicted circuit can be stated as a Laplace transform (frequency domain response) written as $$H_{ABF0}(s) = \frac{G}{1 - AGe^{-sP}}$$

where P is the phase shift. We can write this in terms of the physical frequency f with the mapping $s \rightarrow j2\pi f$ as $$H_{ABF0}(f) = \frac{G}{1 - AGe^{-j2\pi Pf}}$$

Note that this is periodic in frequency with a period of $f_p = P^{-1}$. That is, although the CAF-0 has no specific resonator element, resonance bands occur whenever $$\mathrm{mod}(f_p, P^{-1}) = 0.$$

In the following numerical example, assume that the delay P is 100 psec and that G=1 and A=0.9. Hence resonance will occur at 0 Hz, 10 GHz, 2.0 GHz, etc. Another observation is that all the resonant bands have the same in-band gain of 20 dB which is a result of $$H(f)|_{f=\frac{n}{P}} = \frac{G}{1 - AGe^{-j2\pi P\frac{n}{P}}}$$
$$= \frac{G}{1 - AGe^{-j2\pi n}}$$
$$= \frac{G}{1 - AG}$$
$$= \frac{1}{1 - .9} = 10 \Rightarrow 20\mathrm{dB}$$

Figure 9:
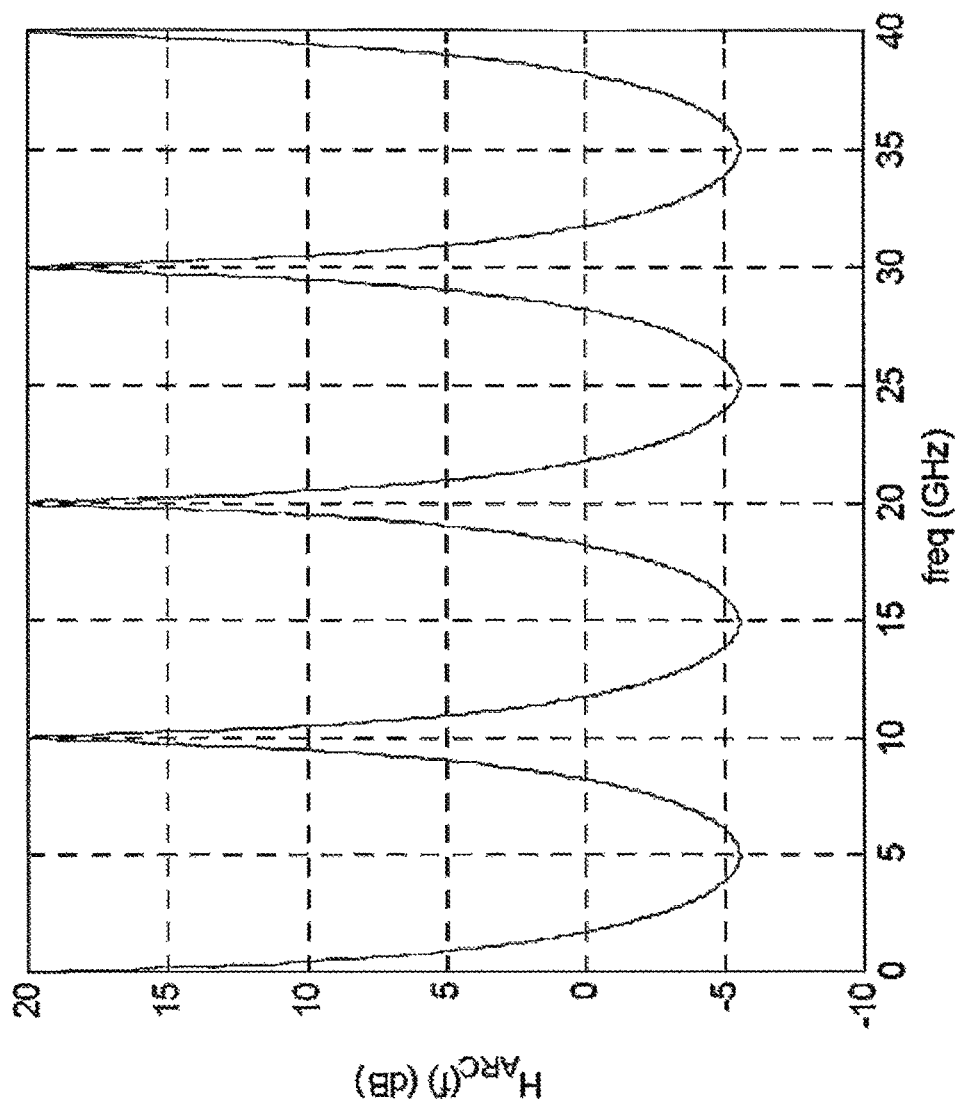
FIG. 9 is a graph of the periodic "comb-line" response of the bandpass filter shown in FIG. 8.

Such filter performance is commonly referred to as a comb-line filter in reference to the transfer function plotted in FIG. 9.

Considering the fundamental resonance at f=1/P, we can see by changing P we can get any arbitrary resonance. The response at DC and the higher order harmonics can easily be attenuated by a suitable low pass and high pass filter that are cascaded in series with the circuit of FIG. 8.

The Q and damping factor D of the CAF-0 are derived from the Laplace transform of the CAF-0 given before as $$H_{ABF0}(s) = \frac{G}{1 - AGe^{-sP}}$$

It is enough to determine the principle solution for the pole at zero frequency on the real axis given as $$AGe^{-sP} = 1$$

$$-sP = \ln\left(\frac{1}{AG}\right)$$

$$s = \sigma = \frac{1}{P}\ln(AG)$$

Figure 10:
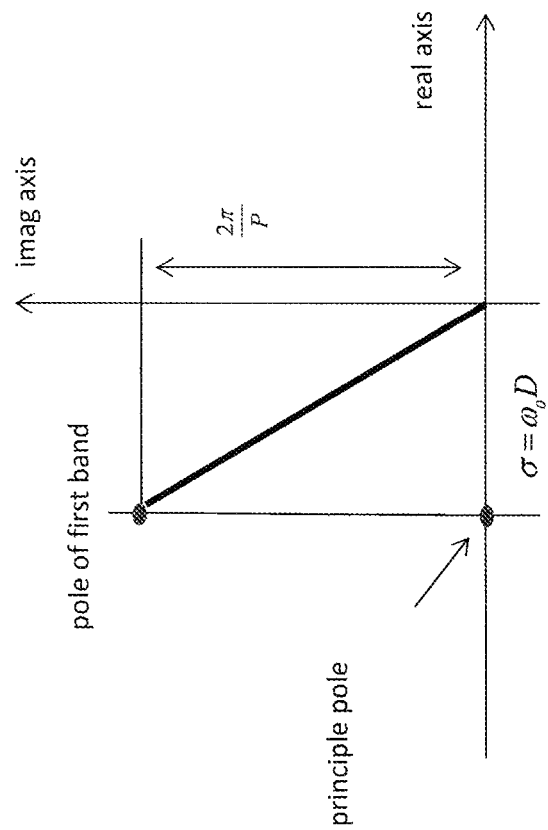
FIG. 10 is a depiction on a complex plane of the first passband pole of the bandpass filter shown in FIG. 8.

Now consider the dominant passband pole shown in FIG. 10.
We have $$\omega_o D = \sigma = -\frac{1}{P}\ln(AG)$$

where D is defined as the damping coefficient and $\omega_0$ is the natural resonant frequency in rads/sec. This gives $$D = -\frac{1}{\omega_o}\frac{1}{P}\ln(AG)$$

$$= -\frac{P}{2\pi}\frac{1}{P}\ln(AG)$$

$$= -\frac{1}{2\pi}\ln(AG)$$

$$= \frac{1}{2\pi}\ln(1 + AG - 1) \approx \frac{1 - AG}{2\pi}$$

This Taylor expansion simplification is based on the assumption that $AG \approx 1$. The approximate relation to Q (valid for larger Q say Q>10) is given as $$Q = \frac{\omega_o}{2\sigma} = \frac{\omega_o}{2\omega_o D} = \frac{1}{2D} = \frac{\pi}{1 - AG}$$

Figure 11:
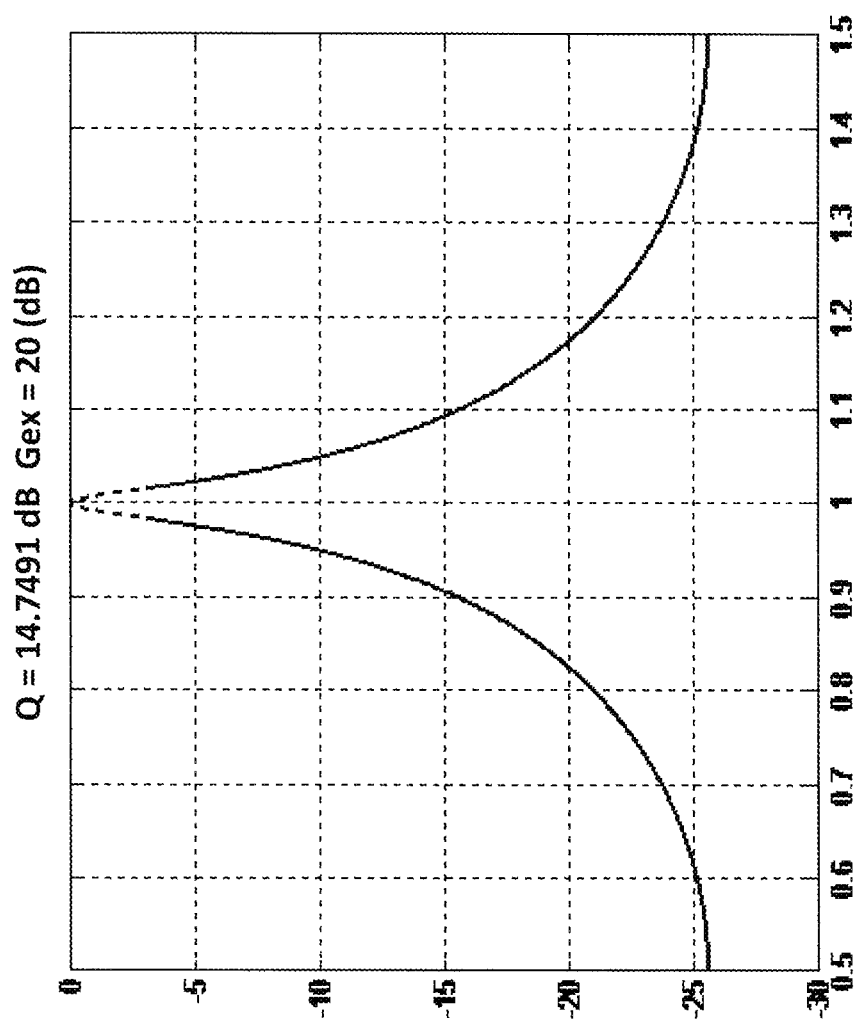
FIG. 11 is a graph depicting the frequency response of the bandpass filter of FIG. 8 in the vicinity of the first resonance band.

This makes sense in that Q increases to infinity as the loop gain AG becomes 1. FIG. 11 shows an example of the calculation of the response around the first resonance pole for AG=0.90 The portion represented by a broken line is the response within the 3 dB bandwidth from which the expression of Q can be validated.

A more direct way of calculating the Q factor is to have $$Q = \frac{\omega_o}{2\Delta\omega}$$

where $\Delta\omega$ is determined from the 3 dB point of H(s). At the real axis pole $$1 = |AGe^{-j(\omega_o + \Delta\omega)P}|$$

$$\frac{1}{AG} = |e^{-j\Delta\omega P}| = 1$$

$$1 - \frac{1}{AG} \approx \Delta\omega P$$

$$\frac{AG - 1}{AG} = \Delta\omega P = \frac{2\Delta\omega\pi}{\omega_o}$$

From this we have $$Q = \frac{\pi AG}{1 - AG} \approx \frac{\pi}{1 - AG}$$

which was obtained before.
Next consider the power gain that is associated with a given Q. The power gain is given as $$G_p = \left(\frac{G}{1 - AG}\right)^2 = \frac{G^2}{\pi^2}\left(\frac{\pi}{1 - AG}\right)^2 \approx \frac{G^2}{\pi^2}Q^2$$

Figure 12:
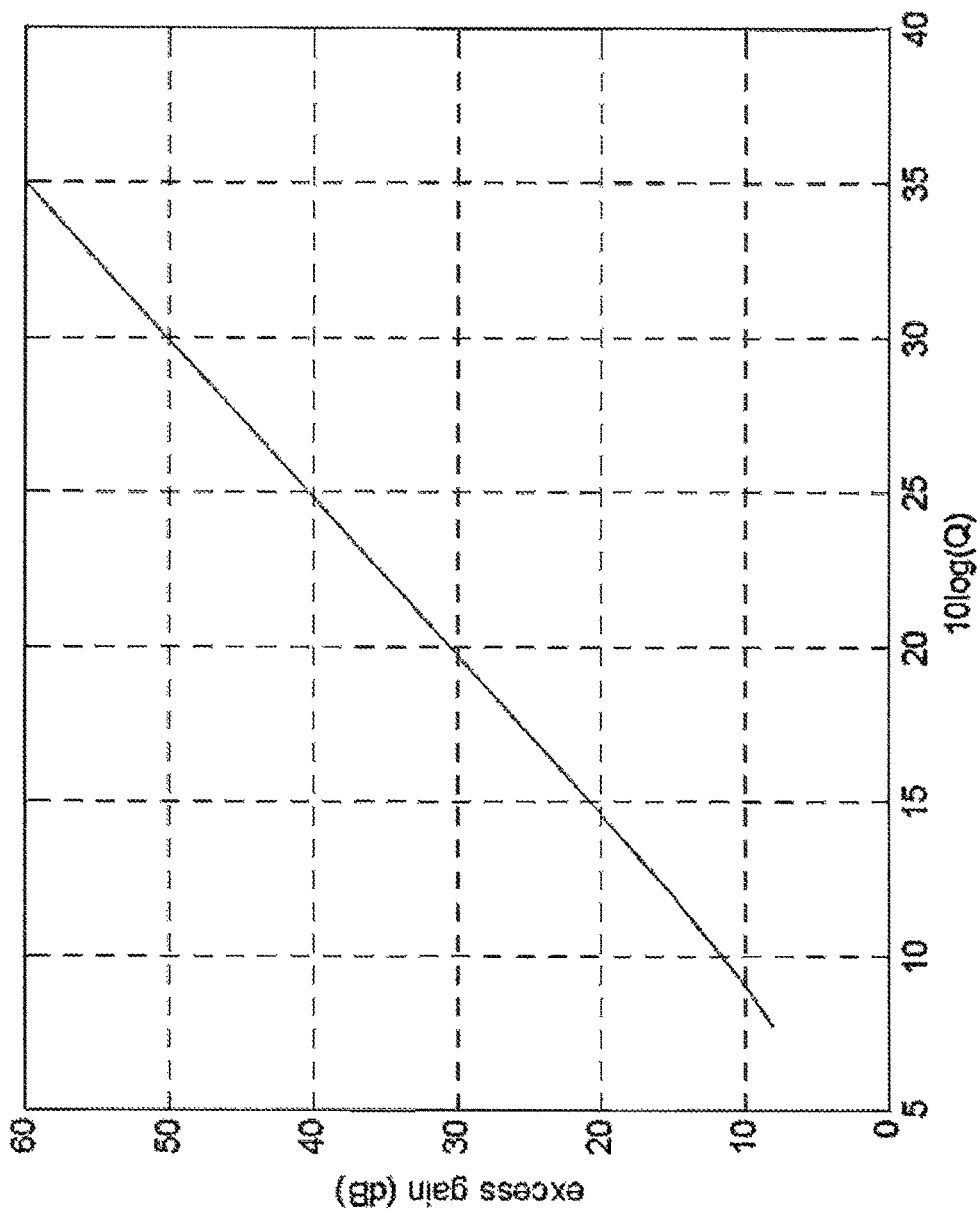
FIG. 12 is a graph of the excess power gain vs. Q of the bandpass filter of FIG. 8.

The excess gain resulting from the feedback path, denoted as $G_{ex}$, is the power gain normalized by the open loop gain (no feedback path) as $$G_{ex} \approx 20\log\left(\frac{Q}{\pi}\right)$$

in dB. This is plotted in FIG. 12.
Elements of the CAF
Before Turning to Structure of the CAF, the Following CAF Elements are Discussed.
Tunable CAF Resonator (R)
The resonator block 1301 is denoted as R in FIG. 13. R is represented by two poles in the S-plane as is also shown in the diagram on the right of FIG. 13. The two poles are represented by 'x'. By incorporating a feedback loop across the resonator as in FIG. 14, Q control is made possible. This is discussed in detail later. As depicted, resonator block 1401 with feedback incorporating gain or scaling block 802 as shown in FIG. 14 is the basic resonator element that has two control inputs 1302 and 1304 one for changing the frequency (1302), and the other for changing the Q (1304).

Depending on the circuit being implemented, the resonator can be implemented either as a resonator element, such as a LC tank circuit, or as a Second Order Section (SOS) filter element. The SOS implementation will be discussed in more detail below.

As will be understood from the discussion herein, there are a number of possible combinations of resonators and scaling blocks, and signal paths that can be used in designing a CAR The particular design will depend on the desired circuit performance, as is discussed elsewhere. Generally speaking, the CAF will include a feedback loop comprising a desired number of resonators and a scaling block. Each CAF may be connected in parallel or in series with other CAF elements, or other circuit elements, and may have an additional level two feedback loop that comprises multiple CAR. In addition, there may be nested loops within a CAF element, comprising a loop for each resonator, or subset of resonators. As used herein, the term "level two feedback" is intended to refer to a feedback or circuit loop that provides a feedback path around multiple CAF-n elements in series. This may also include what could otherwise be referred to as a level three or level four feedback.

The resonant frequency of R can be varied with some component included in the resonator circuit. Typically, this may be accomplished using a varactor diode, or a variable dielectric capacitor may be used for a variable capacitance, in which case the 'f control' in FIG. 13 would be an analog bias voltage. Other variants that allow the resonant frequency to be varied may also be used, such as a discrete capacitance that is switched in or out of the circuit and hence 'f control' can be a digital signal. Another variant is that a MEMS variable capacitor or a MEMS variable inductor could be used where 'f control' is a bias control voltage or current signal applied to the MEMS device. The variable capacitance or inductance can also be realized by mechanical tuning of a component. For instance, R could be a microwave resonance cavity in which one or more dimensions of the cavity are mechanically adjustable by some mechanism supplying 'f control'.

The two poles of R are a conjugate pair and cannot be controlled individually. Hence to simplify the description we consider only the positive frequency pole. We therefore consider the elemental resonator as having a single pole in the domain of s (that is the region of s with positive imaginary component). R is a two port device with a transfer function given in the Laplace domain, denoted as above as a standard second order bandpass transfer function $H_R(s)$:

$$H_R(s) = \frac{as}{s^2 + 2D\omega_n s + \omega_n^2}$$

Q Control Scaling Block

Figure 13:
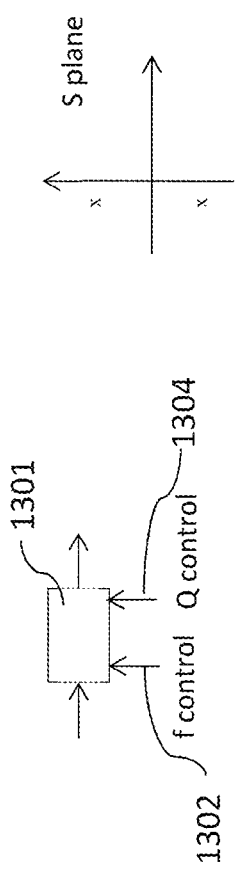
FIG. 13 is a visual definition of an elemental resonator, with S-plane poles.
Figure 14:
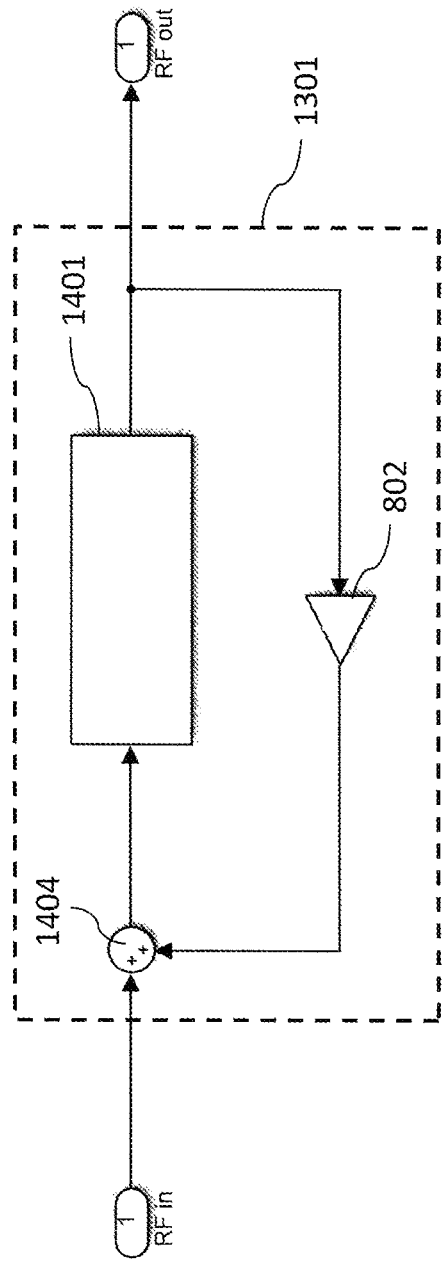
FIG. 14 is a block diagram of a first order variable filter CAP-1.

The 'Q control' 1304 in FIG. 13 above can comprise a control device associated with the resonator that controls the component Q of the capacitance or the inductance or resonant cavity. If the Q control increases the component Q, this is referred to herein as Q-enhancement. If the Q control decreases the component Q of the resonant cavity, this is referred to herein as Q-spoiling. Q-enhancement is equivalent to decreasing D which moves the resonant pole of R closer to the jω axis of the S-plane. Q-spoiling moves the resonant pole of R further from the jω axis hence increasing D. It has been found that Q-enhancement and Q-spoiling may be used selectively to move a resonant pole towards or away from the jω axis to synthesize an arbitrary multi-pole filter function (plurality of R's).

Scaling blocks 802, as in FIG. 14, are provided in order to enable better control over the feedback response. The gain factor for each scaling block 802 is variable and comprises a gain that includes both positive and negative gain values. For example, if the gain of the scaling block 802 is greater than zero, there results Q-enhancement. If the gain of the scaling block 802 is less than zero, there results Q-spoiling.

In general, there will be an additional level two scaling block for each loop or secondary loop in a CAF-n element as discussed below. As an example, for a CAF-3 circuit element (see FIG. 35 for reference), where a series of three CAF-1 elements are connected within a loop and can be separately controlled, there may be four scaling blocks—a scaling block 802 surrounding each resonator element 1401 in loops 110, and one level two feedback scaling block 802a in loop 110a, as will be discussed below.

Generally, each scaling block will be capable of enabling Q-enhancement resonators and Q-spoiling resonators independently. Alternatively, the resonator may be a Q-enhanced resonator, which uses an amplifier that only allows for Q-enhancement. As noted above, the Q-enhanced resonator would still be nested within the feedback loop of the CAF-n element comprising a scaling block to override the Q-enhancement and provide a desired Q-spoiled performance as required. This will, of course, be apparent from the fact that the resonator may be any type of frequency tunable resonator comprising, but not limited to, a varactor diode, a switched discrete capacitor, a variable dielectric capacitor, a variable capacitor, such as a MEMS variable capacitor, a fixed inductor, a variable inductor, such as a MEMS variable inductor, or a mechanically adjustable resonator.

Topology of the CAF-1

There will now be described a first order of the CAF circuit, denoted CAF-1, which comprises a single resonator component 1401, a single gain or scaling block 802, and a combiner 1404 for closing the feedback loop as depicted in FIG. 14. This can be described in a simplified way if the center frequency control of the CAF-1 is omitted. This provides an intuitive method of understanding the CAF-n variants. In one example, resonator 1301 may be a second order bandpass filter with a transfer function of:

$$\frac{1}{s^2 + 2D\omega_o s + \omega_o^2}$$

with coefficients evaluated based on D and $\omega_o$. The gain G 802 is variable and controls the closed loop Q. Note that at resonance the phase shift through the resonator 1401 is ideally 0 degrees. In the physical implementation the phase shift will not be zero in general due to parasitics and transport effects, but these can be ignored in this evaluation: the implemented circuit will have a phase shifter associated with G 802 that will compensate for any parasitic and transport phase effects. To vary the frequency it is necessary to change $\omega_o$ of the resonator in the CAF-1, but this is ignored in this section.

It should be noted that, according to the notation used herein, the first order CAF-1 has a resonator of second order. What is referred to in "order" is the number of Second Order Sections (SOS) used that make up the overall resonator. An SOS transfer function refers to a Laplace function of frequency variables that are second order in the denominator. In the present context the SOS, as seen above, will always have the form of $$H_{SOS}(s) = \frac{as}{s^2 + 2D\omega_o s + \omega_o^2}$$

where $\omega_o$ is the resonance frequency in radians per second, D is the damping coefficient, and a is a real constant. The mapping to f in FIG. 13 is $f_n = \omega_n / 2\pi$ The mapping to Q is given by the conventional definition of $$Q = \frac{\text{center frequency}}{\text{3dB bandwidth}} = \frac{\omega_n}{2D\omega_n} = \frac{1}{2D}$$

In this discussion, $\{f_n,Q\}$ may then be used interchangeably with $\{\omega_n,D\}$.

Figure 15:
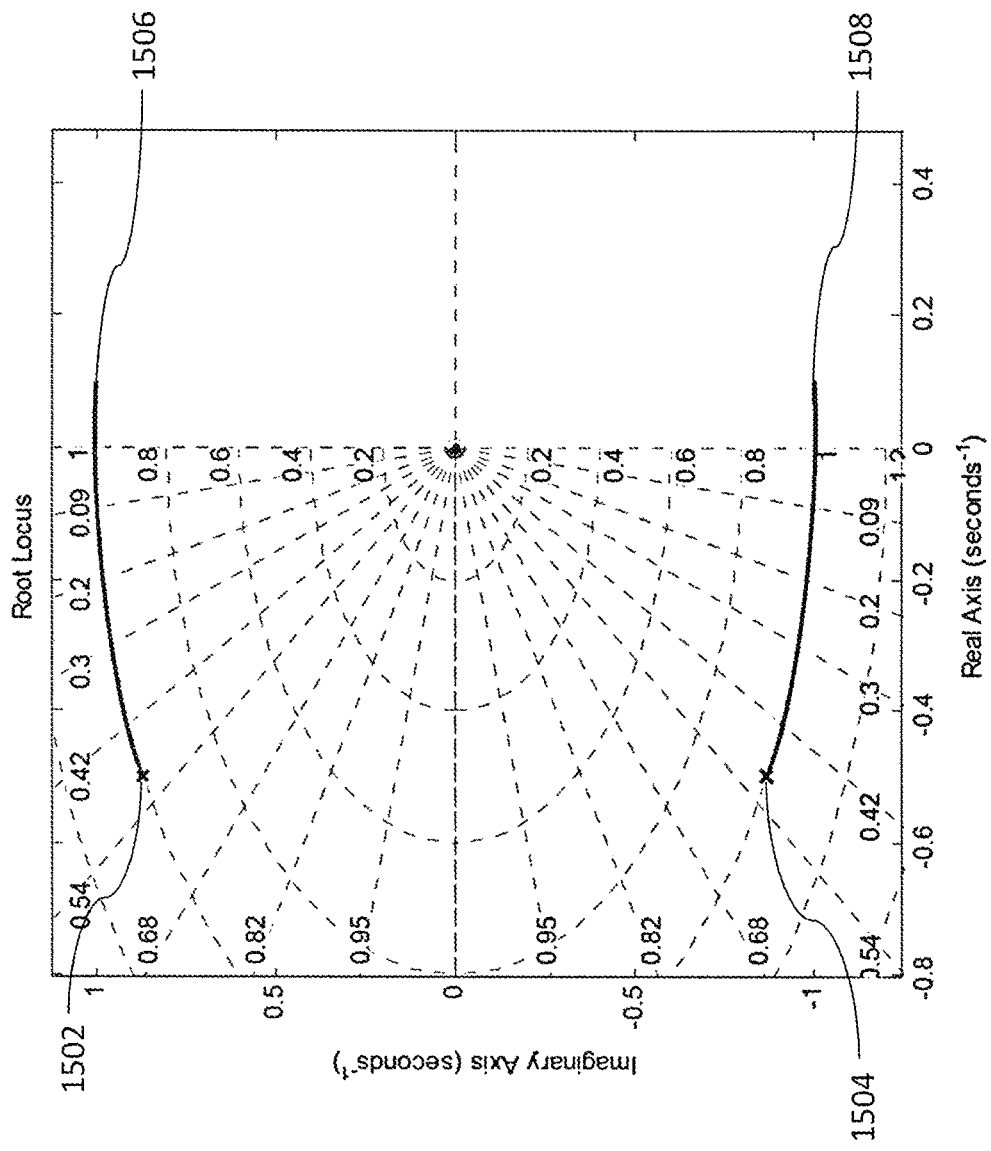
FIG. 15 is a root locus of the first order variable filter of FIG. 14.
Figure 16:
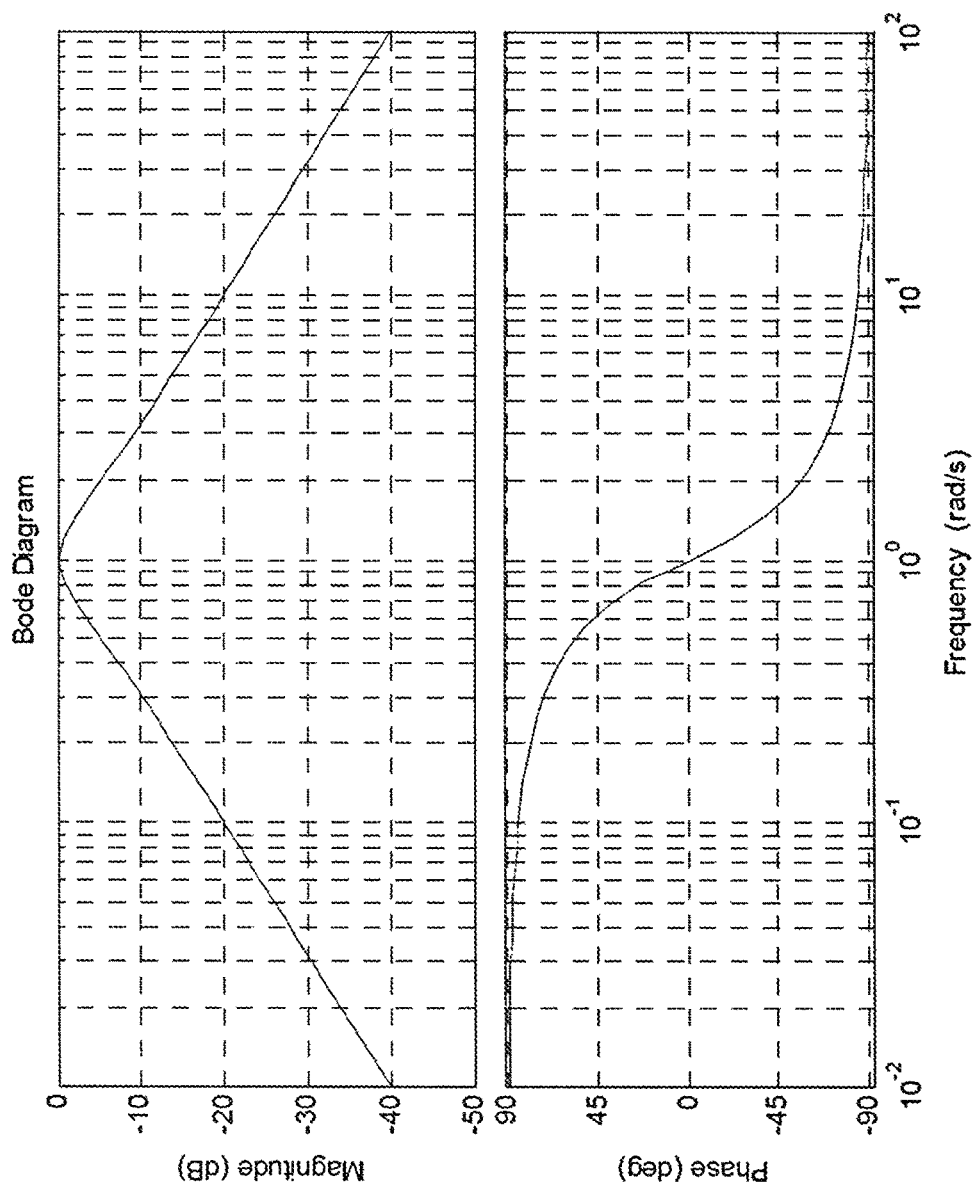
FIG. 16 is a Bode plot of the first order variable filter of FIG. 14.

An insightful analysis of the operation of the CAF-1 is possible with the use of the root locus method. The root locus is a standard method of determining the poles of a closed loop system given a variable loop gain. The outcome of the root locus calculation in the present context is the trajectory of these closed loop poles as they change with variations in the loop gain G as shown in FIG. 15 for example. With this we can get an understanding of any spurious passbands and any tuning limitations of the CAF-1. As an initial illustrative example let us assume that $\omega_o=1$ and D=0.5, in which the CAF-1 SOS resonator has a very low Q for this example. The Bode plot of the transfer function of the resonator is shown in FIG. 16. Note that the phase change with frequency is rather gradual around resonance due to the high damping factor (low Q) assumed in this example.

Now we consider the effect of the feedback gain G on the closed loop poles. This is calculated by the 0 degree root locus calculation and is shown in FIG. 15. Here the poles of the CAF-1 SOS resonator are represented by an x (1502 or 1504). Line 1506 is the closed loop root trajectory as the closed loop gain G is increased from 0 to 1.2. This is the trajectory for the pole indicated by number 1502. The root locus of the conjugate closed loop root trajectory 1504 is line 1508. Note that these move towards the jω axis of the S-plane (root locus in the domain of the complex frequency variable s=π+jω) indicating a progressively higher Q as the closed loop gain U is increased. If the closed loop gain was decreased as with Q spoiling, then the root locus of the poles 1506 and 1508 would move away from the jω axis (not shown in FIG. 15). In FIG. 15, when the root locus trajectory crosses into the right hand plane the closed loop roots are unstable.

In this unstable region of operation the CAF-1 is not usable and root trajectories cease to be meaningful. Hence we only need to plot over the range of G in which the closed loop poles remain in the left hand plane (LHP). Incidentally, for the value of G for which the closed loop poles coincide with the jω axis, the CAF-1 oscillates at the resonant frequency of $\omega_o$, which is normalized in this example to $\omega_0=1$. The radial dotted lines in the root graph indicate the damping value of D. Q can be related to D based on the relation of Q=½D. Also in this example, the gain G where the root trajectories cross the jω axis and the CAF-1 becomes unstable is S=1.

As the Q of the SOS CAF-1 resonator is decreased (note: this is not the closed loop system Q), the filtering in the initial forward path is limited by the 20 dB per decade change in the frequency. A problem with this is that the out of band signals and broadband noise is not significantly attenuated by the first forward pass through of the signal. As the CAF-1 Q increases, these out of band signals are eliminated in the output only if they are subtracted at the summing block 1404 in the CAF-1 circuit of FIG. 14. This implies that the signal flowing through the gain block 802 has to be large. To reduce this, one has the option of 1) raising the Q of the SOS feedback resonator, or 2) adding an additional SOS feedback resonator. Adding an additional SOS feedback resonator results in a CAF-2 which is described below.

Figure 17:
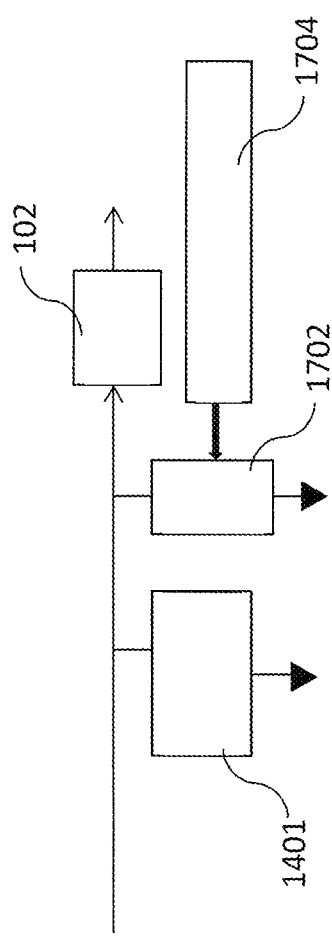
FIG. 17 is a block diagram of a Q-spoiler based on a resonant block in parallel with a FET variable resistor.

Another way of implementing a variable Q for the SOS resonator is the 'Q-spoiler' which is implemented by a variable resistive element in the SOS. This affects the damping coefficient of the SOS which could have been designed to have a higher Q than typically desired. The variable resistor reduces (spoils) the Q such that the poles of the SOS are further from the jω axis into the LHP as mentioned above. This is a degree of freedom (DOF) that allows for higher attenuation of outliers than if an SOS with a fixed lower Q was implemented. One embodiment of the Q-spoiler circuit is shown in FIG. 17 based on a parallel resonance SOS 1401. In this case the Q-spoiler is implemented with a PET 1702 operating in the triode region in parallel with a resonator 1401 and controlled by a Q-spoiler control voltage 1704 to provide an equivalent variable resistor function. In another implementation the FET 1702 could be implemented with a PIN diode. It will be understood that these design options may be incorporated into any of the variable filter circuits described herein.

Topology of the CAF-2

Figure 18:
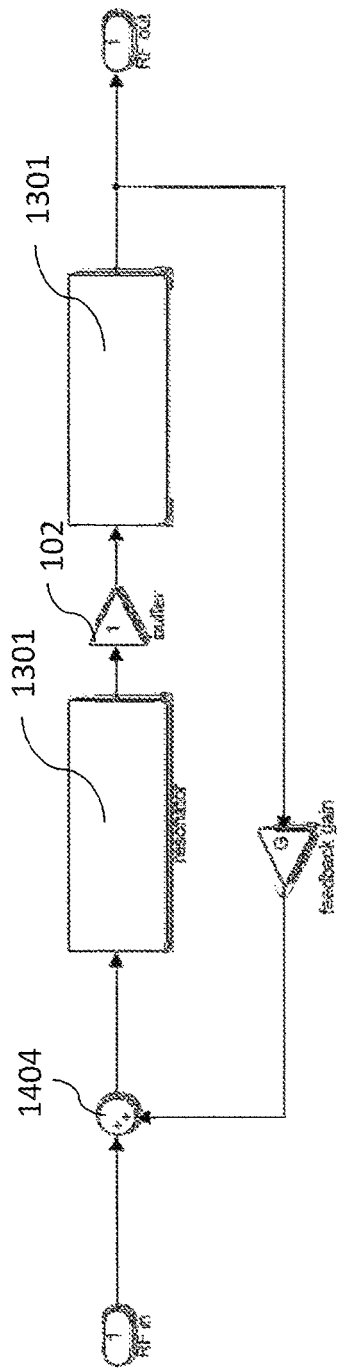
FIG. 18 is a block diagram of a second order variable filter CAF-2.

A topology of the CAF-2, comprising two SOS resonators 1301, is shown in FIG. 18. The unit gain buffer 102 separating the resonators is for implementation purposes when necessary to isolate the resonators from each other. Again combiner 1404 provides feedback loop closure. The transfer functions of each resonator 1310 are:

$$\frac{1}{s^2 + 2D\omega_o s + \omega_o^2}$$

Figure 19:
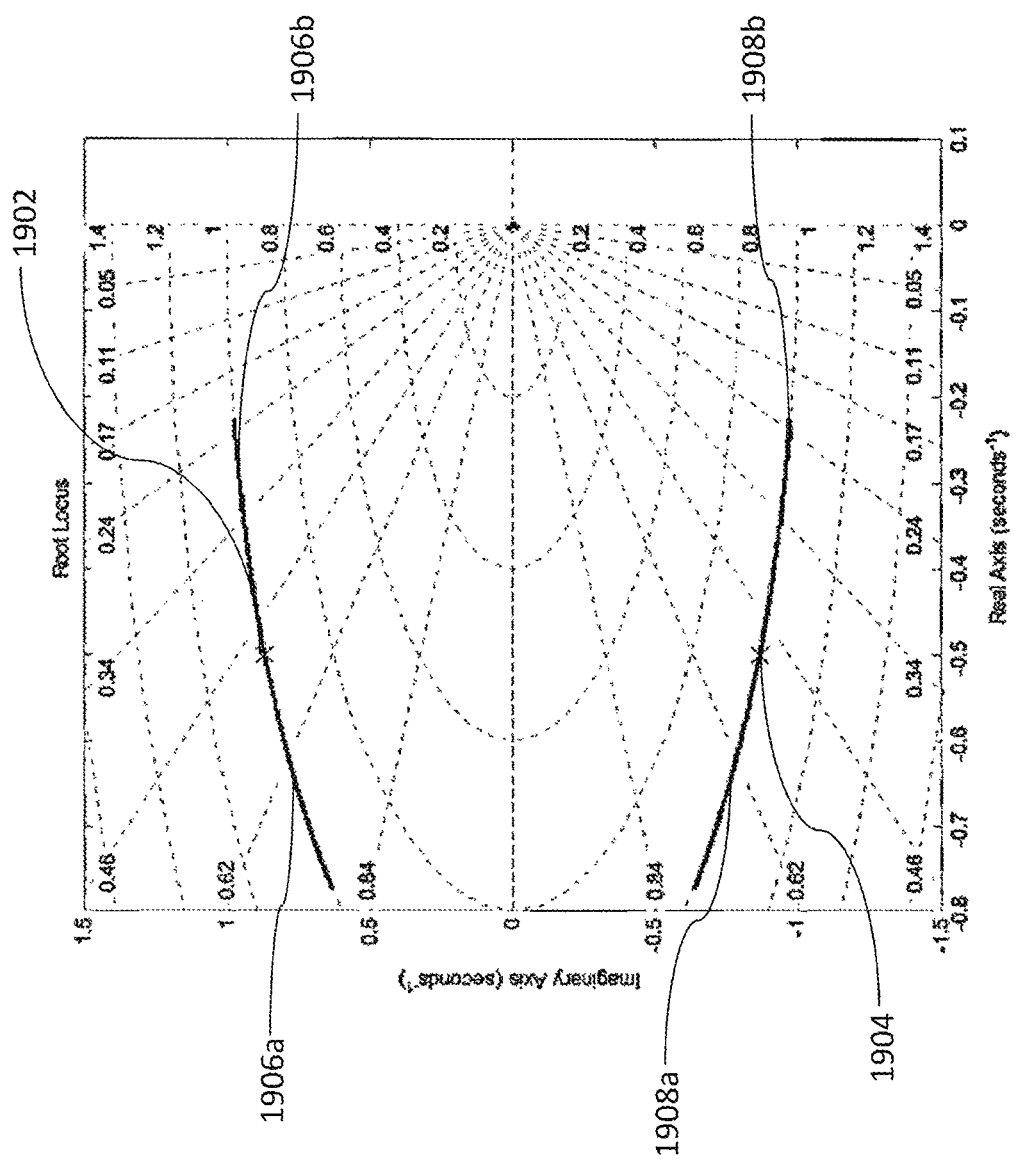
FIG. 19 is a root locus of the second order variable filter of FIG. 18.

For purposes of example, the parameter values for $\omega_0$ and D are selected as $\omega_o 1$ and D=0.5. The zero degree root locus for the CAF-2 is given in FIG. 19.

The open loop roots are indicated by 'x', with two poles located at 1902 and two conjugate poles at 1904 as required for this dual SOS resonator configuration. By definition, the "dominant" pole is always closest to the jω axis, while the "secondary" pole is furthest from the jω axis. We see the dominant root trajectories 1906*b* and 1908*b* move towards the jω axis as the closed loop gain G is increased, while the other set of trajectories 1906*a* and 1908*a* move away from the jω axis. Hence the two resonator CAF-2 will still have a dominant pole pair that behaves as the single resonator CAF-1. At a loop gain G=1, the root trajectories 1906*b* and 1908*b* cross the jω axis into the right hand plane (RHP), the Q of the CAF-2 becomes infinite, and the overall circuit becomes unstable. As with the CAF-1, stability is only possible when the root locus stays in the DIP which can only occur for closed loop gain G<1 for each individual resonator.

The advantage of the two resonator CAF-2 is that the attenuation of out of band signals is larger and therefore the interference signal is less. The poles moving along 1906*a* and 1908*a* into the left hand plane away from the jω axis still contribute to attenuation of the out of band spectral components. Furthermore, as out of band spectral components are better filtered by the CAF-2 double SOS resonator, these out of band components flowing around the feedback loop will be less. This is important because the intermodulation distortion performance of the loop components does not have to be as high as in the case of the CAF-1.

Figure 20:
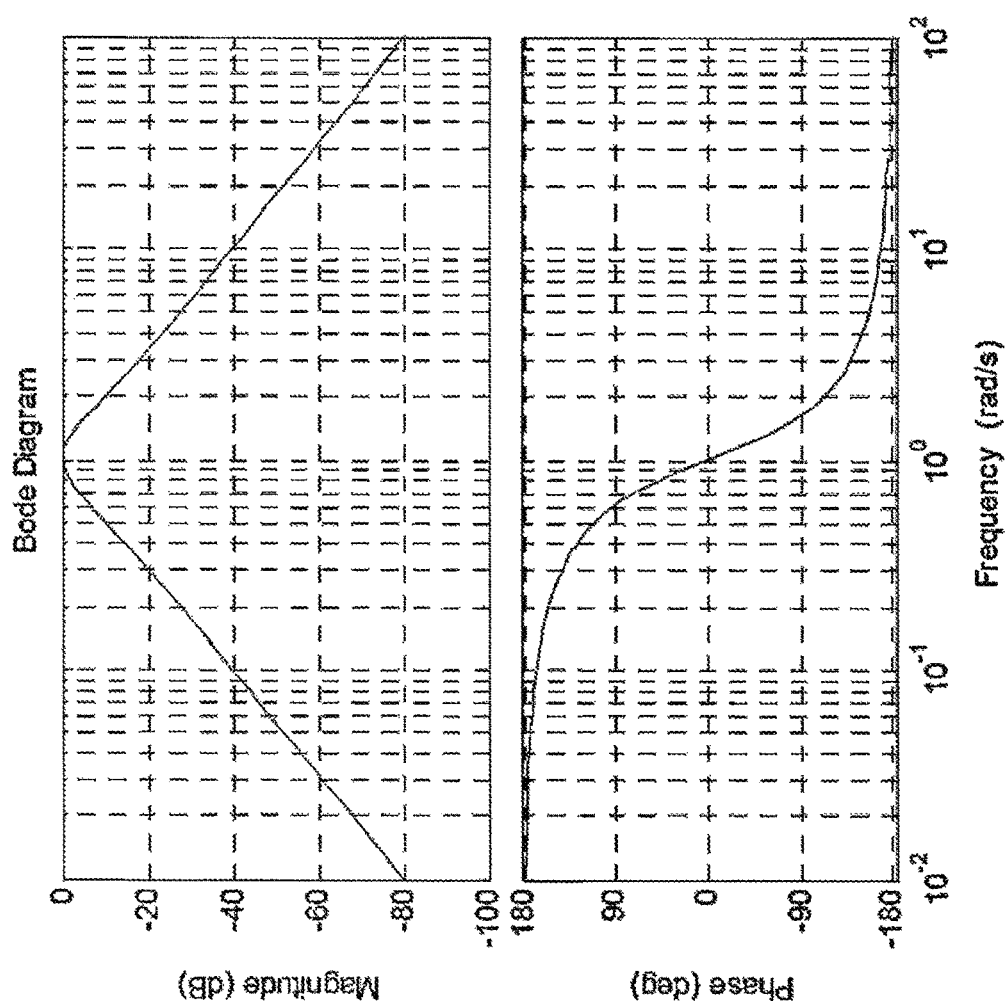
FIG. 20 is a Bode plot of the second order variable filter of FIG. 18.

Another possible trade off is that the same out of band rejection with two SOS resonators with a smaller closed loop Q is achieved with a single SOS resonator with a larger closed loop Q. This is important as the power gain is proportional to the square of Q as shown above with respect to the CAP-0, and which is approximately valid for the CAF-n more generally. For large Q, the large power gain can become a practical implementation limitation. The Bode plot for the double resonator CAP-2 is given in FIG. 20. Note that the CAF-2 transition steepness is 40 dB per decade change in frequency, whereas for the single CAF-1 SOS resonator it is 20 dB per decade change in frequency.

Topology of the CAF-3.

Figure 21:
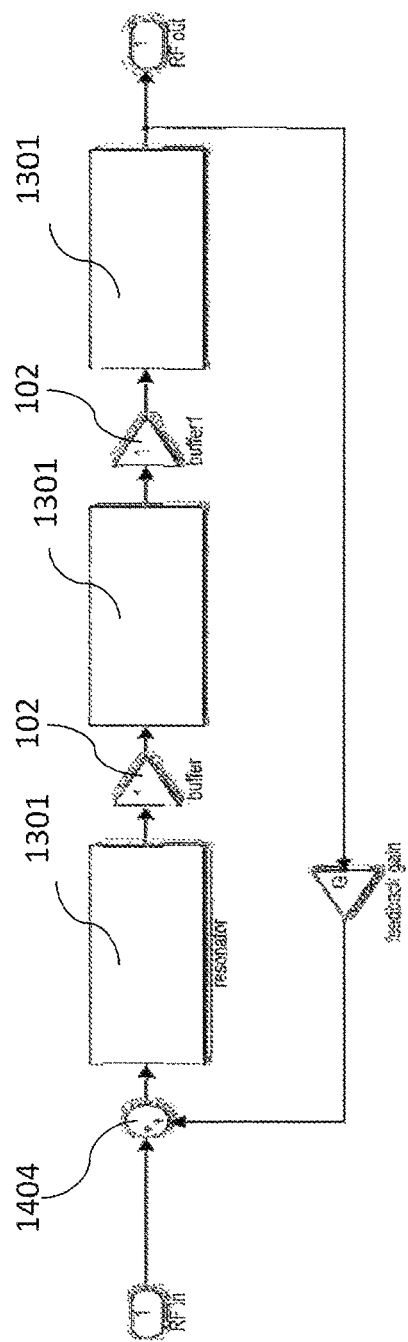
FIG. 21 is a Hock diagram of a third order variable filter CAF-3.

Turning to the third order CAF-3, FIG. 21 shows a topology of the CAF-3 which has three cascaded SOS resonators, each of which includes a feedback loop, a method for changing the center frequency of the resonator, and a method for changing the Q of the resonator. As with the CAF-2, unit gain buffers 102 are placed between all of the resonators 1301 for isolation, and a combiner 1404 to close the feedback loop. It is important to note the ability to individually control both the center frequency and gain of the individual resonators in this and other CAF-n configurations. Initially, we shall set the center frequency of each resonator to be the same, and will discuss the CAF-3 with different center frequencies later.

Figure 22:
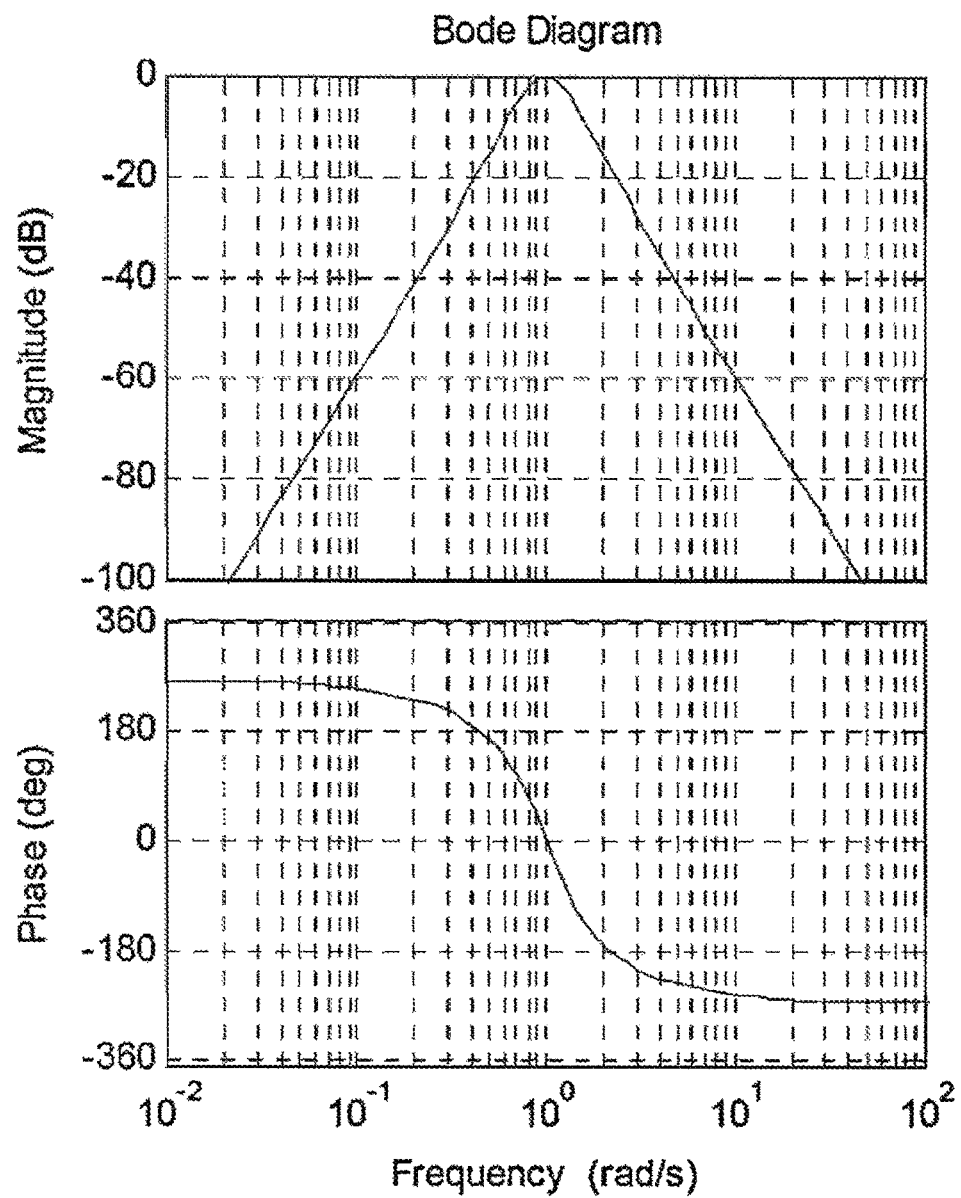
FIG. 22 is a Bode plot of the third order variable filter of FIG. 21.
Figure 23:
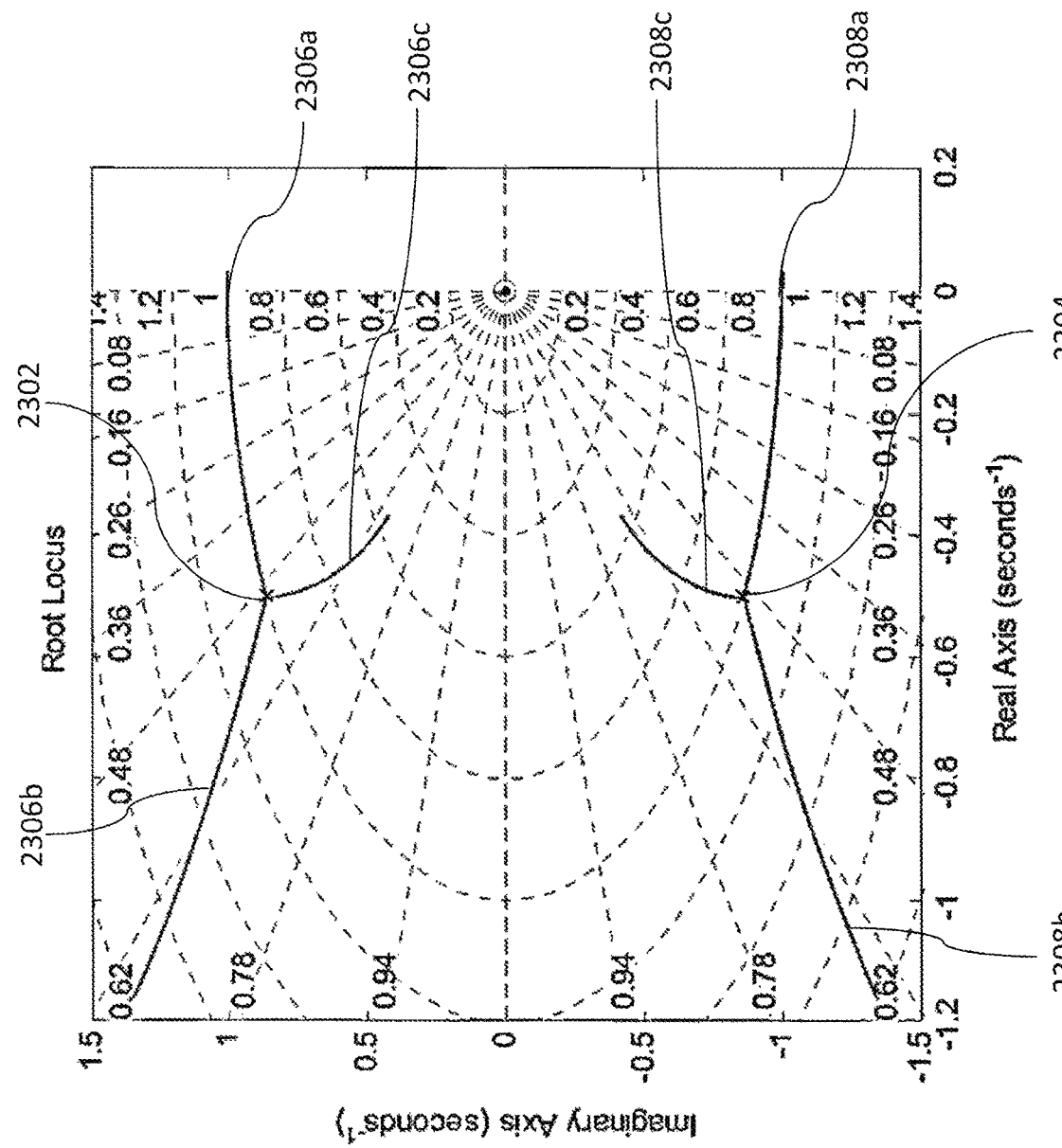
FIGS. 23 and 24 are root locus of the third order variable filter of FIG. 21 with different values for Q.
Figure 24:
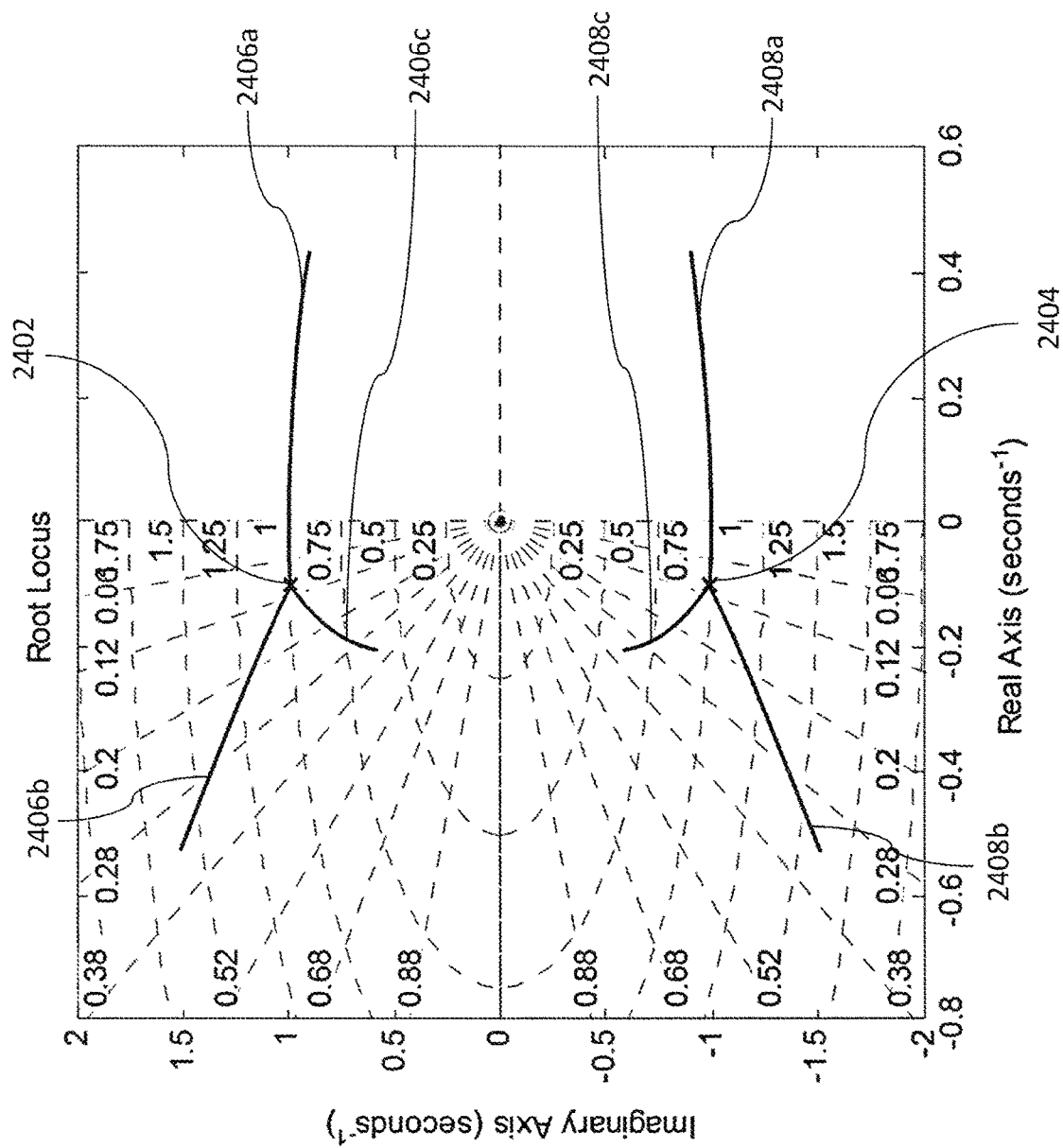

The Bode plot of the triple resonator, each with the same center frequency, is shown in FIG. 22 where the out of band open loop attenuation of the triple resonator is seen to be 60 dB per decade in frequency which is of significance as it is based on low Q resonators. The zero degree root locus is shown in FIG. 23 for a D=0.5 or a Q=1. The root locus is interesting in that there are three root trajectories 2306*a/b/c* and 2308*a/b/c* emanating from each triple of open loop poles 2302 and 2304 marked again by the 'x', although image scaling makes the three individual roots impossible to differentiate. Note that one of the root trajectories 2306*a*/2308*a* follows the $\omega_n=1$ contour exactly as before, while the other root 2306*b*/2308*b* goes further into the left-hand plane (LHP) and does not influence the circuit. However, the third pole trajectories 2306*c*/2308*c* start to move toward the $j\omega$ axis. This potentially gives rise to a spurious mode that is at much lower frequency than the intended passband. However, at the gain G where the dominant pole gets sufficiently close to the $j\omega$ axis to realize the desired higher Q closed loop poles, this potentially troublesome pole is still far from the $j\omega$ axis and causes a negligible spurious response in a practical implementation. Serendipitously, as the Q of the CAF-3 SOS resonators are increased such that D decreases, this potentially troublesome root goes further into the LHP as shown in the zero degree root locus example of FIG. 24 which is calculated for a D=0.1, or a resonator Q=5, with trajectories 2406*c* from pole 2402 and 2408*c* from pole 2404. As with all CAF-n implementations, stability is achieved when the root locus stays in the LHP, which occurs for closed loop gain G<1 for each individual resonator.

Topology of the CAF-4

Figure 25:
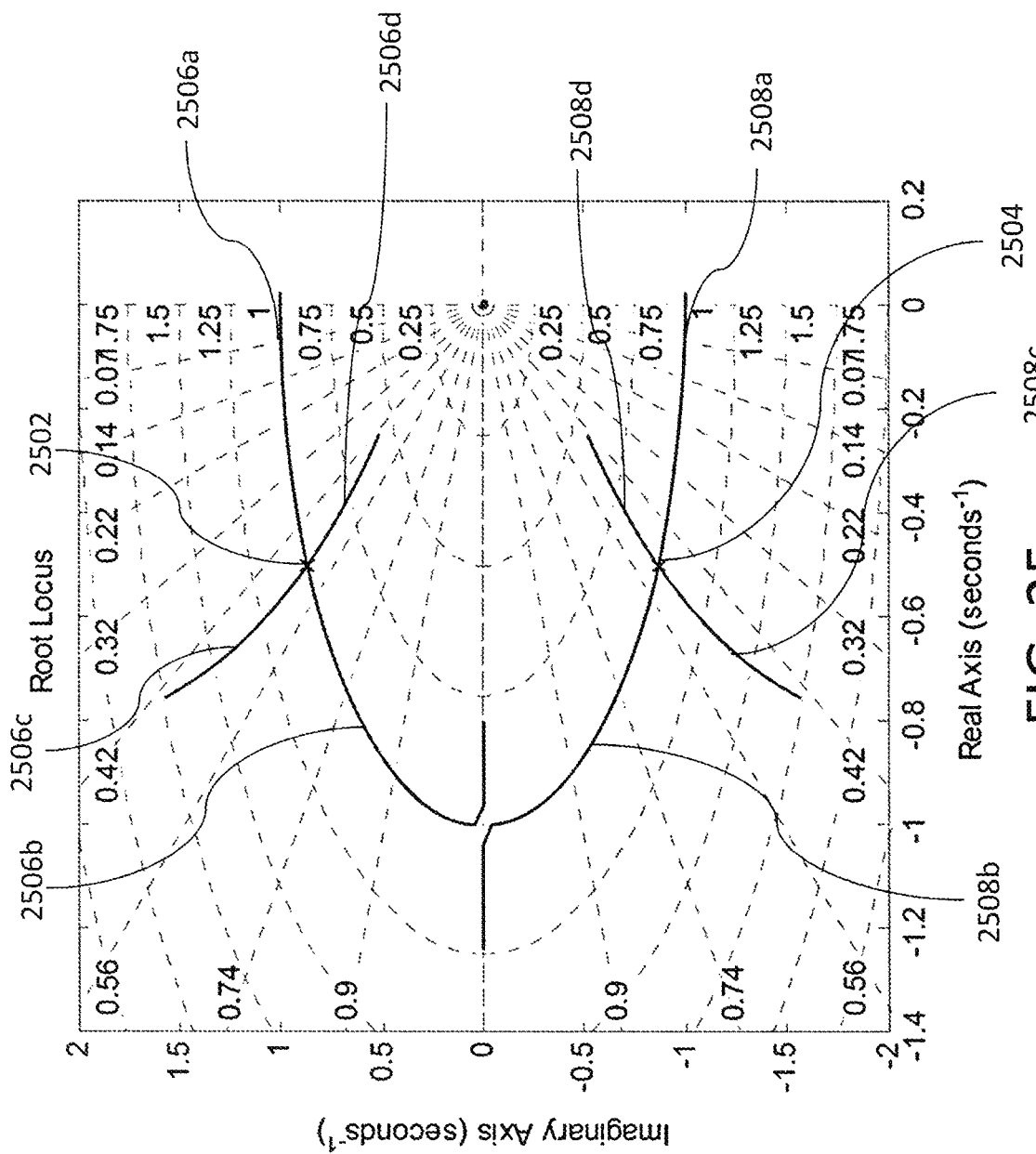
FIGS. 25 and 26 are root locus of a fourth order variable filter with different values for Q.
Figure 26:
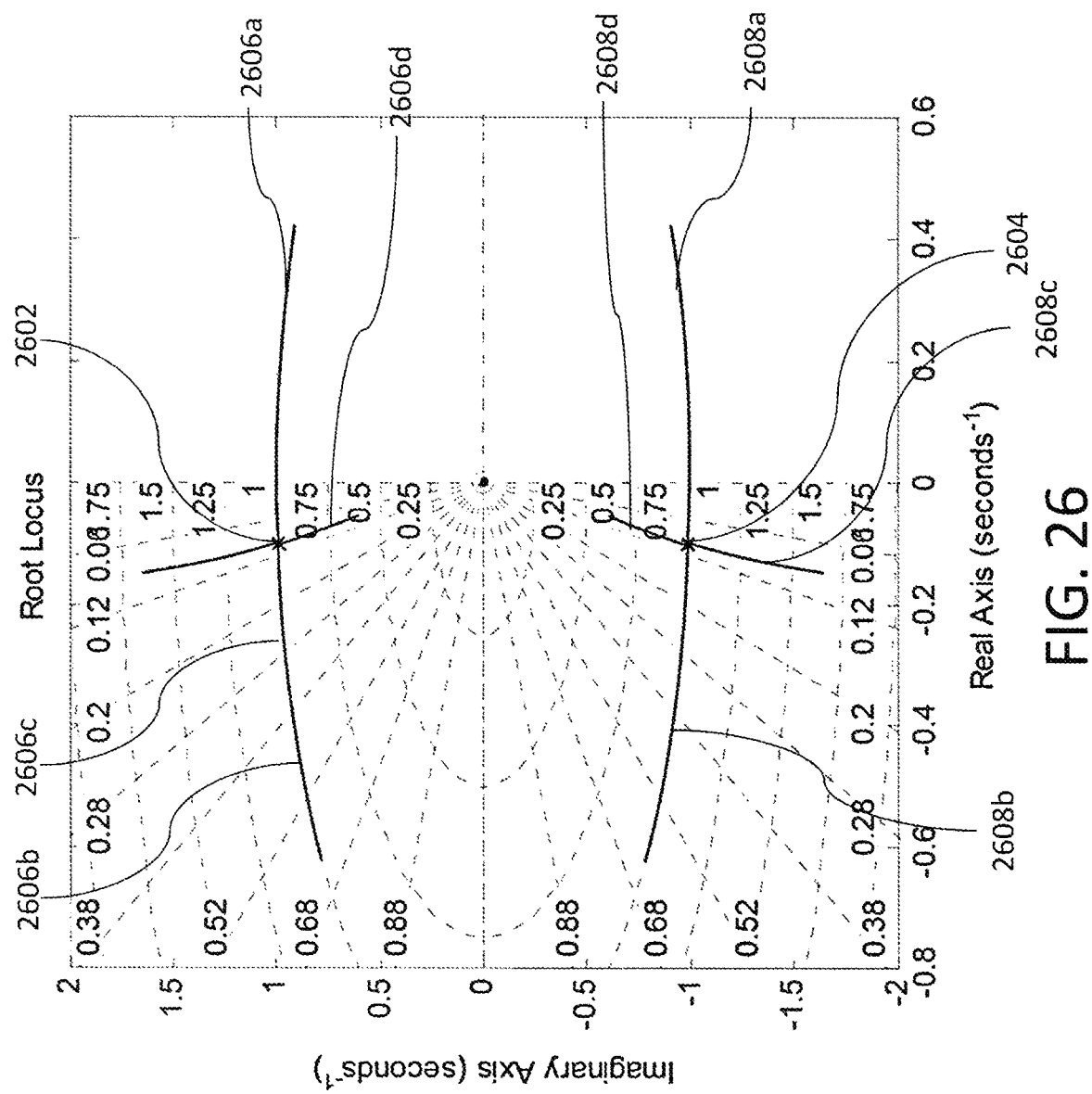

For the sake of completion, a short description of the CAF-4 is also given. This is of higher complexity than the CAF-3 and has spurious responses that could be detrimental in some applications. The zero degree root locus for the CAF-4 with D=0.5, or a resonator Q=1, is given in FIG. 25, with trajectories 2506*a/b/c/d* from pole 2502 and trajectories 2508*a/b/c/d* from pole 2504. The zero degree root locus for the CAF-4 with D=0.1, or a resonator Q=5, is given in FIG. 26, for trajectories 2406*b* from pole 2402 and trajectories 2608*a/b/c/d* from pole 2604. Note that in FIG. 25 where the Q of the SOS is very low, the spurious passband resulting from the 2506*d* or 2508*d* paths can be acceptable. As in the third order CAF-3 case, the CAF-4 root leading to the spurious frequency response is still far from the $j\omega$ axis and corresponds to a much lower frequency which can be suppressed with a low pass filter. However, considering the root locus in FIG. 26 corresponding to the higher resonator Q, there are two root trajectories 2606*d* and 2608*d* that do not really move further into the LHP and consequently create the spurious frequency responses Which are generally undesirable in filtering applications.

In summary, the CAF-1 can give good band pass filtering performance for many applications. However, the CAF-2 and CAF-3 filters can give more flexibility for tailoring to an application. The CAF-3 will provide the best rejection of the out of band signals for typically encountered closed loop Q values. It is the configurable root trajectory of the second and third order CAF closed loop poles that is a key attribute of this innovation.

CAF-1 Detailed Example

Figure 27:
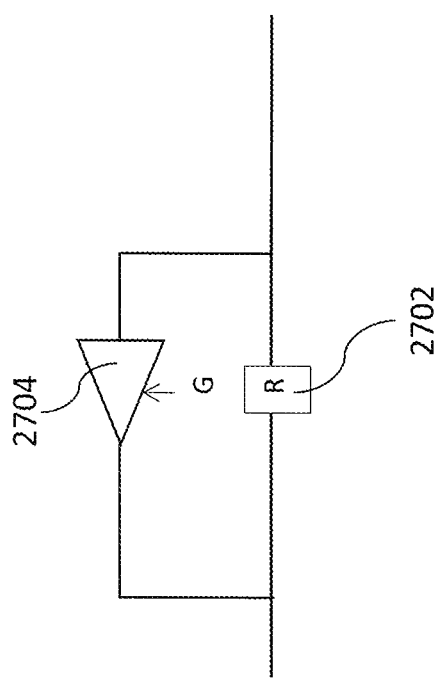
FIG. 27 is a simplified block diagram of an example of a first order variable filter.

In this section an example will be provided of a CAF-1 filter circuit which consists of feedback around a single pole pair. An application circuit could be as shown in FIG. 27. Here the single resonator 2702 is a fixed resonator circuit with a feedback gain 2704. The gain G of block 2704 can be negative for Q-spoiling or positive for Q-enhancement. It is understood that while gain block 2704 is shown as a two port gain block that it can be arranged as a one port gain block with either negative or positive resistance. Negative resistance would result in G being equivalently greater than zero and provide Q-enhancement. Positive resistance, on the other hand, is equivalent to a negative G providing Q-spoiling.

Figure 28:
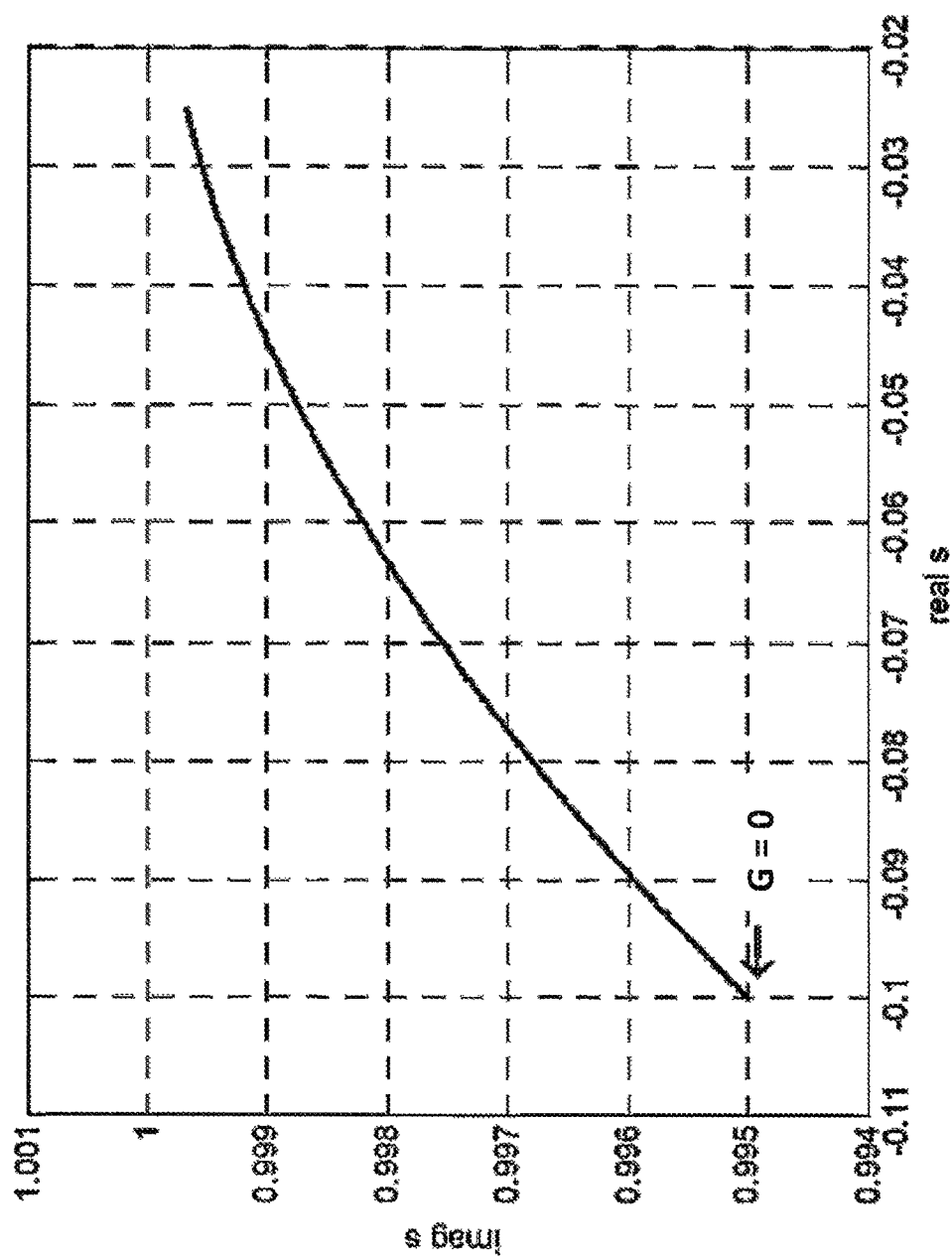
FIG. 28 is a root locus of the variable filter depicted in FIG. 27 with Q-enhancement.
Figure 29:
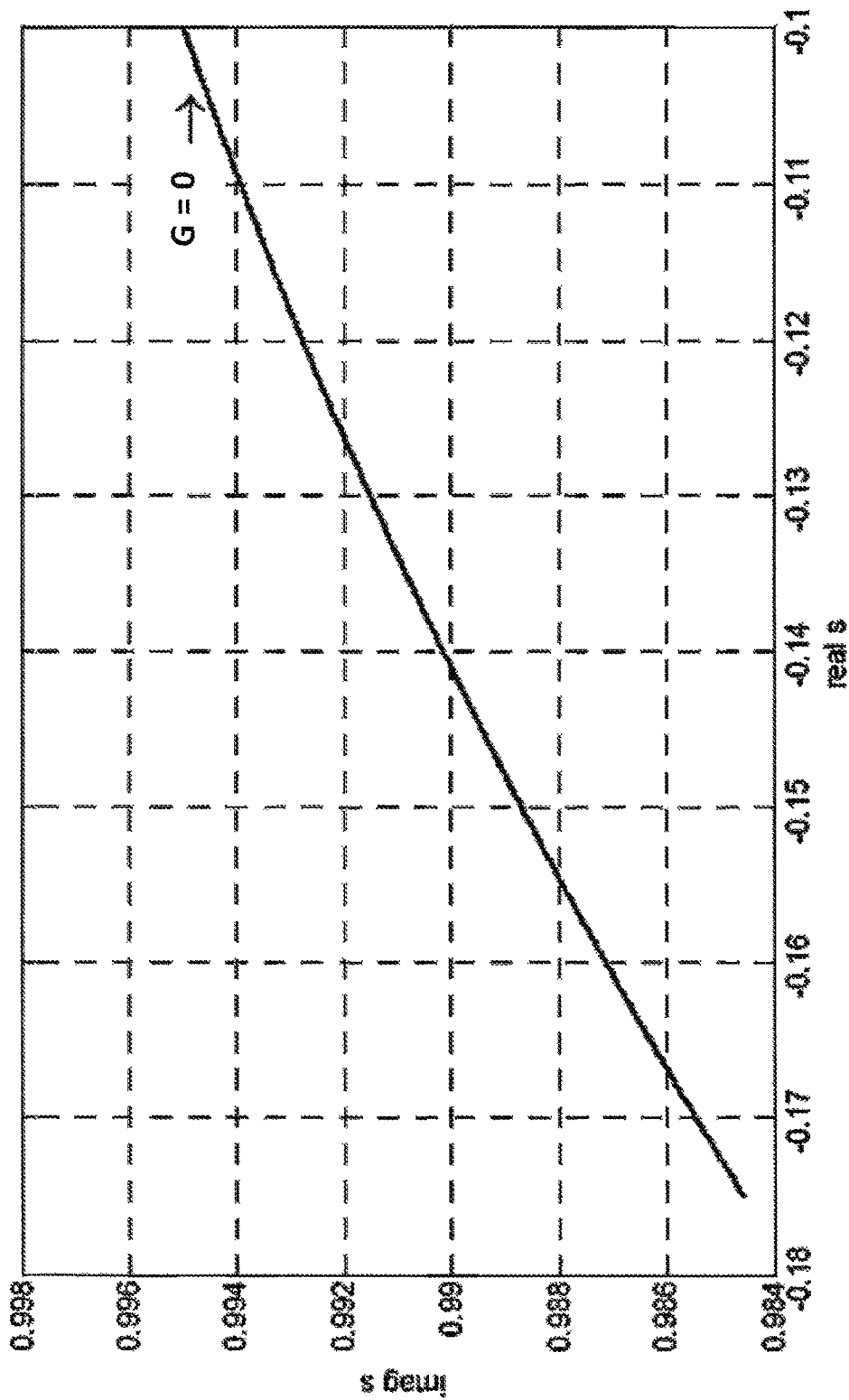
FIG. 29 is a root locus of the variable filter depicted in FIG. 27 with Q-spoiling.

The root locus of the positive frequency closed loop pole for positive G is shown in FIG. 28. This corresponds to the Q-enhancement case where the close loop pole moves towards the $j\omega$ axis. Likewise the root locus for negative G is shown in FIG. 29. This corresponds to the Q-spoiling where the close loop pole moves away from the $j\omega$ axis.

Figure 30:
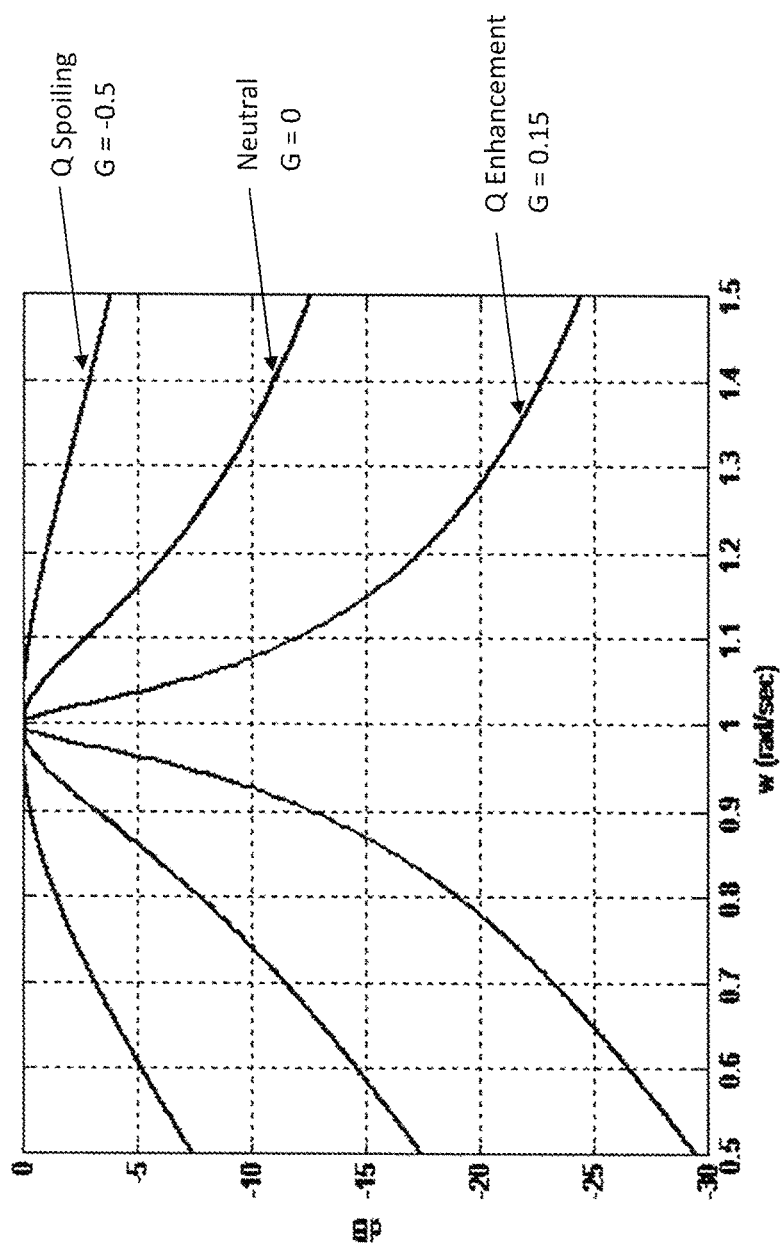
FIG. 30 is a plot of the pass band of the variable filter depicted in FIG. 27 comparing Q-enhancement and Q-spoiling.

FIG. 30 shows an example of the passband response with neutral Q (G=0), Q-enhancement (G=0.15) and Q-spoiling (G=−0.5). Note how the bandwidth is easily modulated with a small change in the feedback gain G.

Figure 31:
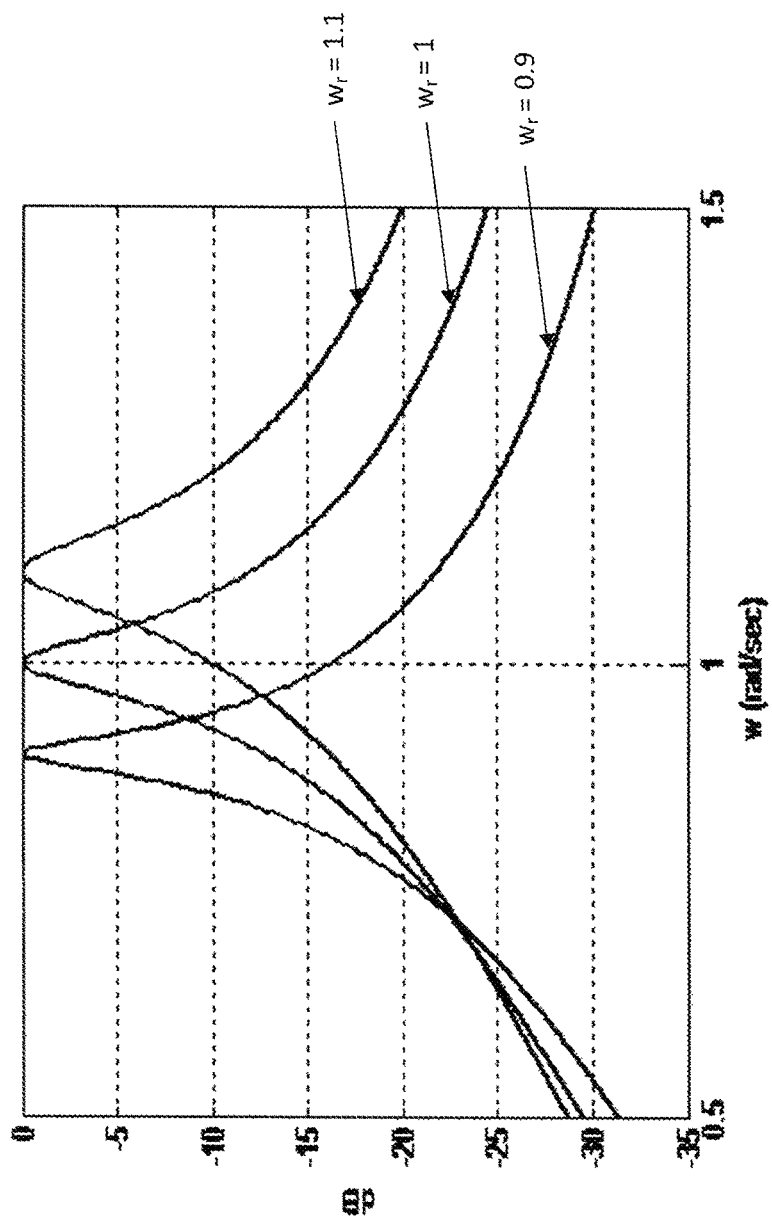
FIG. 31 is a plot showing the effect of varying the resonant frequency on the pass band of the variable filter of FIG. 27.

Consider the case where the resonator R comprises a means to vary the resonance frequency of the CAF-1. A frequency response example is given in FIG. 31 in which the resonance of R has normalized frequency values $\omega$ of 0.9, 1 and 1.1 for G=0.15. The time required to tune from one frequency to the next is approximately equal to the reciprocal of the bandwidth of the CAF-1.

Comparison of CAF-1, CAF-2, and CAF-3.

Figure 32:
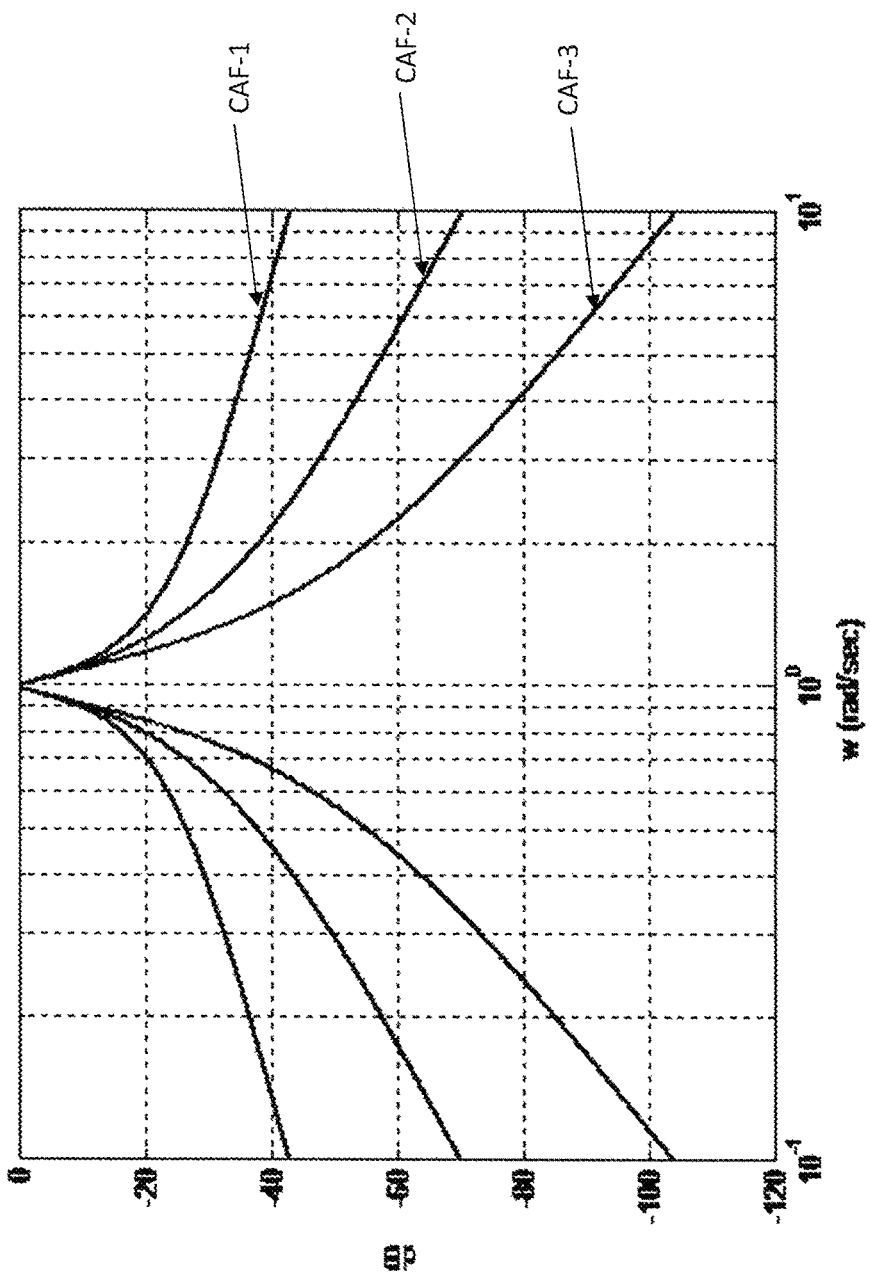
FIG. 32 compares the frequency response of the first, second, and third order variable filters.

In this example, the operation of the CAF-1, CAF-2, and CAF-3 are compared. The resonators in the three feedback filters are the same with D=0.1 and a normalized resonance of $\omega$=1. The Q-enhancement is tuned in the three filters separately such that they have approximately the same close in pass-band response. Values are G=0.13 for the CAF-1, G=0.07 of CAF-2 and G=0.002 for CAF-3. The pass band frequency responses are plotted in FIG. 32. As noted, the benefit of the CAF-3 is the higher rejection of the frequency components that are farther from the center frequency as compared to the CAF-2. Also the CAF-2 has better frequency selectivity in comparison to the CAF-1 as expected.

Applications of the CAF-3 for Simplified Bandwidth Control

Figure 33:
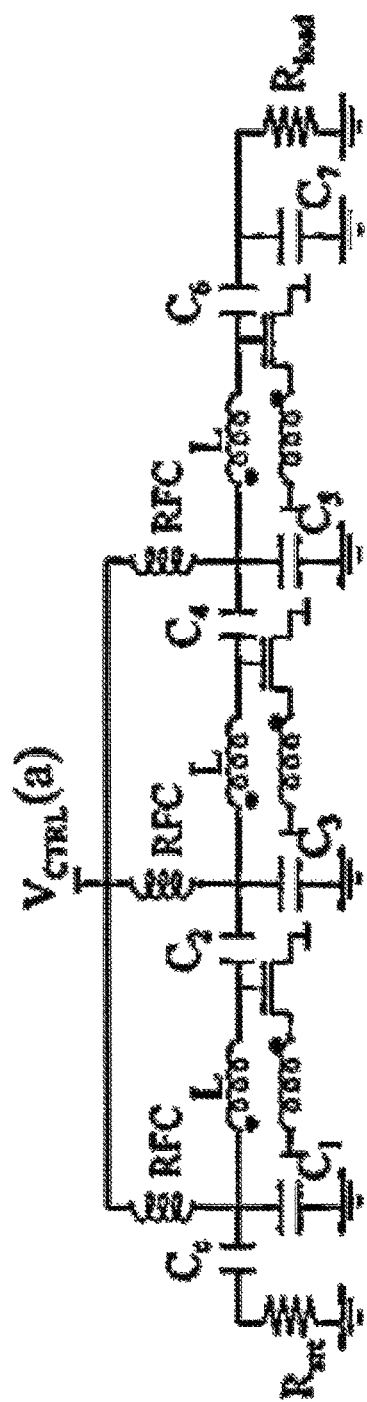
FIG. 33 is an example of a Q-enhanced, Chebyshev bandpass filter.

When connected in series, three CAF-1s can realize three resonant poles. This can be used to provide similar results as a $3^{rd}$ order Chebyshev type bandpass filter, an example of which is shown in FIG. 33.

Referring to FIG. 34, the equivalent scheme with the three CAF-1 s shown, where the resonators 1401 each have a feedback path 110 with a scaling block 802 and are separated by buffers 102. In this example, the poles of the three CAF-1s are generated with Q-enhanced inductors that can be set arbitrarily close to the $j\omega$ axis.

In addition, referring to FIG. 35, a level two feedback path 110*a* may be wrapped around the three CAF-1 modules, such that the circuit will then behave like a CAF-3.

Figure 36:
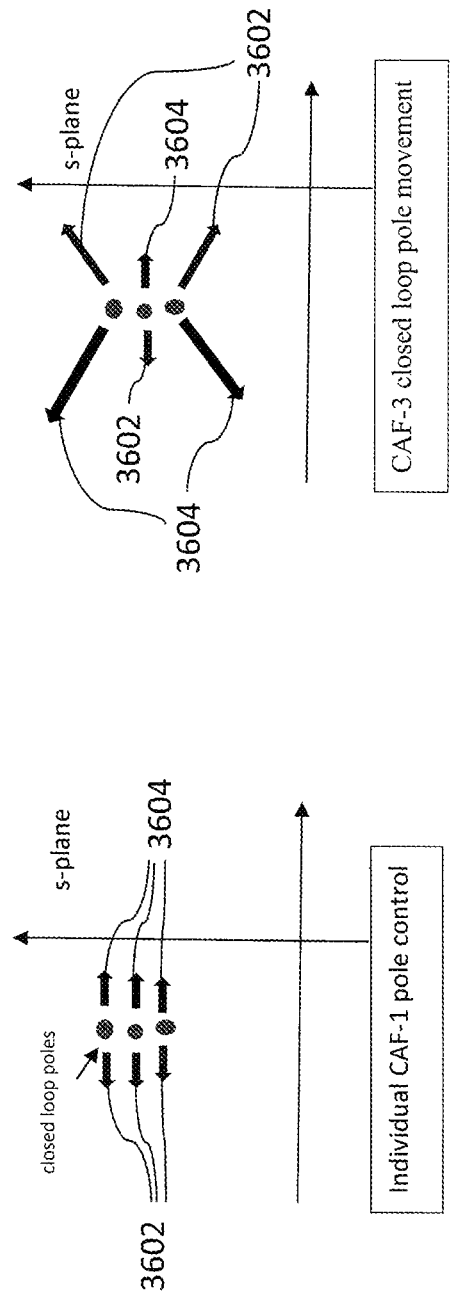
FIG. 36 are graphs depicting the effect of an additional feedback path on the movement of the poles.

What the additional CAF-3 level two feedback loop 110*a* does is modify the pole movement in the S-plane as illustrated in FIG. 36. The arrows 3602 are for negative feedback (Q-spoiling) and the arrows 3604 are for positive feedback (Q-enhancement). Note how the movement is different for the two cases.

If arbitrary placement of the poles to realize a certain filter response is desired, then it is possible to provide a Q-enhance/spoil for each individual CAF-1 of FIG. 34. However, the control becomes more complex as six controls are necessary. Also, there is redundancy in the control as the order of the resonators is generally irrelevant. This adds confusion to the pole placement stability tracking algorithm. A simpler control is that of having a level two feedback loop 110*a* as shown in FIG. 35. In that case, the feedback around each CAF-1 is driven from a common control source (not shown), and each feedback loop has a gain block (not shown), as described herein. Additionally, the outer control loop 110*a* is around the three individual CAF-1 resonators and also has a gain block (not shown). Hence the first control for the CAF-1's moves the three poles in unison towards or away from the pro axis. The CAF-3 level two control can spread the outer flanking poles and cause the center pole to retreat slightly. This enables controlling the bandwidth of the filter while maintaining a similar transition rate.

For this CAF-3 implementation evaluation, there will be considered three CAF-1 resonators with the following attributes:

| Resonator | Normalized resonance frequency (f) | Damping factor (D) |
|---|---|---|
| 1 | 1 | .4 |
| 2 | .95 | .42 |
| 3 | 1.05 | .38 |

This locates the pole at.

$$s = 2\pi f D + j 2\pi f \sqrt{1-D^2}$$

Figure 37:
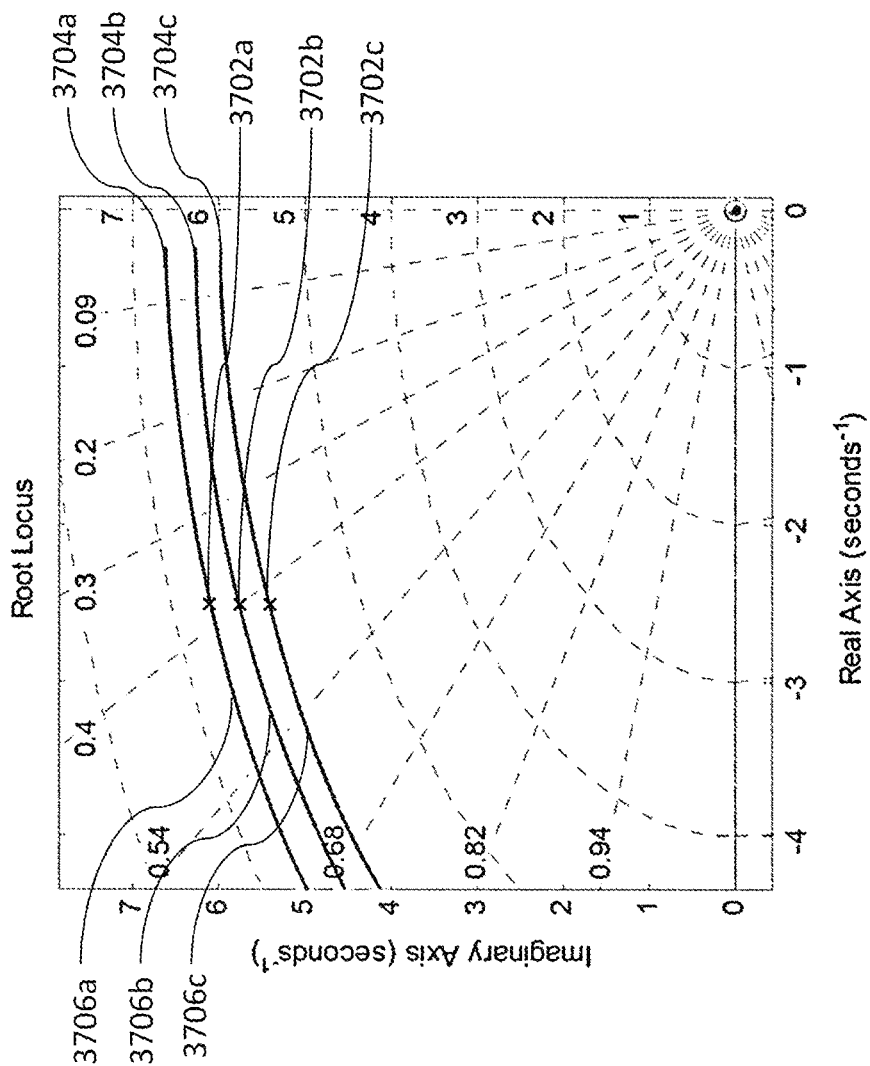
FIG. 37 is a root locus of three cascaded, first order variable filters.

Now consider that each, of these three resonators are with feedback loops such that there are 3 cascaded CAF-1 modules. The root locus is shown in FIG. 37.

The 'x' 3702*a/b/c* designate the positions of the poles with feedback gain of 0. The gain is positive for right excursions 3704*a/b/c* towards the $j\omega$ axis (Q-enhancement) and negative for excursions 3706*a/b/c* to the left (Q-spoiling). In terms of negative resistance amplification (Q-enhancement), it would imply that the resistance is zero at the position of the 'x', with positive resistance (Q spoiling) for left excursions of the root trajectory and negative resistance for right excursions. Note how the control goes along a contour of constant natural resonance frequency. The range of the feedback gain for each root trajectory is $-1<G<0.9$.

Figure 38:
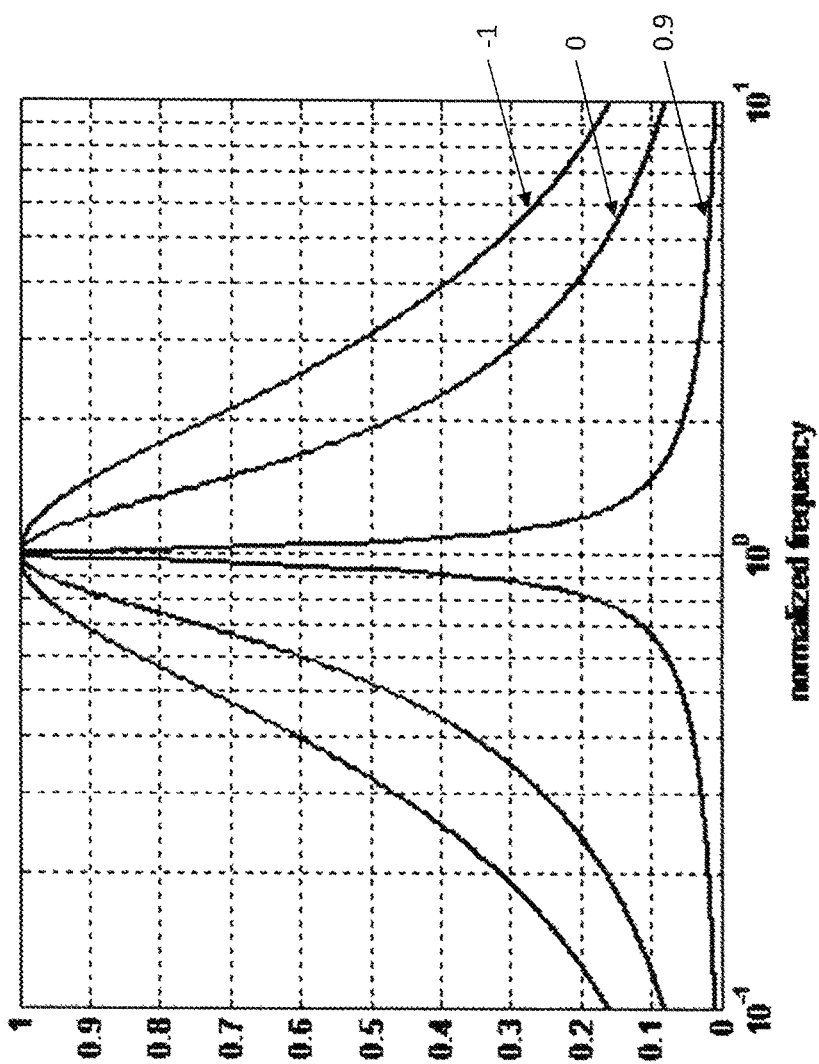
FIG. 38 is a frequency response of the variable filter shown in FIG. 34 for different values of G.

FIG. 38 shows the frequency response of the three CAF-1s when the feedback gain is 0, −1.0 and 0.9 showing the effect of Q-enhancement (positive G) and Q-spoiling (negative G) compared to neutral gain (G=0). Note that for this plot the peak amplitude has been normalized to 1 to make the plot clearer.

Figure 39:
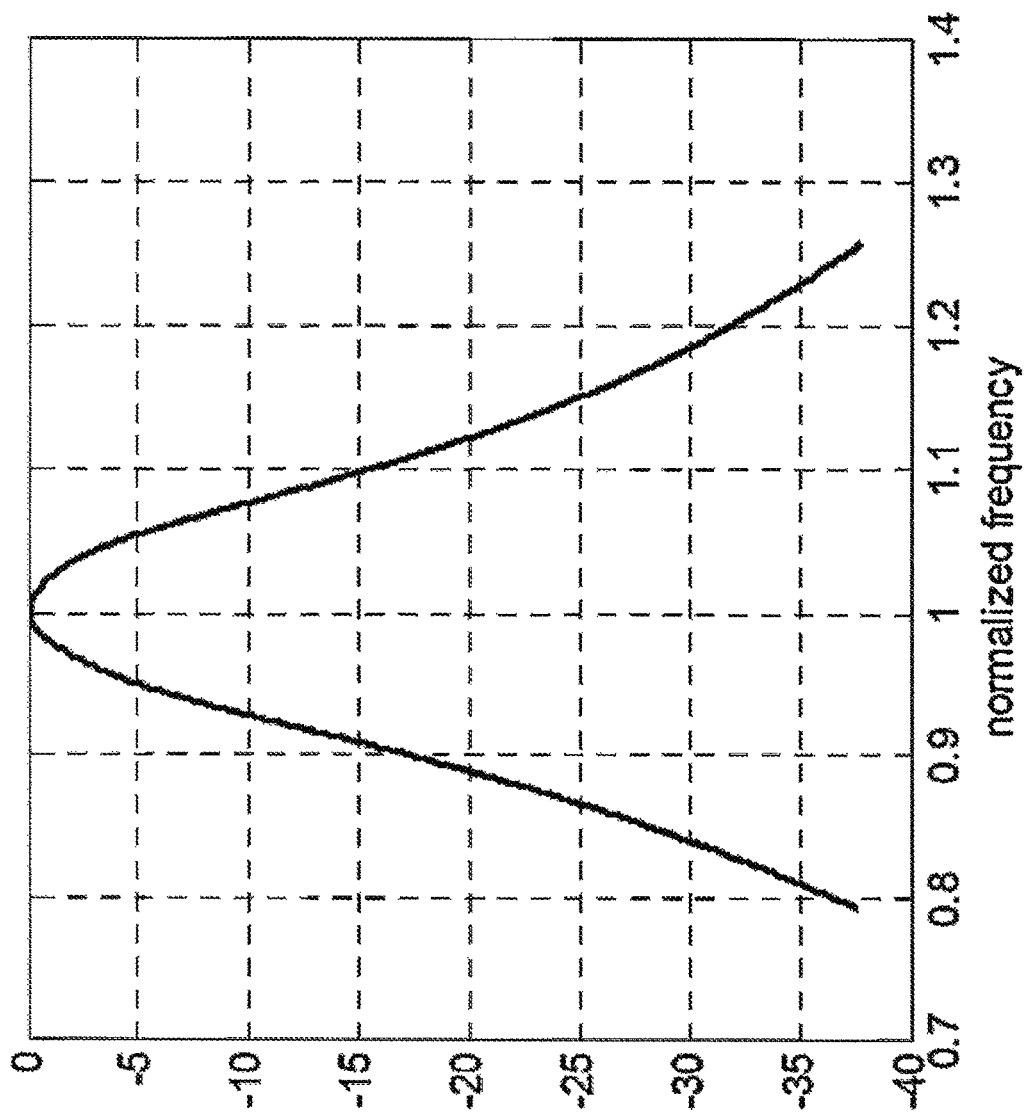
FIG. 39 is a frequency response of the variable filter shown in FIG. 35 with neutral level two feedback.

Next consider a modified CAF-3 with three resonators in which the resonators are CAF-1's that have been Q-spoiled with a gain of G=−0.9. FIG. 39 shows the frequency response when such a CAF-3 when level two feedback gain is G=0.

Next consider how we can make this look like a second order Chebyshev bandpass filter response by changing the CAF-3 level two feedback.

Figure 40:
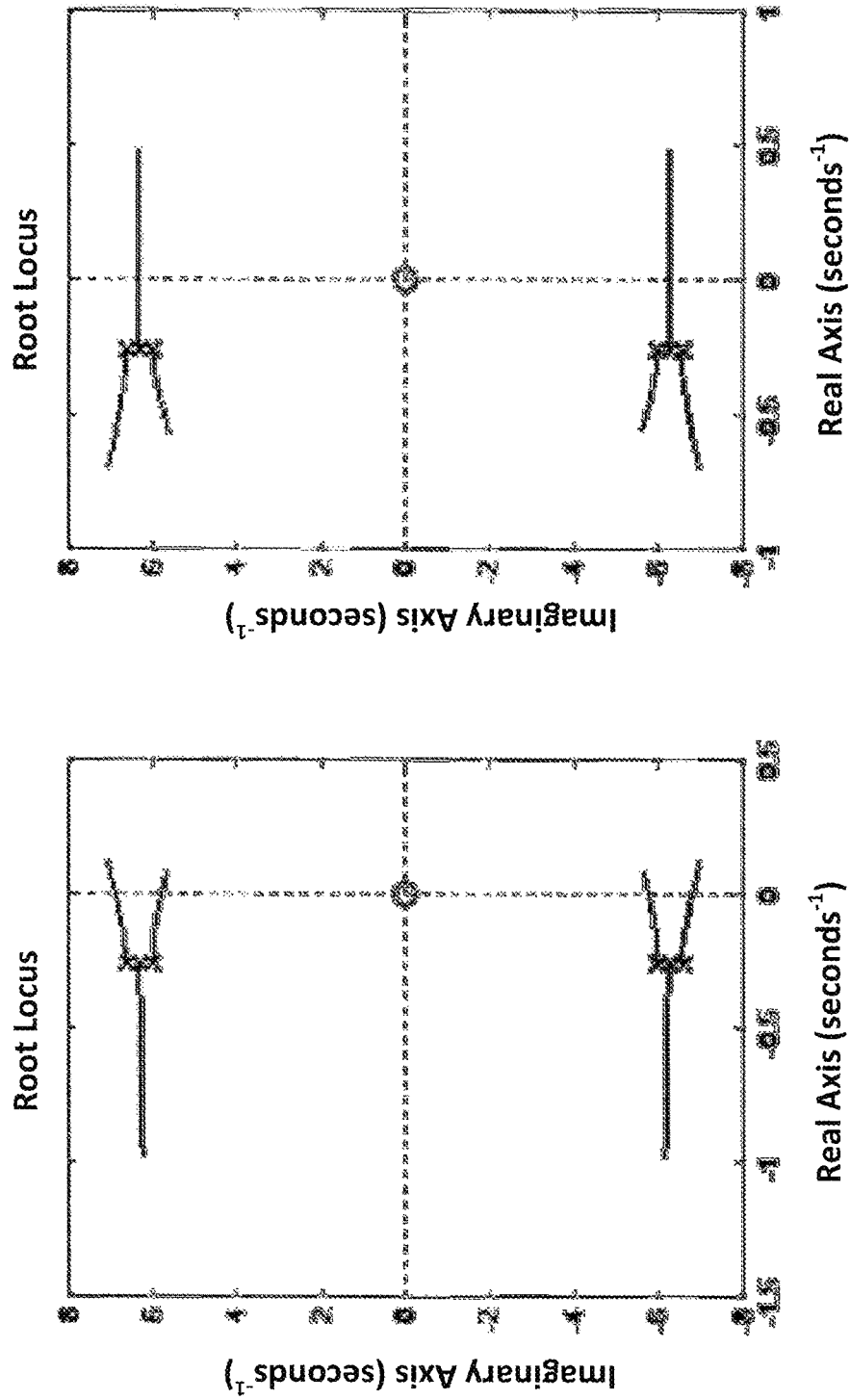
FIG. 40 is a root locus for negative (left) and positive (right) level two feedback of the variable filter shown in FIG. 35.
Figure 41:
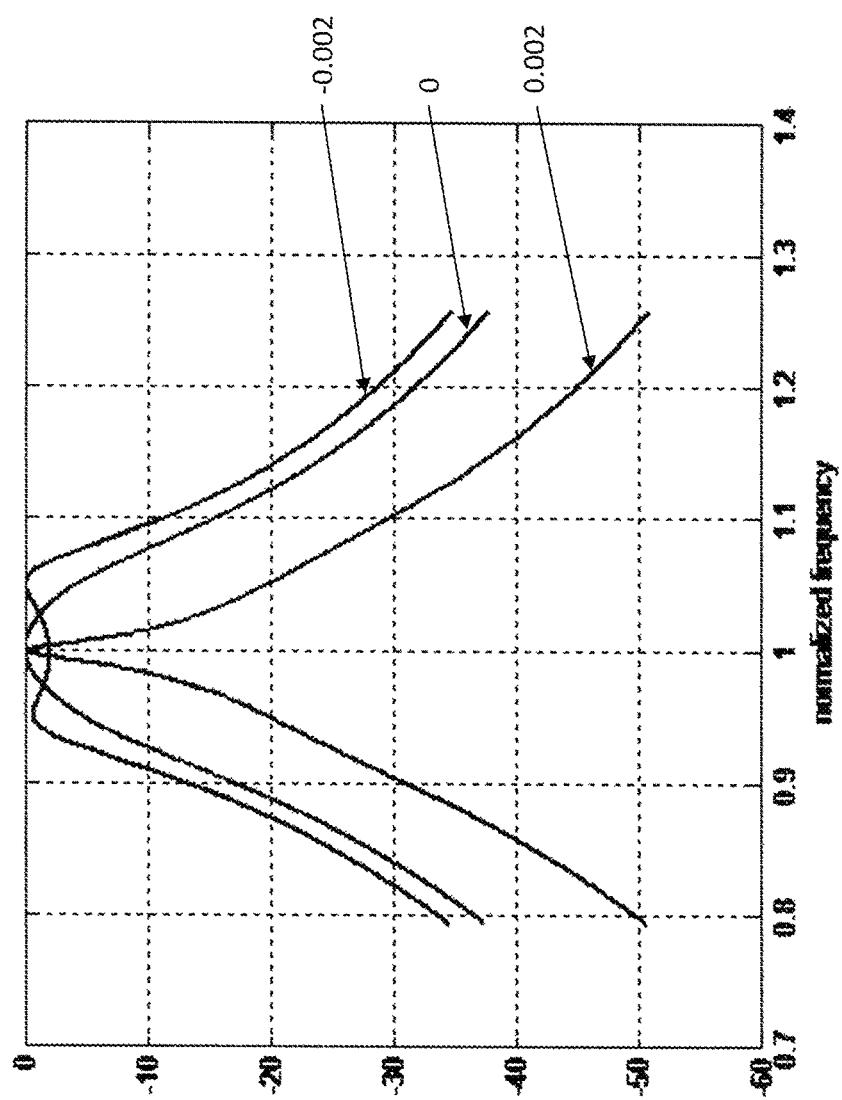
FIG. 41 is a plot of the frequency response of the variable filter shown in FIG. 35 with positive, neutral, and negative level two feedback.

Referring to FIG. 40, the left plot is for the negative CAF-3 level two feedback and the right plot is for the positive CAF-3 level two feedback. Note how we can use this to adjust the position of the flanking poles relative to the center pole. FIG. 41 shows how the CAF-3 level two feedback can be used to control the bandwidth of the filter. Positive level two feedback narrows the filter bandwidth and negative level two feedback broadens it. Only a very small amount of CAF-3 level two feedback is needed for this control. In FIG. 41, the level two feedback was 0, −0.002, and +0.002, as indicated.

As can be seen, the CAF-3 level two feedback control of FIG. 35 allows for an effective means of bandwidth control that can be practically implemented.

Figure 42:
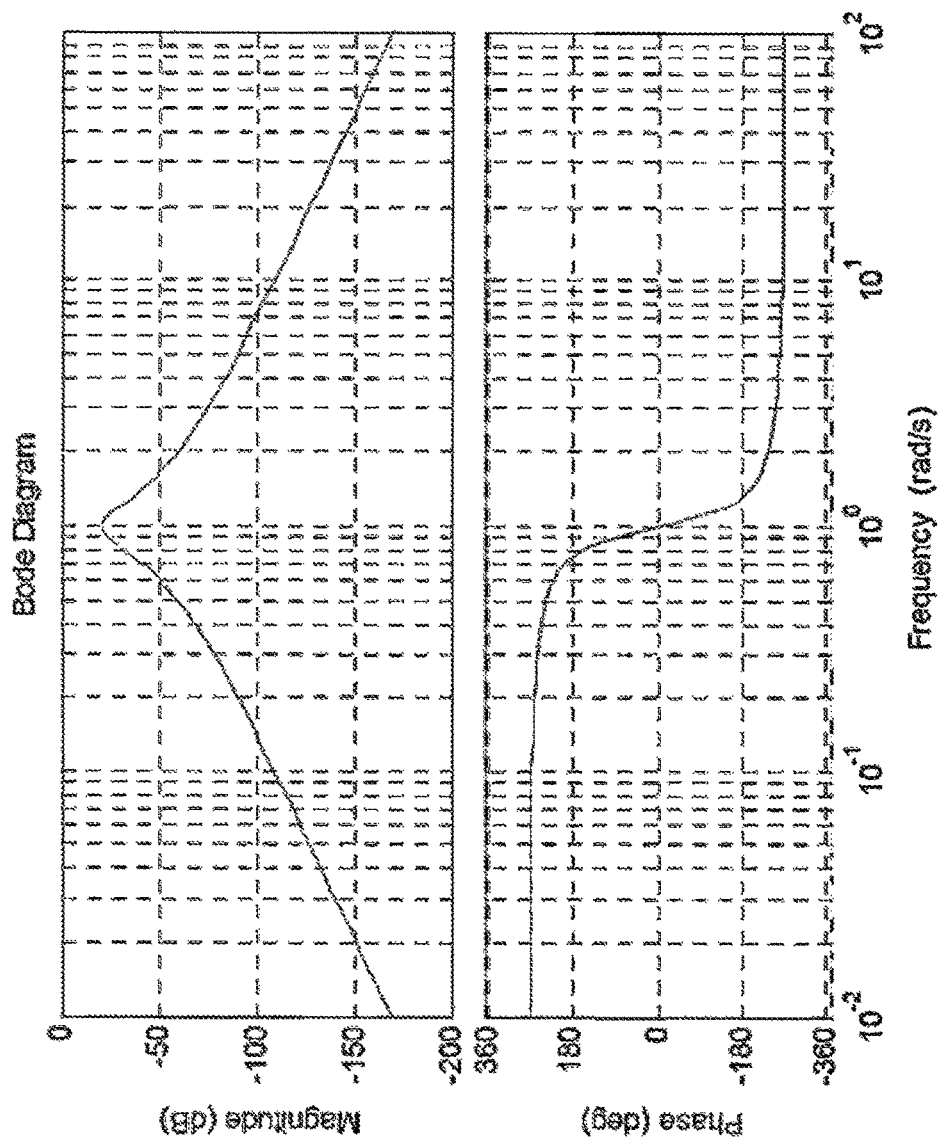
FIG. 42 is a Bode plot of the variable filter shown in FIG. 35 with staggered resonator frequencies.
Figure 43:
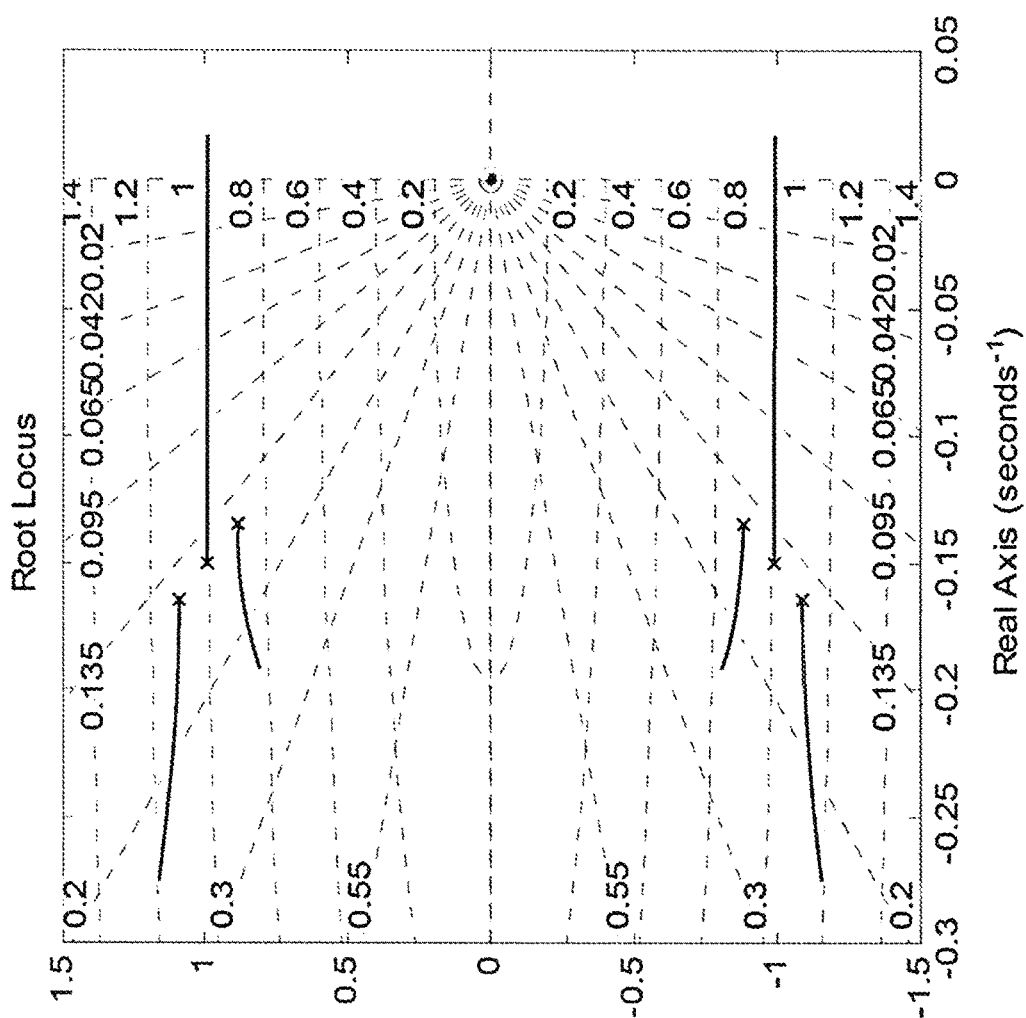
FIG. 43 is a root locus of the variable filter shown in FIG. 35 with staggered resonator frequencies.

Considered now a modification to the CAP-3 shown in FIG. 35, in which the SOS resonator 1401 pole locations are staggered in frequency and consequently not collocated in the S-plane, as was considered earlier. This can provide more flexibility in the control of the CAF-3 closed loop frequency response. The advantage of this increased flexibility is that different frequency responses can be achieved. This additional flexibility is of significance in some applications which are beyond the scope of this disclosure. As an example of staggered frequency resonators, consider the case of normalized SOS resonator natural frequencies of $\omega$=0.9 rad/sec, 1.0 rads/sec and 1.1 rads/sec, with D fixed at 0.15 (Q=3.33) for all three resonators. The Bode plot of these three SOS resonators cascaded is given in FIG. 42 indicating the potential of a more flattened pass band, which is worth investigating. FIG. 43 shows the zero degree root locus of this configuration, which is very similar to that shown in FIG. 23 where each of the three SOS resonators has the same center frequency.

Controlling the CAF Performance

The various elements in the CAF-n circuits may be controlled using a controller. It will be understood that various types of controllers may be used as is known in the art, comprising controller circuits and various microprocessors. Furthermore, while there is preferably a single controller that controls the various elements of the CAF-n, there may also be multiple controllers, or various layers of controllers. The controllers may be programmed to adjust the variables in the CAF-n according to an algorithm, a lookup table, software, or according to other known strategies, all of which may depend on specific implementation objectives and appropriate tradeoffs for that implementation. The controller may be programmed to respond to inputs from a user or from other circuit elements. In some circumstances, it may be beneficial to measure the frequency response, such as an impulse response of the CAF-n using sensors or detectors downstream of the CAF-n. Using this approach, the CAF-n may be controlled by providing the controller with a desired frequency response, which then controls the variables in order to achieve the desired frequency response. This may allow for an iterative approach to be used, or for fine adjustments to be made after the controller has approximated the desired frequency response.

The control of the CAF-n is relatively simple in that the closed loop center frequency control and the closed loop Q are almost independent and the control optimization is strictly convex. In other words, the control of the closed loop Q and center frequency can be done independently for many adjustments, which simplifies the system control algorithm.

In the following, an example of a CAF-n tuning and tracking scheme will be shown. This is an example of an embodiment of such a scheme, and it is understood that a wide variety of such tuning and tracking algorithms can be implemented by one skilled in the art. Consider a simple tuning scheme in which there exists a means of estimating the dominant pole location of the closed loop CAF-n. This may be done, for example, by measuring the impulse response of the CAF-n and determining the resonant frequency of $\omega_o$ and the damping coefficient $D_o$. Alternately, this can be input as a user design target. Then a tracking loop determines 1) the overall feedback gain G, and 2) the SOS resonator(s) natural frequency denoted by $\omega_r$. In an embodiment of the CAF-n, G can be determined by setting a control voltage on the feedback amplifier, and $\omega_r$ is set by adjusting the voltage on a varactor diode of the SOS resonant tank. Let $D_d$ and $\omega_d$ be the desired damping and resonant frequency respectively provided by the user design targets. The tracking loop is straightforward: if $D_o < D_d$ then G is increased incrementally. If $\omega_o > \omega_d$ then $\omega_r$ is increased incrementally. The loop iterates, updating G and $\omega_r$ sequentially indefinitely until the desired response is achieved. In this way the initial configuration of the CAF-n is accomplished and also the temperature variations and component aging of the CAF-n are ameliorated. Furthermore, the desired $D_d$ and $\omega_d$ can vary with time and the CAF-n will track these.

By way of example, consider a CAF-1 filter with $D_d$=0.02 and $\omega_d$=1. We assume that the SOS resonator in this example has a damping of $D_r$=0.4 and an initial resonance frequency of $\omega_r$=0.9 The initial loop gain was G=0.4. These values are rather arbitrary with the sole intent of presenting a practical example.

Figure 44:
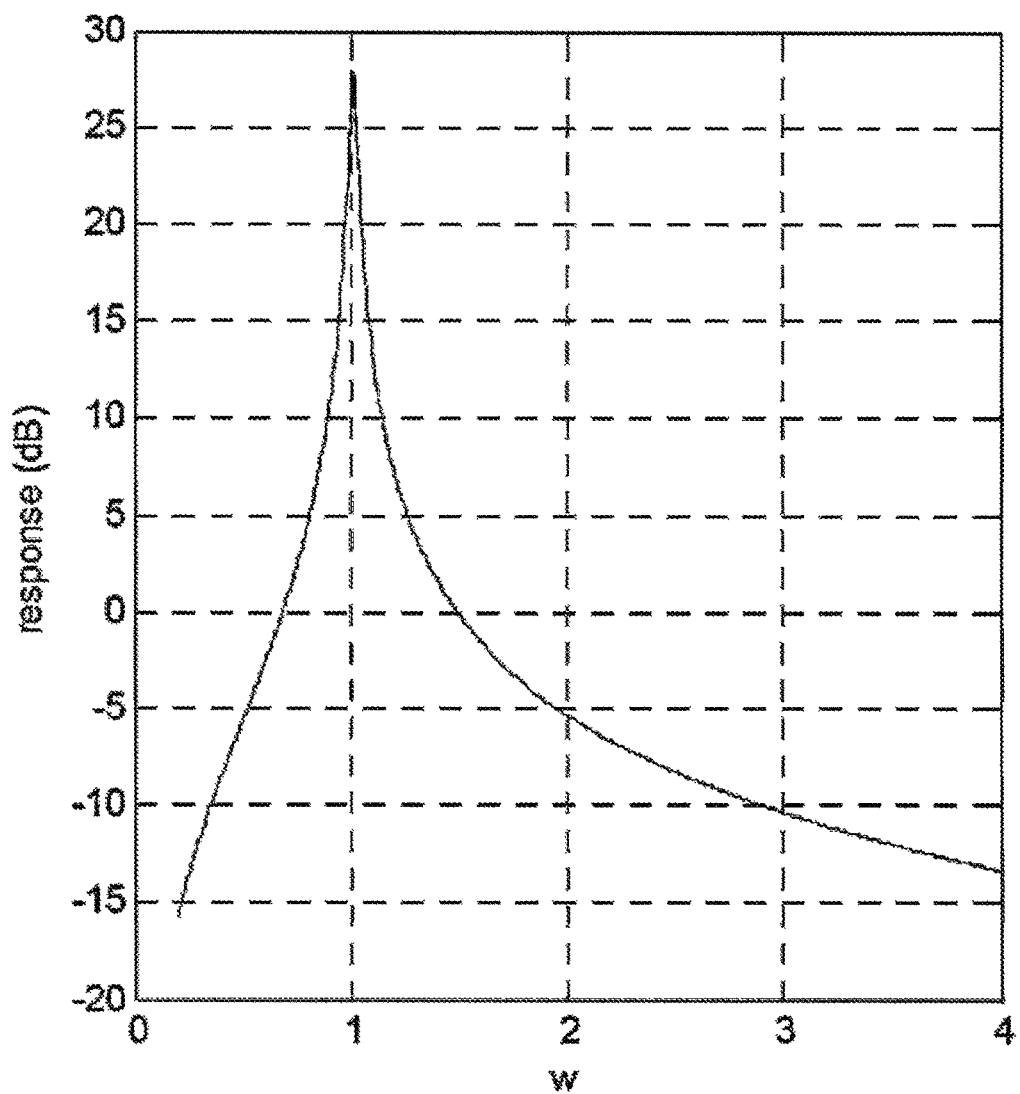
FIG. 44 is a plot of a passband of a first order variable filter after being subjected to a tuning process.

The resulting frequency response of the CAF-1 after tuning is complete is shown in FIG. 44. Note the desired parameters of $D_d$ and $\omega_d$ are met.

As a second example, consider a CAF-3 filter with the same $D_d$=0.02 and $\omega_d$=1 requirements given. Again the SOS resonators in this example have initial damping of $D_r$=0.4 and initial resonance frequencies of $\omega_r$=0.9. The initial loop gain is again G=0.4.

Figure 45:
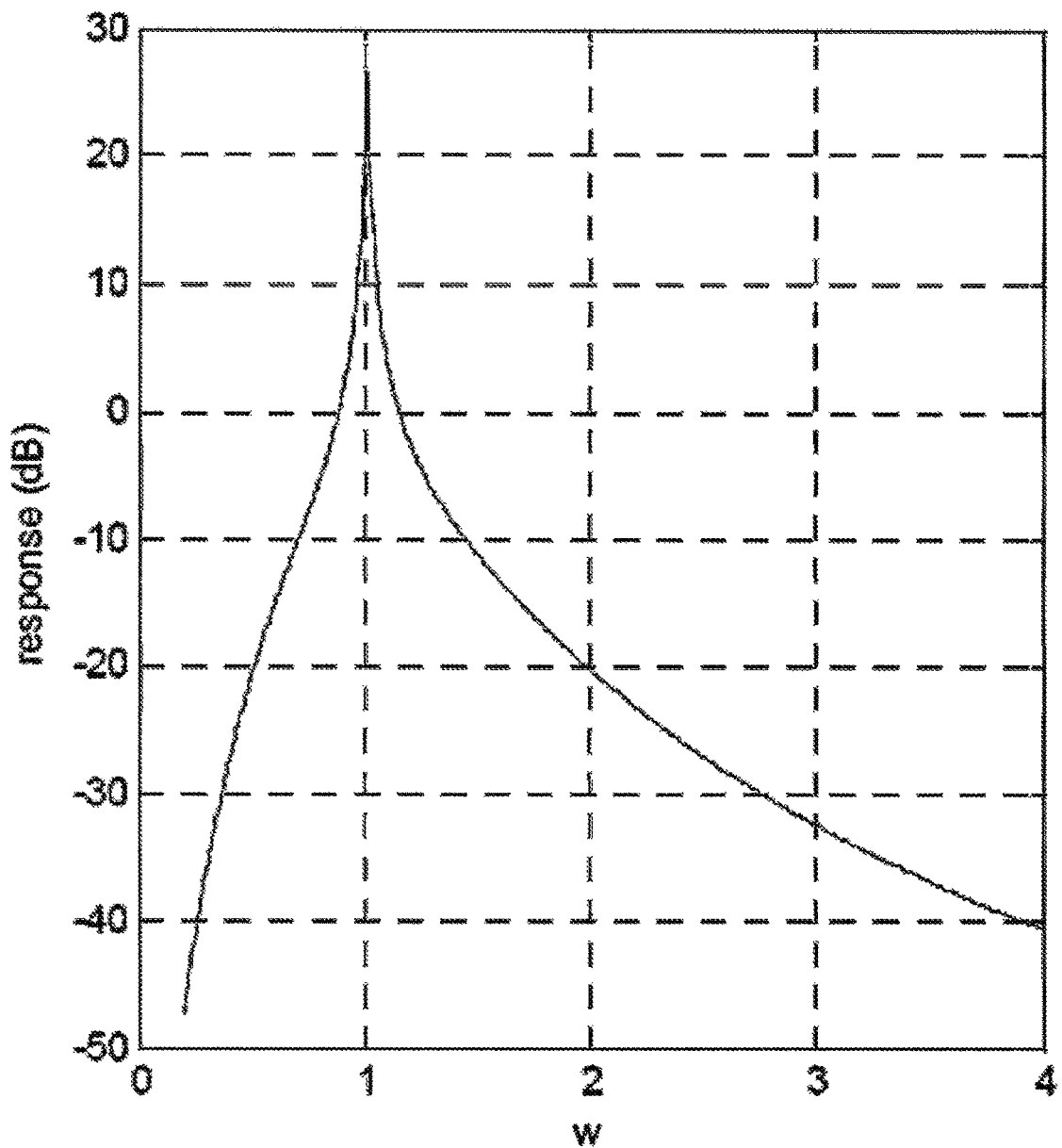
FIG. 45 is a plot of a passband of a third order variable filter after being subjected to a different tuning process.

The resulting frequency response of the CAF-3 after control cycling is complete is shown in FIG. 45. Note the desired parameters of $D_d$ and $\omega_d$ are met.

Figure 46:
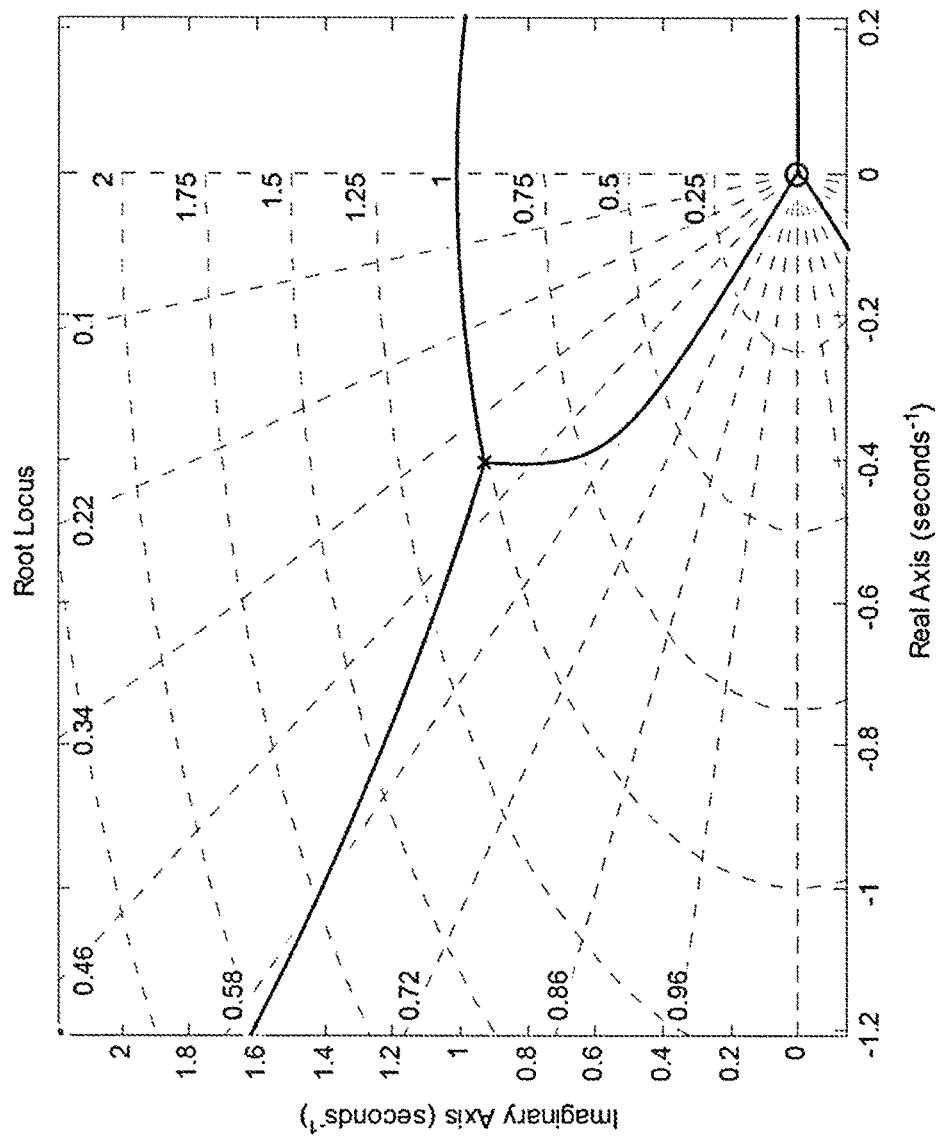
FIG. 46 is a zero degree root locus of a third order variable filter representing quasi-orthogonal control.
Figure 47:
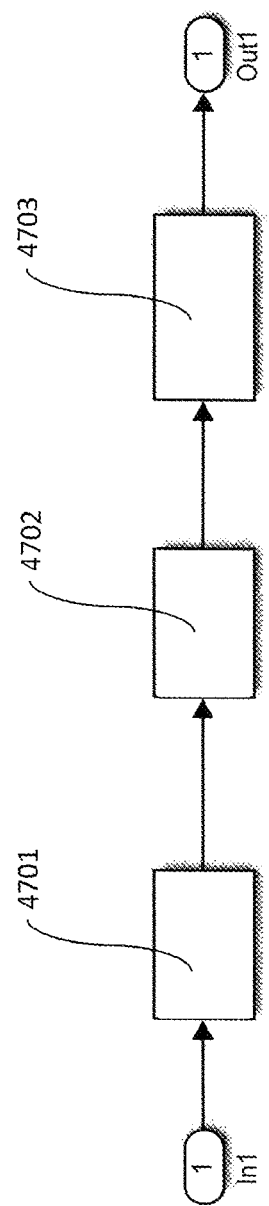
FIG. 47 is a block diagram of three variable filters connected in series.

The reason the CAF-1 through CAF-3 tracking is simple and robust is that the zero degree root locus for the dominant pole essentially follows the circular curve of constant $\omega_o$ towards the $j\omega$ axis. Movement in G basically moves $\omega_0$ along this arc, and change in $\omega_r$ makes it move radially. These motions are quasi-orthogonal. This is shown in FIG. 46 for the CAF-3.

Parallel and Series Combinations, CAF-n Elements

Referring to FIG. 47 through 53, multiple CAF-n elements, each of which may include one or more loop circuits with resonators and gain elements as discussed above, can be configured in series and parallel combinations to realize multi-pole bandpass filters. As an example, referring to FIG. 47, three CAF-1 elements 4701, 4702, and 4703 are shown to be connected in series. In this example, each CAF-1 4701/4702/4703 has a frequency response of that of a first order bandpass filter (one resonant pole in the positive frequency region) and each CAF-1 is adjusted such that it has the appropriate Q and resonant frequency commensurate with the desired overall filter response. For example, the transfer function of CAF-1 4701 is set at:

$$\frac{s}{s^2 + .1s + 0.96}$$

the transfer function of CAF-1 4702 is set at:

$$\frac{s}{s^2 + .1s + 1}$$

and the transfer function of CAF-1 4703 is set at:

$$\frac{s}{s^2 + .1s + 1.02}$$

Figure 48:
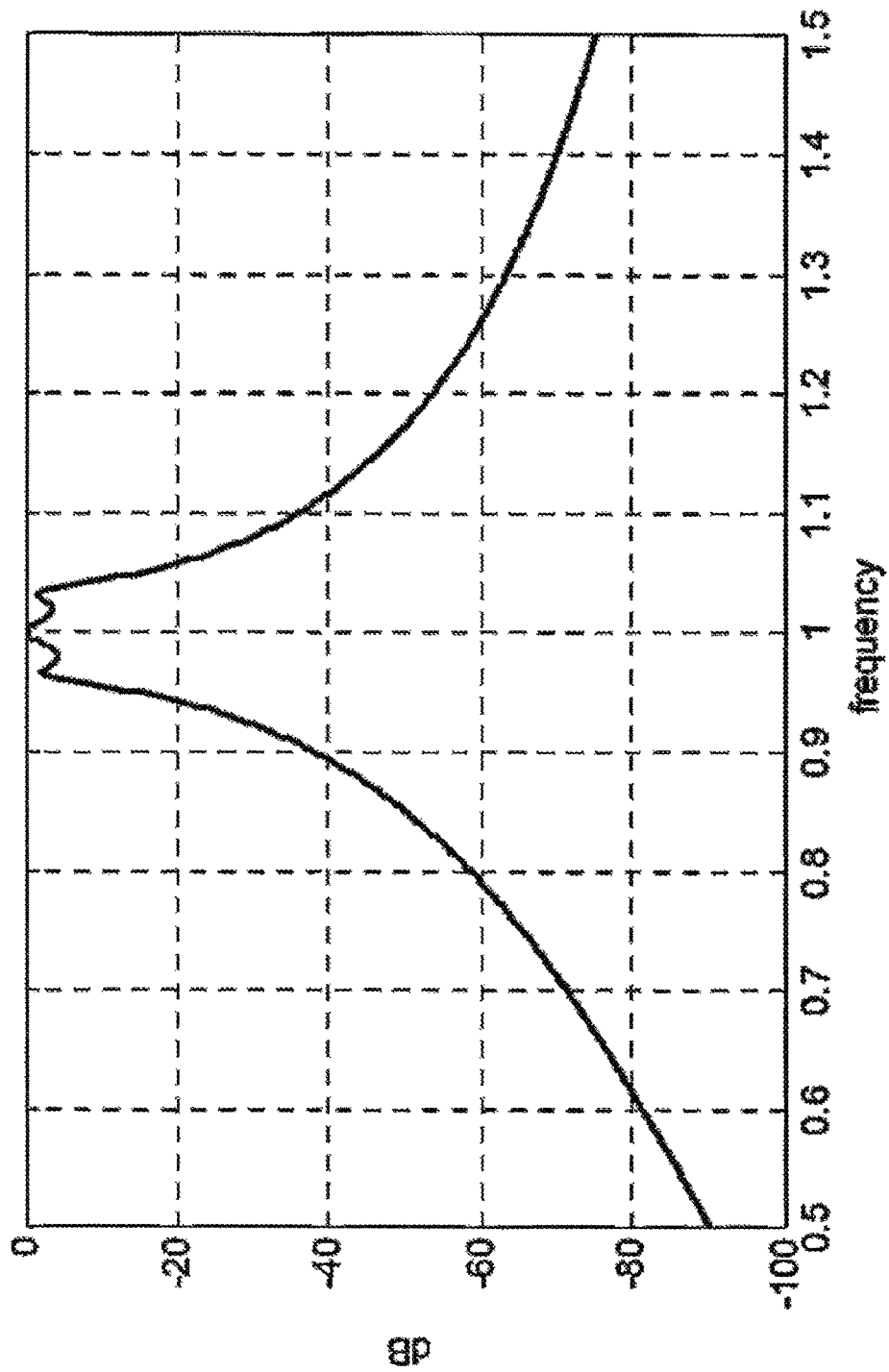
FIG. 48 depicts a typical frequency response of the circuit shown in FIG. 47.
Figure 49:
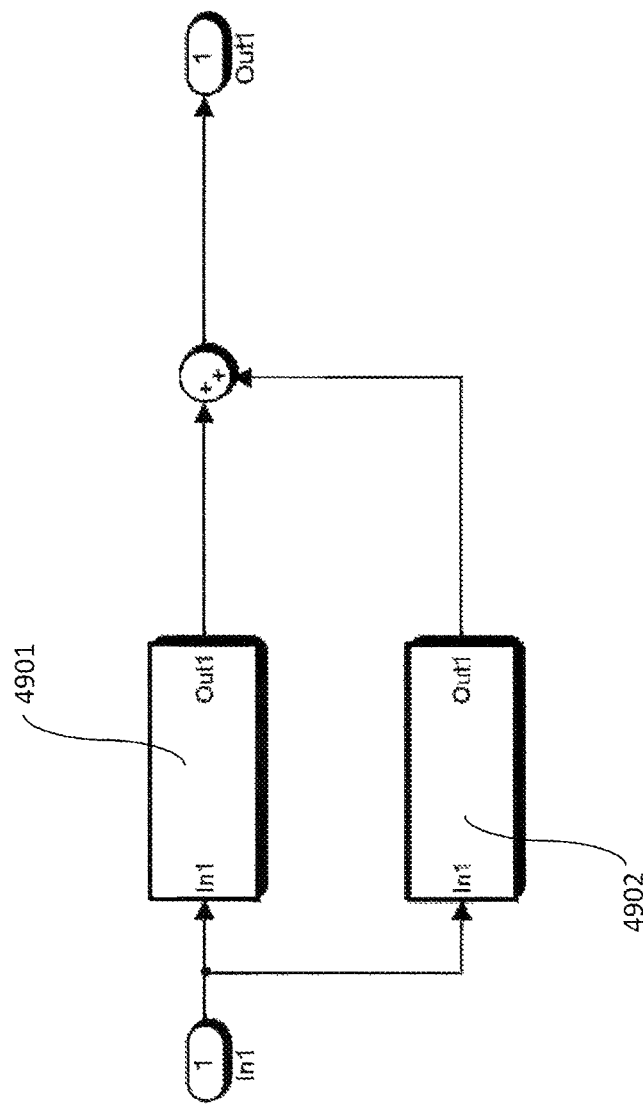
FIG. 49 is a block diagram of variable filters connected in parallel.
Figure 50:
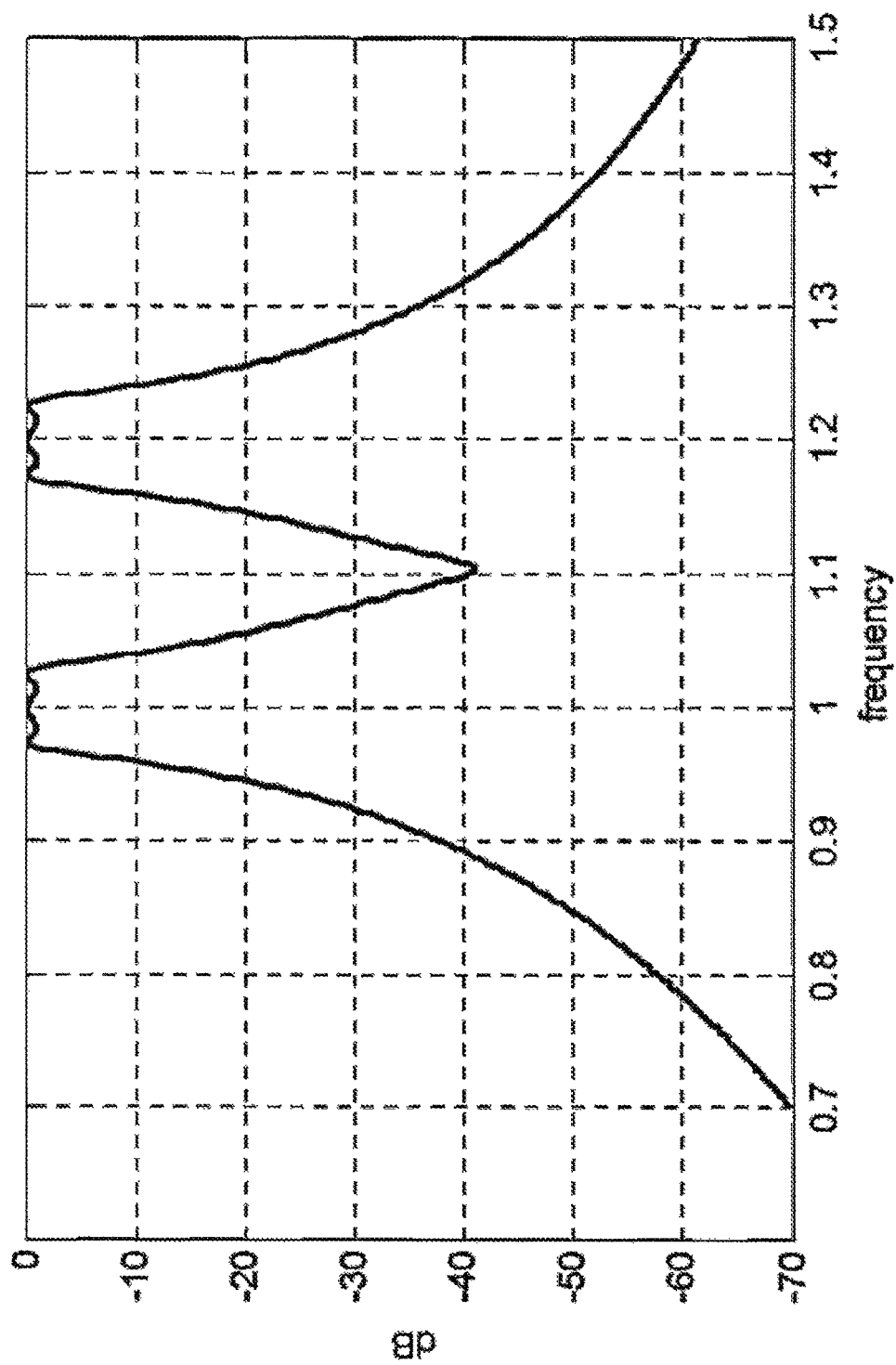
FIG. 50 depicts a typical frequency response of the circuit shown in FIG. 49.

A typical response of three CAF-1 elements 4701/4702/4703 in series is shown in FIG. 48. The series connections of CAF-1's are useful for realizing single band bandpass filters. To implement multiple bands, a parallel connection of CAF-n's may be used. An example of a filter topology providing two separate bands is given in FIG. 49. This is accomplished by a parallel connection of two CAF-3 filters 4901 and 4902 centered at the respective bands. The general response of such a filter is shown in FIG. 50.

In all of the above parallel and serial topologies involving multiple CAF-n elements, the level two feedback of FIG. 35 may be considered as well.

The bandpass filters discussed above are examples with practical utility. It will be understood that other series and parallel combinations of CAF-n's can be used to realize bandpass filters designed to achieve a desired frequency response.

Arbitrary Series and Parallel of CAF-n's

Figure 51:
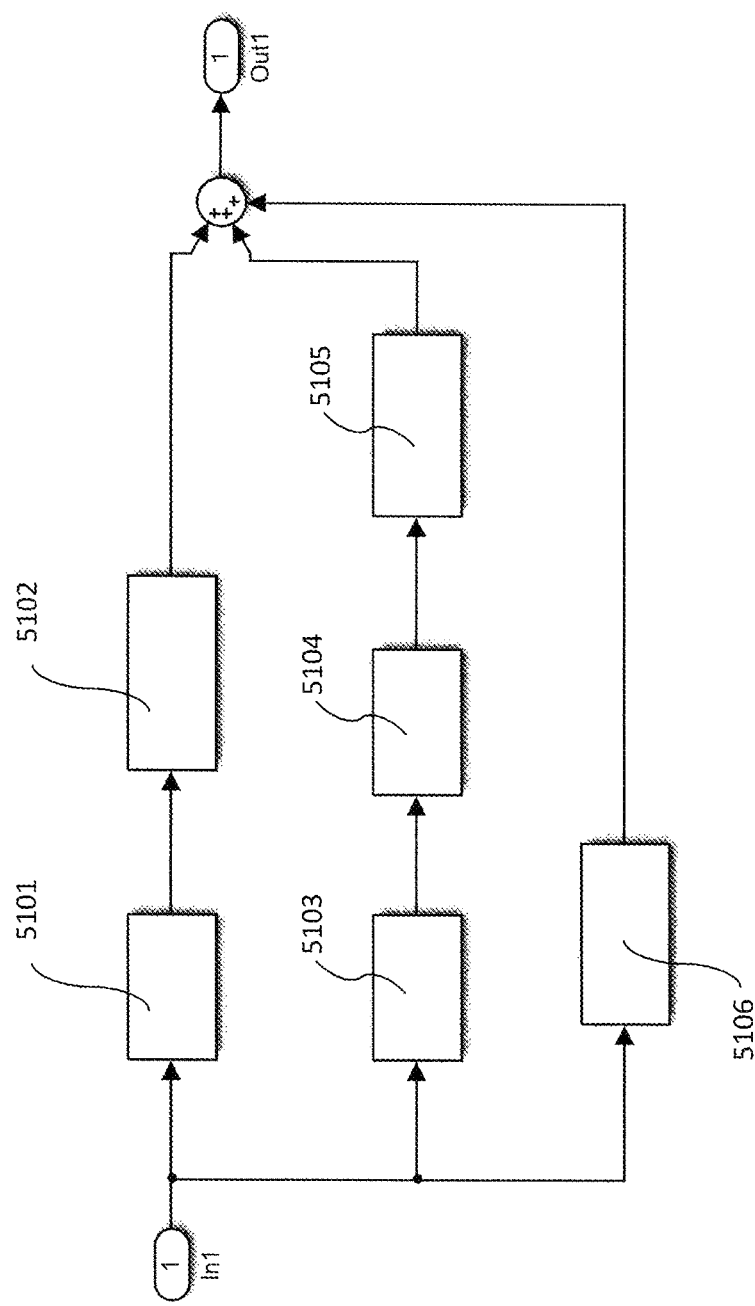
FIG. 51 is an example of an arbitrary combination of variable filters that result in a tri-band filter.

Based on the above discussion, it will be understood that arbitrary series and parallel combinations of CAF-n's can be used to generate a desired singleband or multiband frequency response. One example topology is shown in FIG. 51. In this example, the transfer function of CAF-1 5101 is:

$$\frac{s}{s^2 + .1s + 1.4}$$

the transfer function of CAF-1 5102 is:

$$\frac{s}{s^2 + .1s + 1.45}$$

the transfer function of CAF-1 5103 is:

$$\frac{s}{s^2 + .1s + 0.96}$$

the transfer function of CAF-1 5104 is:

$$\frac{s}{s^2 + .1s + 1}$$

the transfer function of CAF-1 5105 is:

$$\frac{s}{s^2+.1s+1.02}$$

and the transfer function of CAF-1 5106 is:

$$\frac{s}{s^2+.1s+2}$$

As will be understood, the frequency response may also be changed by adding level two feedback paths to form signal loops. By applying the principles described herein, circuits may be designed that allow for a desired frequency response, and that may be controlled as desired.

Generalized Multi-Pole Filters from CAF SOS Segments

Figure 52:
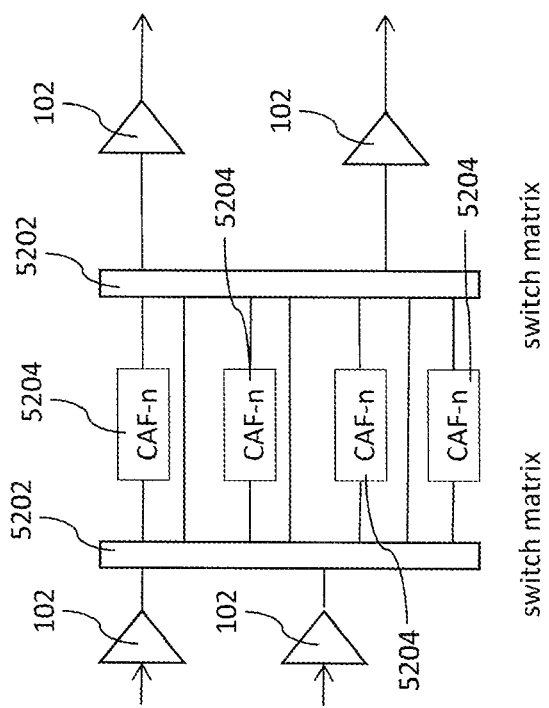
FIG. 52 is a block diagram of a lattice array of multiple variable filters with switch matrices allowing for arbitrary filter development.

In this section, the application of multiple CAF-n's making up a higher order bandpass filter will be described. These are intended to be examples of practical application of the CAF-n's to demonstrate the flexibility of these more atomic components, with the understanding that not all possible uses or combinations can be described. For example, one embodiment may be a larger programmable chip in which a number of generic CAF-n's are built with a switch matrix analogous to ALU's in an FPGA device. This is illustrated in FIG. 52. Here, a plurality of input and output buffers 102 are attached to a switch matrix 5202, which also can connect the input and output of CAF-n 5204 components. Using this design, an arbitrary order bandpass filter can be created by cascading such components as shown in FIG. 53, which is an example of a third order band pass filter, with the various components connected to provide a desired signal path 5302.

Figure 53:
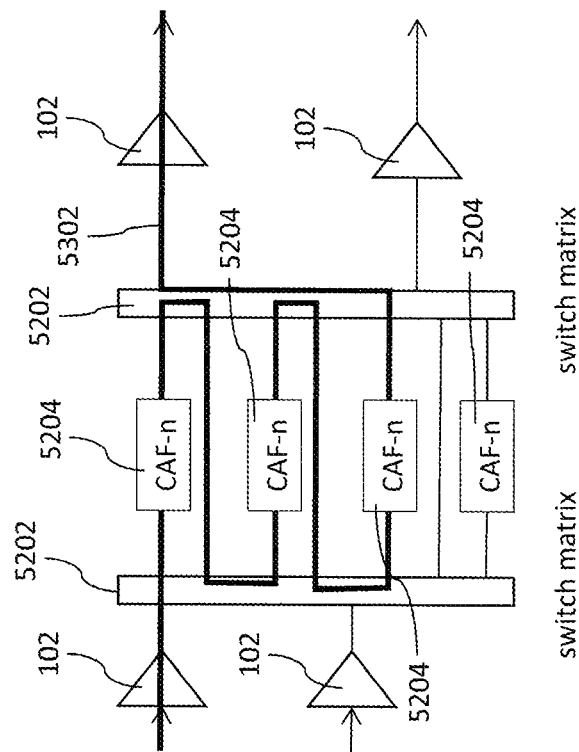
FIG. 53 is the block diagram of FIG. 52, configured to provide a desired signal path.

It will be understood that the examples shown in FIG. 52 and FIG. 53 are examples of what may be possible using a switch matrix 5202, although other configurations are possible. For example, the switch matrix may have additional CAF-n elements or other circuit elements that can be connected in parallel, in series, or in combinations thereof. In this way, a fabric of CAF-n filters may be customized for specific applications.

Performance of Generalized Multi-Pole Filters from the CAF SOS Segments

The overall filter transfer function in terms of a rational polynomial in s is now decomposed into SOS's. To avoid the confusion with the SOS internal to the CAF-n, the consideration here is the overall filter decomposition into SOS's where the poles of each SOS correspond to a dominant pole of the CAF-n. The general higher order filter to be implemented is given as a rational polynomial in s as:

$$H_{bpf}(s) = \frac{b_0 + b_1 s + \ldots b_M s^M}{1 + a_1 s + \ldots a_M s^N}$$

where M≥N. Here all of the coefficients are real valued. This can be expressed as a product of L=N/2 SOS sections as follows:

$$H_{bpf}(s) = \prod_{k=1}^{L} \frac{b_{0,k} + b_{1,k}s + b_{2,k}s^2}{1 + a_{1,k}s + a_{2,k}s^2}$$

The poles and zeros are first grouped into complex conjugate pairs. While the combining or grouping of a pair of conjugate poles and pair of conjugate zeros is somewhat arbitrary, there are generally implementation issues that favor some groupings over others. Generally poles and zeros are grouped that are closer together in a Euclidean sense in the S-plane.

Example of a CAF-11 Configured as a Butterworth Type Bandpass Filter

A Butterworth bandpass filter will be used as an example which has the form of $$H_{bpf}(s) = \frac{g s^{N/2}}{1+a_1 s + \ldots a_M s^N} = g_o \prod_{k=1}^{N/2} \frac{s}{1+a_{1,k}s+a_{2,k}s^2}$$

where $g_o$ is a real gain coefficient to be determined as part of the SOS partitioning.

Figure 54B:
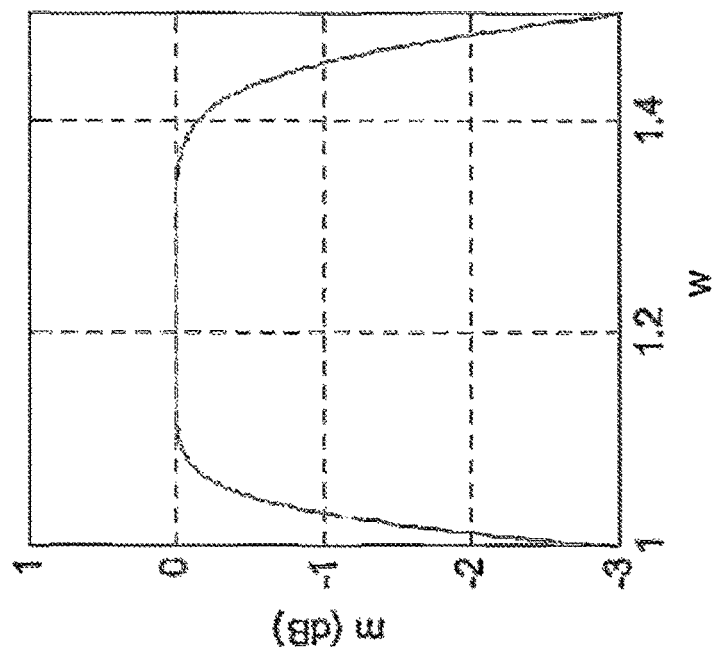
FIGS. 54a and 54b depict the frequency response of a $4^{th}$ order Butterworth bandpass filter.
Figure 54A:
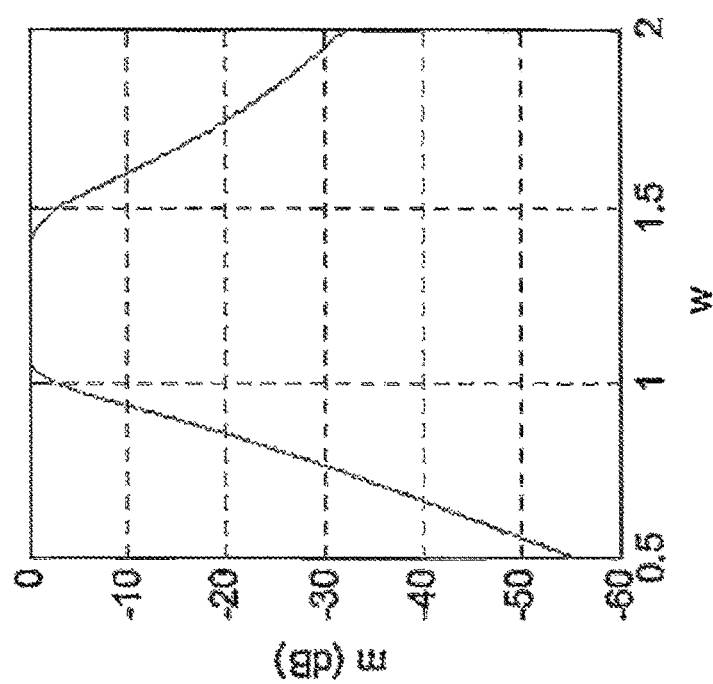

An example of a $4^{th}$ order Butterworth bandpass filter with a passband between the normalized frequencies of 1 and 1.5 is considered, decomposed into four SOS sections. A desirable feature of the Butterworth filter is that it has an optimally flat passband. FIG. 54 shows the frequency response of the Butterworth emphasizing this passband flatness. The left side response curve FIG. 54*a* is magnified on the right side FIG. 54*b* to provide detail in the passband down to −3 dB.

Figure 55:
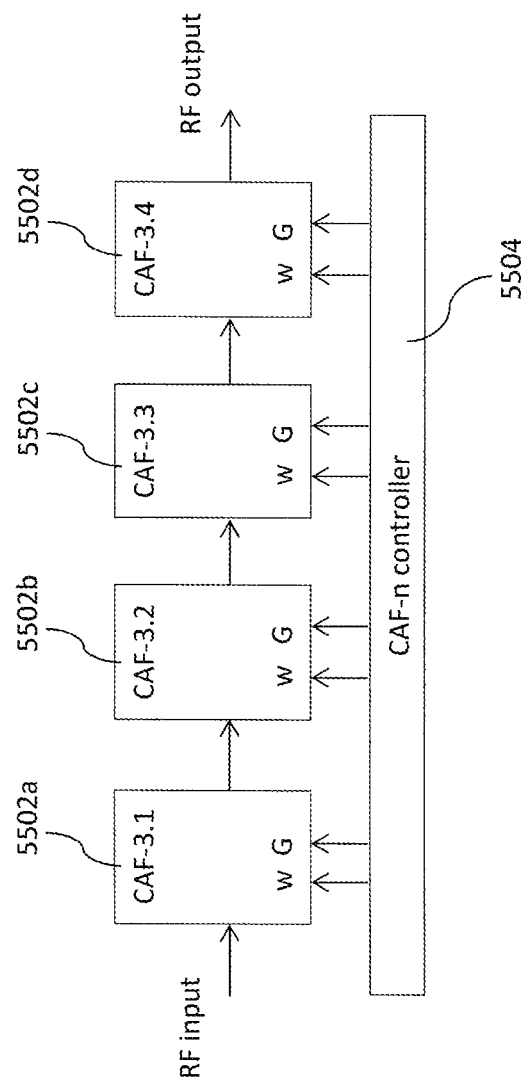
FIG. 55 is a block diagram of four variable filters in series.

To achieve this response, four SOS sections 5502*a/b/c/d* are placed in series as shown in FIG. 55 and controlled by a controller 5504. Note that the series connection of the SOS CAF-1 elements 5502*a/b/c/d* is preferred as this avoids having to use parallel connections that have to be scaled and phased to a precise value. For this example, the CAF-4 configuration of FIG. 55 will be used.

Figure 56:
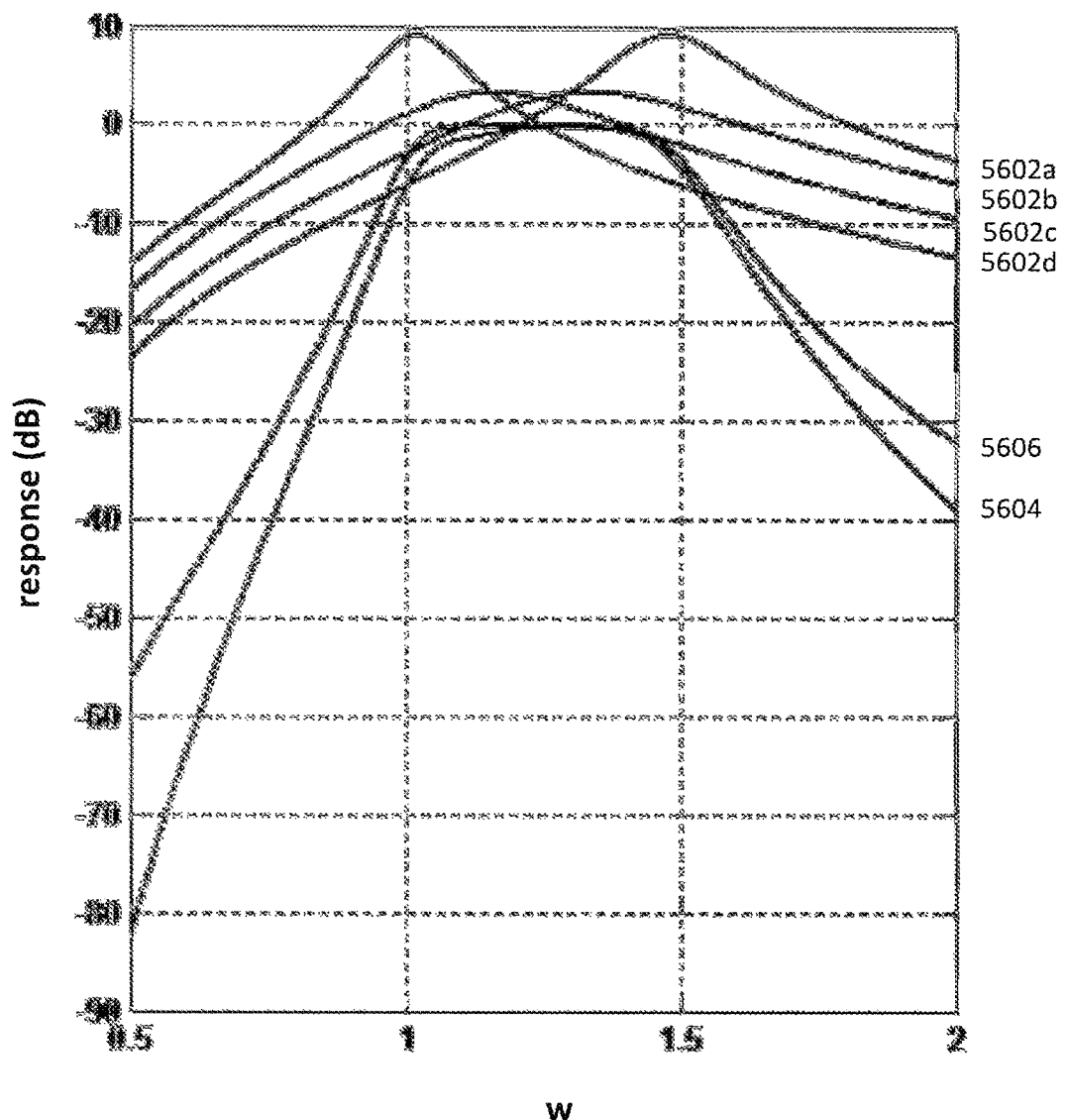
FIG. 56 is a frequency response of the circuit shown in FIG. 55.

The response curve of the normalized gain of the individual CAP-1's, represented by lines 5602*a/b/c/d*, is shown in FIG. 56. Note that each of the four CAF-1 elements are of modest Q, notwithstanding the gain flatness and the steep transition of the fourth order Butterworth. Next the frequency response of the cascaded set of four CAF-1's, represented by line 5604, is also shown in FIG. 56, presenting a reasonable match to the desired Butterworth response, represented by line 5606, with which we started. Note that the out of band transition of the four CAF-1's implementation of this example is actually steeper than that of the original Butterworth filter. This is because of the extra poles in the CAF-1's. However, the shoulders are softer than desired. This may be corrected with a better optimization.

Based on the discussion above and the examples provided, those skilled in the art will recognize that:

1. A wide variety of higher order filters can be realized.
2. Generic filter optimization methods can be used that will configure the CAF-n's for optimum system level performance. This could be based on, for example, an eye diagram of an adaptive filter used in a communication receiver.
3. The Q-spoiler mode may be used in the individual resonators within the CAF-n for synthesizing lower Q poles.

Simplified Realizations of SOS Resonator Sections

By way of example, some embodiments of the SOS resonators sections used in the CAF-n will now be given. These are intended as simplified circuit implementations of candidate embodiments and not as detailed circuits.

Figure 57:
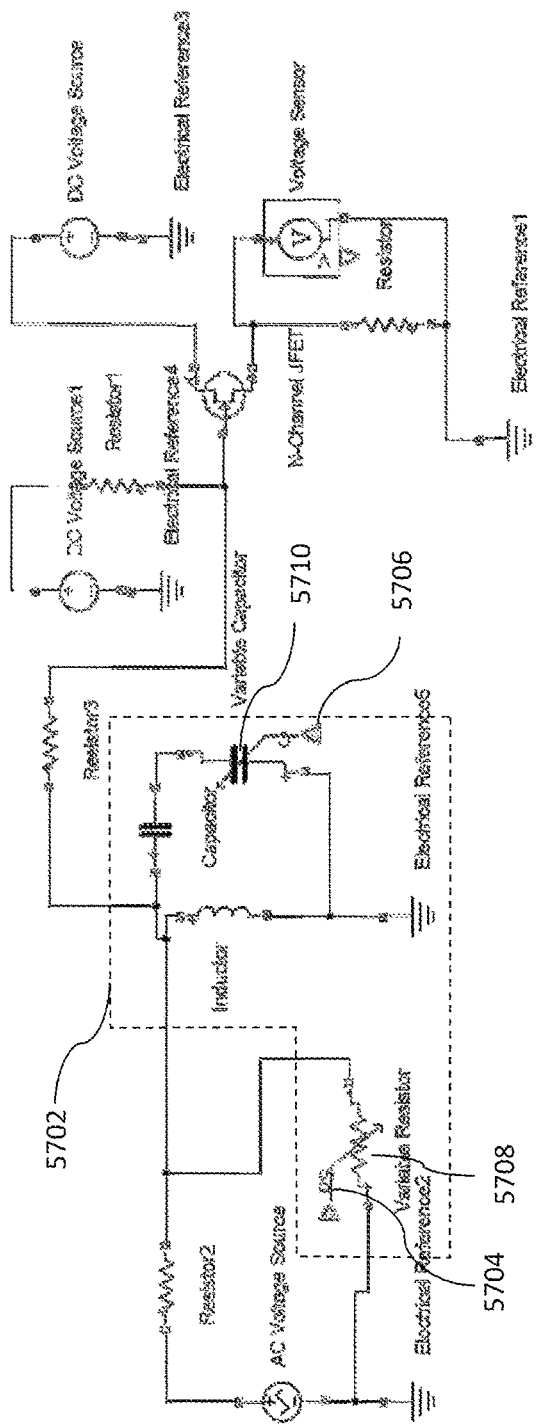
FIG. 57 is a simplified realization of a second order section circuit topography of a parallel resonator circuit.

A parallel type implementation of a second order SOS filter element 5702 is shown in FIG. 57. There are two control inputs 5704 and 5706, where control input 5704 is for a variable resistor 5708 which is a Q-spoiler, and control input 5706 is for the variable capacitor 5710, which will control the resonance frequency. The Q-spoiler 5708 moves the resonant pole horizontally along the real axis and the variable capacitor control 5710 moves the pole vertically along the imaginary axis.

Figure 58:
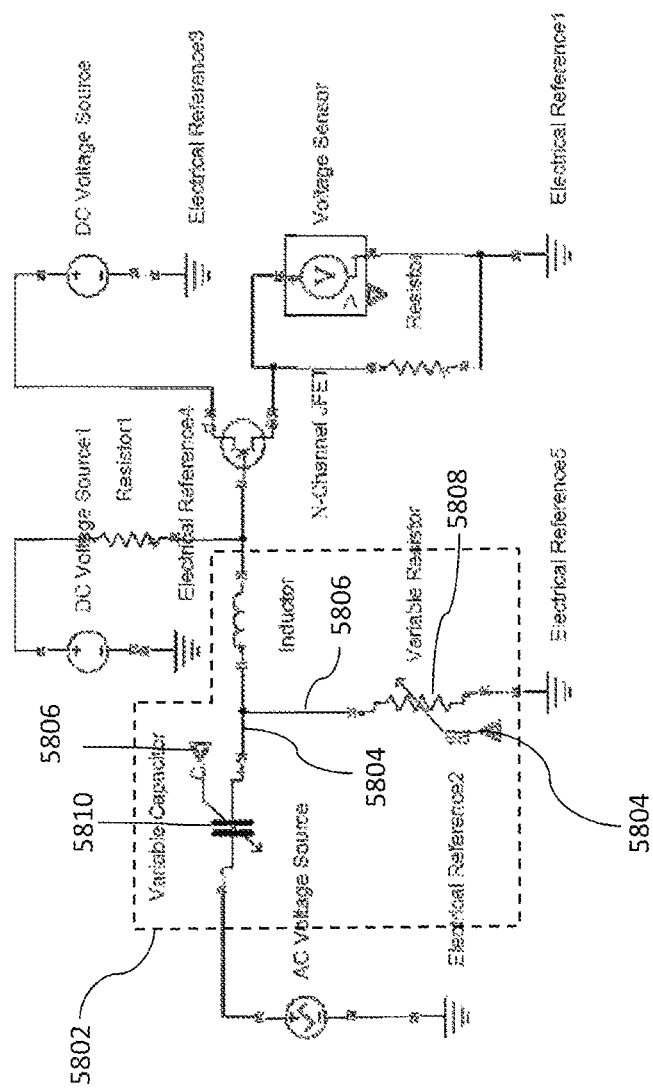
FIG. 58 is a simplified realization of a second order section circuit topography of a series resonator circuit.

The Q-spoiler 5708, which moves the pole further into the LHP, is convenient if more control is desired by the closed loop gain G. FIG. 58 shows a parallel resonance circuit 5802 with a variable resistor 5808 controlled by control input 5804, and a variable capacitor 5810 controlled control input 5806 by the Q-spoiler.

Figure 59:
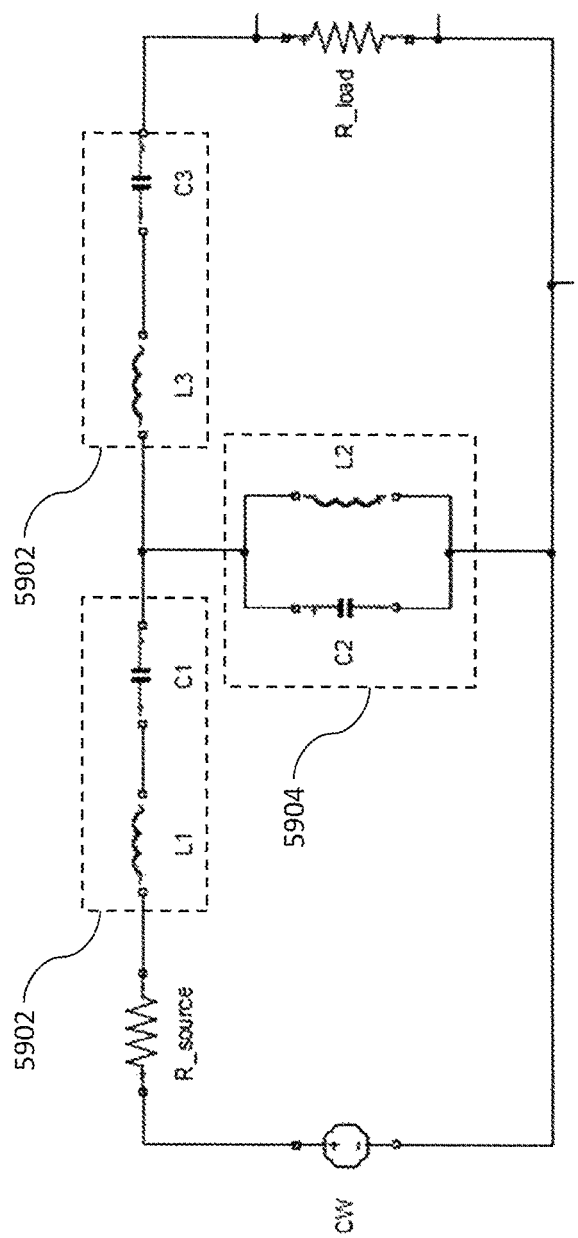
FIG. 59 is a simplified realization of a circuit topography of a third order bandpass filter.

Those skilled in the art will realize that there are a variety of ways the SOS elements can be implemented and combined. In another embodiment suitable for the CAF-3, referring to FIG. 59, the three SOS CAF-1 resonators may be combined into a single $3^{rd}$ order bandpass filter topology consisting of two series resonators 5902 and one parallel resonator 5904. The depiction of resonators 5902 and 5904 has been simplified and does not include the various control elements, etc., discussed above. This circuit offers a smaller implementation footprint as the inter-SOS buffers are not required. However, a disadvantage is that it is harder to tune.

General CAF-n Concept

Figure 60:
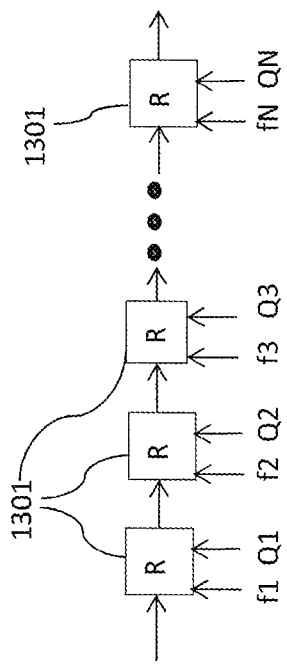
FIG. 60 is a block diagram showing a series of cascaded resonators.

The first level of generalization is that a number of R resonators 1301 can be cascaded as shown in FIG. 60. Here, N such resonators 1301 are cascaded with controls of {f1,G1} to {fN,QN}. Level two feedback may be implemented across selected adjacent individual resonator elements for improved performance as described herein.

Figure 61:
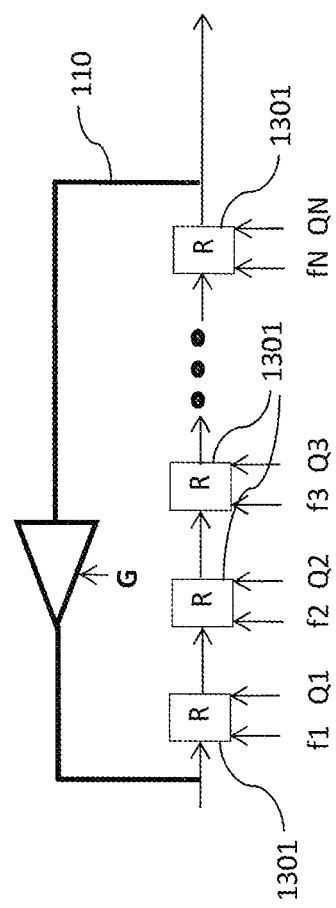
FIG. 61 is a block diagram of a series of cascaded resonators with a feedback loop.

A feedback path 110 with variable gain G is then around the N cascaded resonators 1301 to form a signal loop as shown in FIG. 61. Several examples will be given of useful behaviour of practical significance provided by this circuit. The feedback gain is in general complex and referred to as vector modulation. This implies that the magnitude of G can be varied from zero to some maximum value. In addition, the phase can be varied over $2\pi$ radians.

Figures 62, 63:
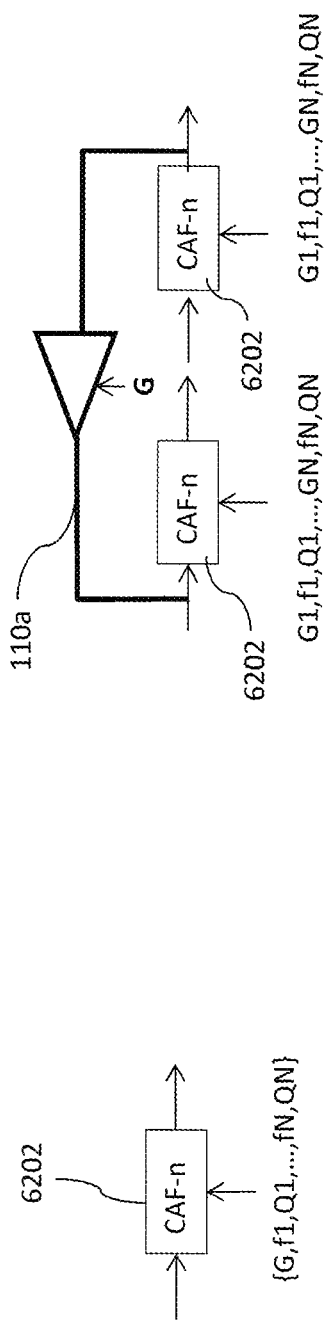
FIG. 62 is a block diagram of a generalized controllable analog filter.
FIG. 63 is a block diagram depicting the cascading of multiple CAF-n analog filters, each with individual and separate controls.

FIG. 62 shows the symbol used to represent a generalized CAF-n 6202 with the control inputs as {G1, f1, Q1, ..., GN, fN, QN}.

The next layer of generalization is that several CAF-n's 6202 can be cascaded with a feedback loop 110a with gain as shown in FIG. 63.

As can be seen, there is a general nesting of cascaded Rs 1401 and CAF-n's 6202 with feedback and variable gain. The purpose is to realize arbitrary, multi-pole bandpass filters. These filters are such that the position of the poles comprising the filter can be moved independently and arbitrarily. This is enabled by the variable Q control of each R block and the feedback gains denoted by G.

As there is redundancy in the control of the position of the poles, not all the controls need to be independent. Also for practical implementations the controls may be coupled together. The selection of controls used and groupings depends on the desired application and a large variety of such is envisioned. In the following sections a set of examples will be given emphasizing a subset of these controls.

Application of the CAF-3 Filter in a Sensor Communications Wireless Transceiver (SWT)

Figure 64:
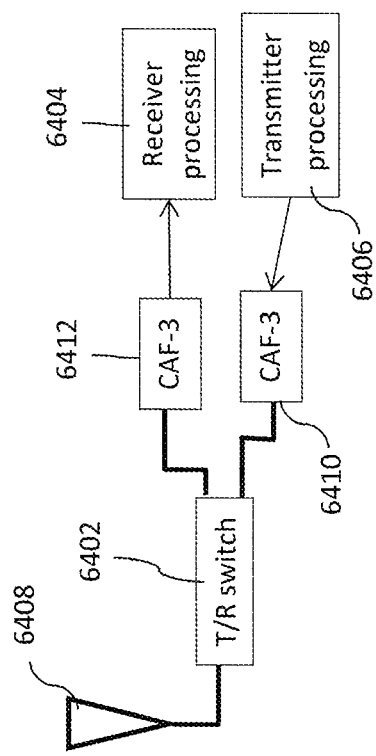
FIG. 64 is a block diagram of a sensor wireless transceiver using a controllable analog filter.

As an illustration of a practical application of the CAF-n filter, a generic sensor is considered. For this application it is assumed that the sensor telemetry transceiver initially has to determine an unoccupied portion of the spectrum to operate within and then contend with interference. A block diagram of the transceiver is as shown in FIG. 64, A T/R switch block 6402 connects the receiver 6404 and the transmitter 6408 to the antenna 6408. As the sensor telemetry is low power transmission, the CAF-3 6410 can provide the spectral shaping of the transmitted signal generated by the transmitter processing block 6406. On the receiver side, the CAF-3 6412 filters out interfering signals and centers a passband on the desired receive signal for the receiver processing block 6404.

Figure 65:
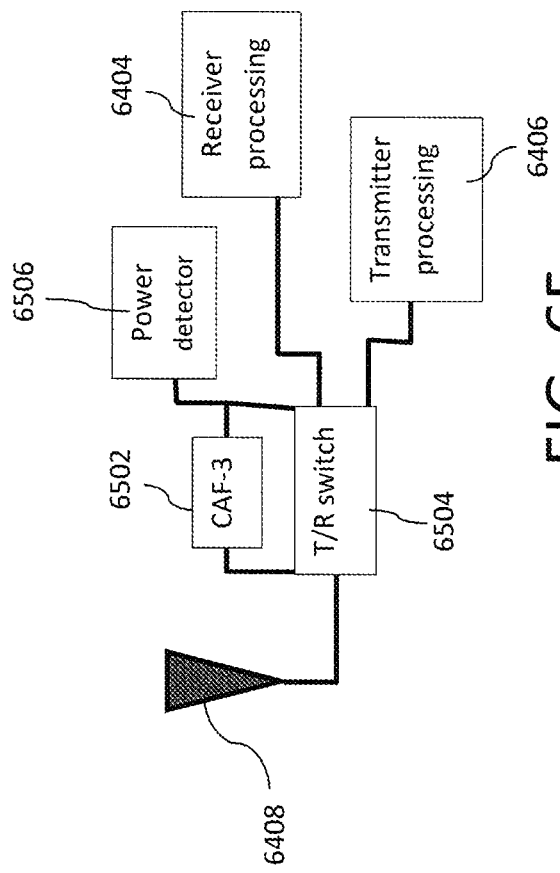
FIG. 65 is a block diagram of an alternate sensor wireless transceiver using a controllable analog filter.

Referring to FIG. 65, as the CAF-3 is frequency agile (that is, the frequency can quickly be tuned from one passband to another) there is an option of having only a single CAF-3 6502 that is shared by the transmitter and receiver functions 6406 and 6404. In the example shown, this is achieved by a circuit that uses a T/R switch 6504 with two ports and a power detector 6506.

CAF-n Based SWT as a Cognitive Radio

An enhanced implementation of the telemetric transceiver for sensor applications is the cognitive radio aspect of the CAF-3 in which a broad segment of the spectrum is continuously scanned to monitor activity. The idea is to find a spectral region in which there is little activity. Finding such a spectral hole, the transceiver can begin data communications operations using minimal transmit power and maximal Signal to Noise ratio (SNR) consistent with the environment.

Finding such a spectral hole is achieved by setting up the CAF-3 for a Q-enhanced narrow band filter response that is swept over the potential frequency band by varying the f controls of the three Rs in the CAF-3. A simple power detector at the output of the CAF-3 can be used to estimate the spectral power at the frequency of the CAF-3. The detector output is then a function of the applied frequency control for the R's. After completing a sweep the desirable spectral region(s) can be determined.

Receiver Processing and CAF-3 Control

To integrate the CAF-3 into the transceiver we have to have a means of providing a control feedback for stabilizing the approximate position of the closed loop poles. This can be done within the forward open loop control by setting the control voltages based on the desired spectral location using a reference CAF cell on the same die. The impulse response of this reference die would be measured based on a quartz crystal based time reference that then accounts for variables such as temperature, aging, chip supply voltage, and so forth. An adaptive feedback is used to precisely tune the CAF-3. This adaptive control can be implemented without additional circuitry based on using the measured outputs of the innate baseband processing already part of the data communications receiver.

Figure 66:
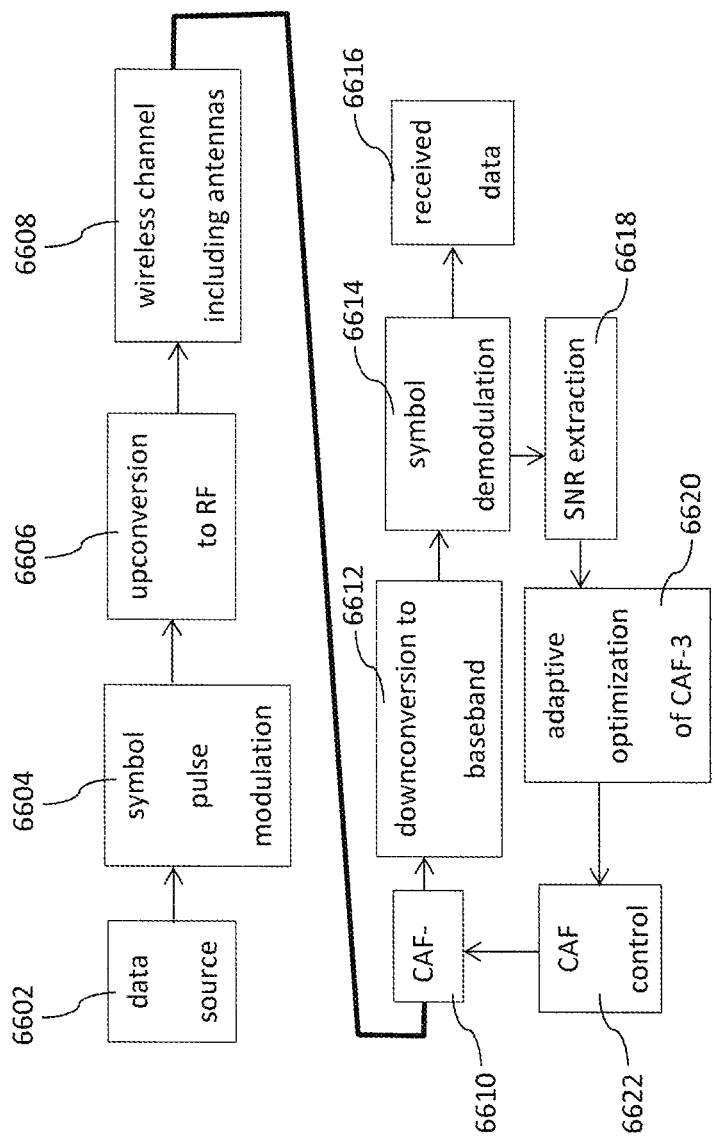
FIG. 66 is a block diagram of a wireless communication channel using a controllable analog filter.

Start with the standard model of a wireless communications link as shown in FIG. 66. An input data source 6602 is baseband modulated with a symbol or pulse shaping function 6604. This is then up-converted to RF by block 6606 and transmitted over the wireless channel 6608. The wireless channel 6608 will include standard thermal noise as well as interference from wireless sources in adjacent channels. The signal is intercepted by the receiver antenna (not shown) then filtered in a CAF-3 6610, down converted in block 6612 and then a baseband filter 6614 is applied that matches the pulse shaping filter of the transmitter. Then the data is extracted as block 6616. In this data extraction process the SNR of the demodulation process is available which is used in the Hock 'adaptive optimization of CAW-3' 6618, which has an algorithm 6620 for optimizing the control settings of a CAF-3 6610. The output of this block is converted to voltage control signals in block 6622 for the actual CAF-3 as shown. The objective of the optimizer is to maximize the SNR of the data demodulation process. As the SNR is sensitive to the pole placement of the CAF-3, it gives us a means of continuously adapting the control of the CAF 3.

The analysis will be described in terms of equivalent envelope processing. Hence even though the CAF-3 operates at RF we will omit this by assuming an equivalent baseband model of the CAF-3. Start with the standard BPSK (binary phase shift keying) modulation format based on a root raised cosine pulse shaping filter. We could use any arbitrary data communication format and modulation as the operation of the CAF-3 is the same. However, the BPSK avoids unnecessary detail in our present explanation.

While the receiver will not have a full eye diagram scope implementation it is useful for illustration here. The processing of the eye diagram scope is done to extract the SNR. We assume that symbol level tracking is done by the receiver to lock the symbol sampling to the point in the eye where it is maximally open.

Figure 67:
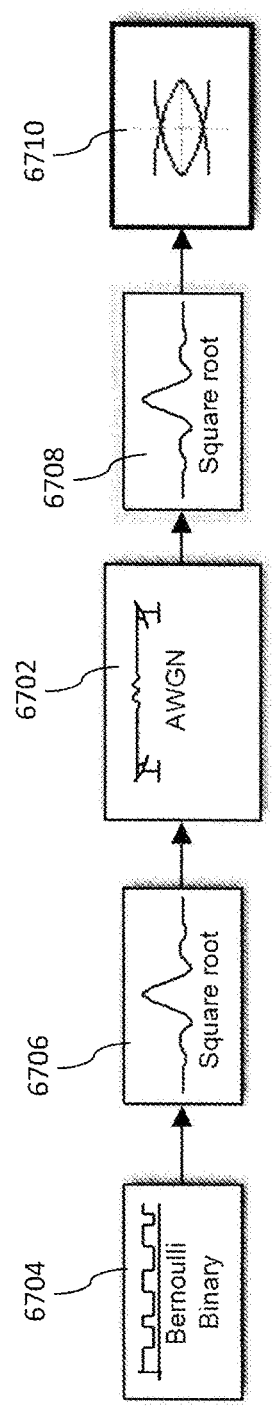
FIG. 67 is a block diagram of a baseband model of a wireless communication channel.
Figure 68:
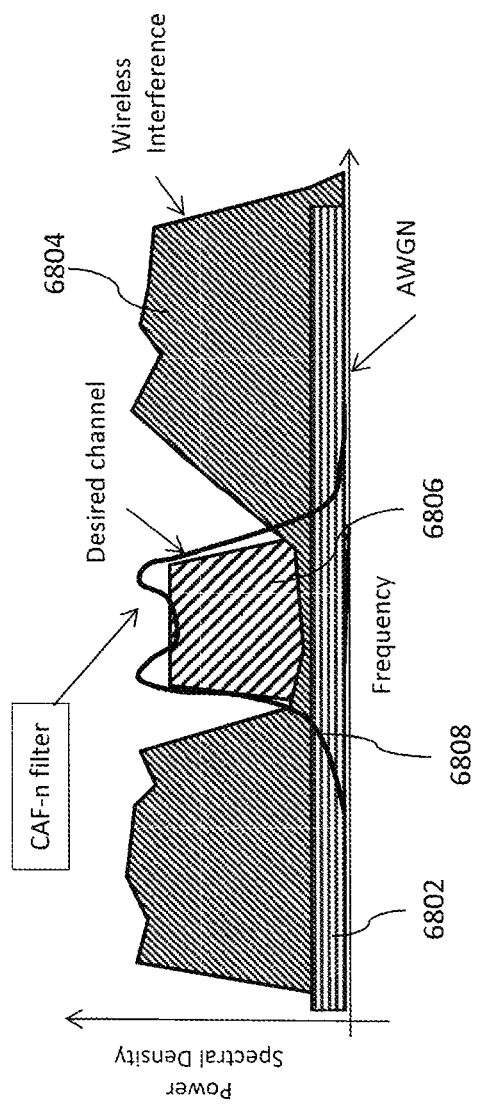
FIG. 68 is a spectral diagram depicting adjacent channel noise due to wireless interference.

FIG. 67 depicts an ideal AWGN (added white Gaussian noise) channel 6702, which is connected to a Bernoulli binary generator block 6704, a raised cosine transmit filter block 6706, a raised cosine receive filter block 6708, and a discrete-time eye diagram scope 6710. In this channel, the matched filter is optimum in terms of achieving the maximum eye SNR. A root raised cosine (RRC) pulse shaping is used for the transmitted signal in block 6706 and also for the received signal in block 6708. In the case of the ideal AWGN channel, the CAF-3 merely deteriorates the eye unless it is of bandwidth wider than the signal. However, the channel also has noise from interference from adjacent channels. This is illustrated in FIG. 68, where the AWGN is indicated by 6802, and the power spectral density (PSD) of the interference signal is indicated by 6804. The desired communication channel is indicated by 6806, and the optimum response of the CAF-3 filter is indicated by 6808.

Figure 69A:
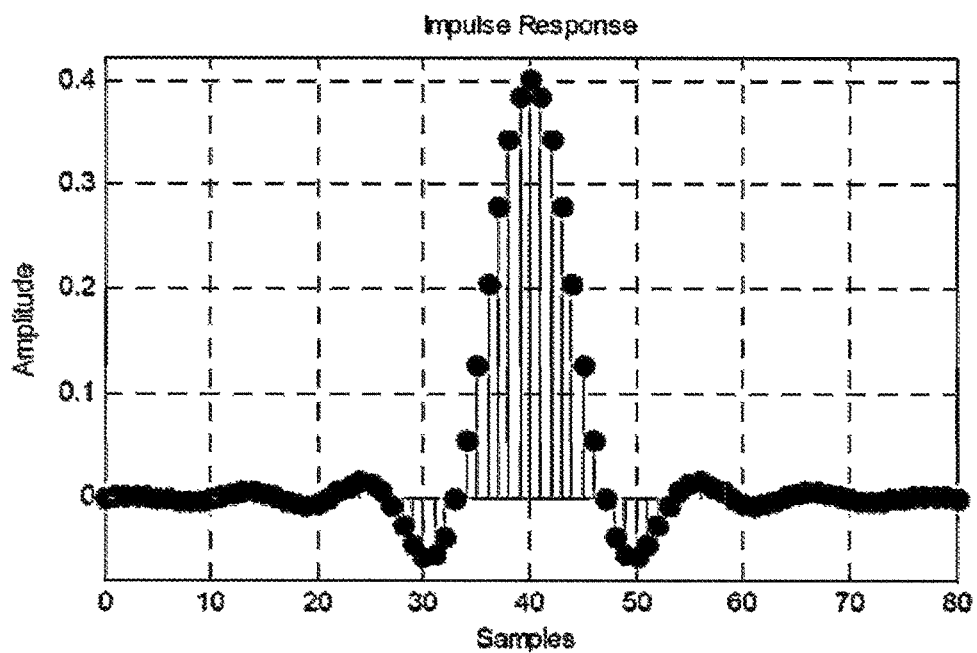
FIGS. 69a and 69b are graphs that represent the response of an RRC filter.
Figure 69B:
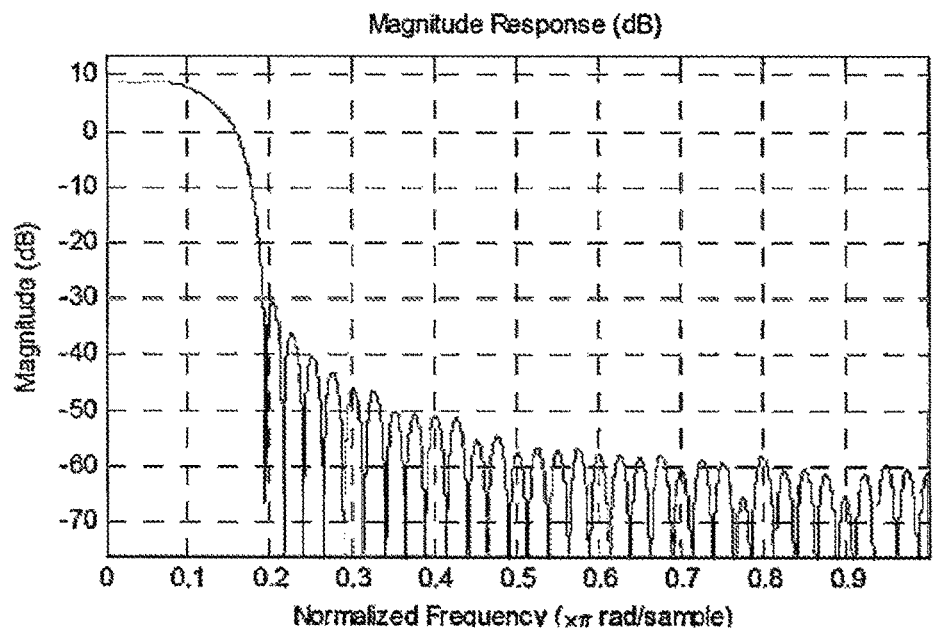

We now consider the RRC filter which is shown in FIGS. 69a and 69b. It is an FIR representation of the RRC filter that has 8 samples per symbol epoch and is 10 symbols long. The frequency response of the filter is given on the right with respect to half the sampling rate (fundamental sampling rate is 8 times per symbol).

Figure 70:
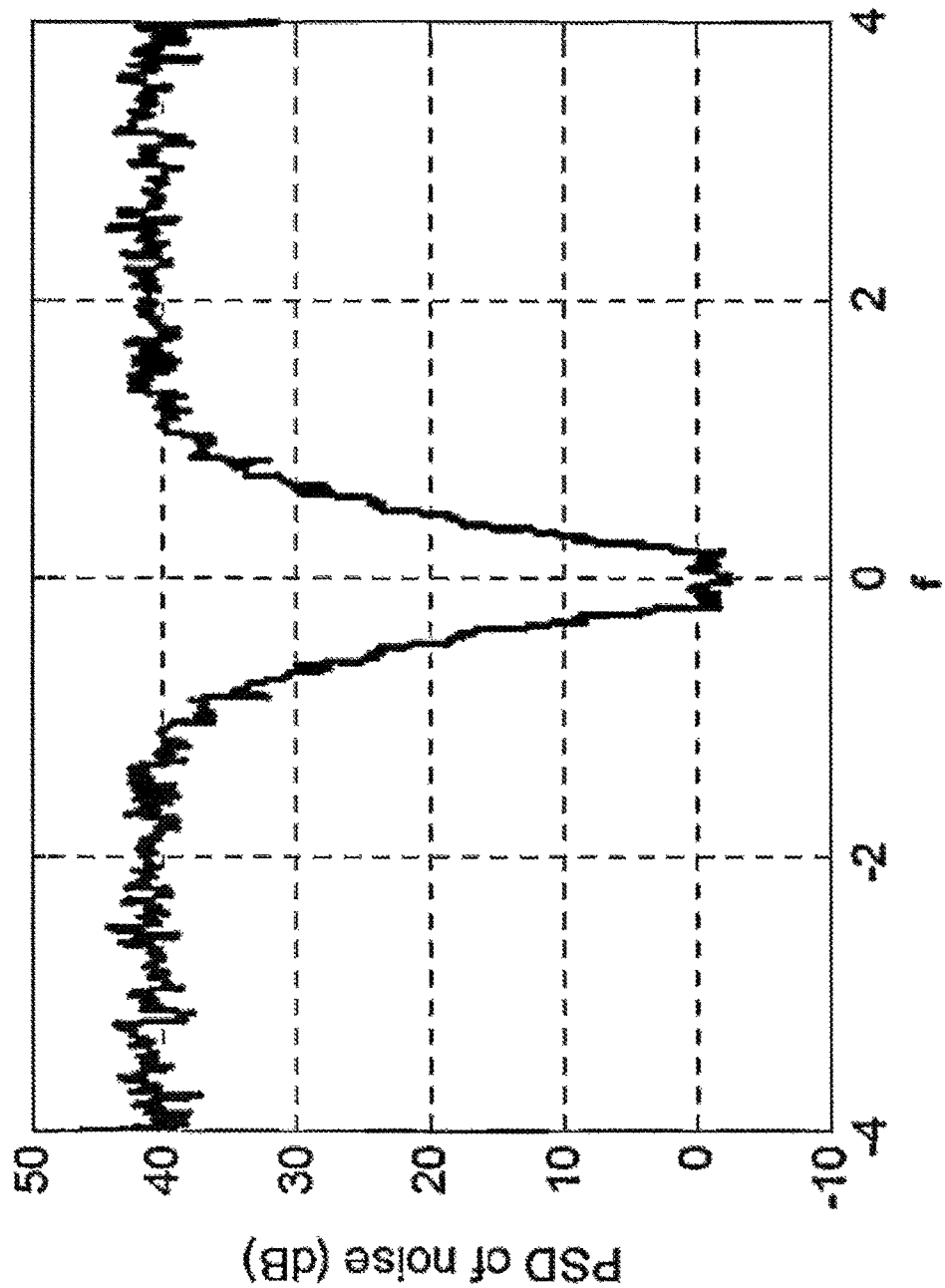
FIG. 70 is a graph of the power spectral density of additive channel noise.

Next we will assume that there are two sources of noise, the AWGN and the adjacent channel interference. The power spectral density (PSD) of the total noise is given in FIG. 70. Note that the dB scale is relative.

Next we consider the model of the CAF-3. For this discussion we represent it as an equivalent $3^{rd}$ order Butterworth low pass filter. Butterworth is selected as it has a very similar pole pattern as produced by the band-pass CAF-3. The Z transform poles and zeros are show as the modeling is in discrete time with a sample rate of 8 samples per symbol epoch. The equivalence is reasonably accurate given the relatively high oversampling rate.

Figure 71:
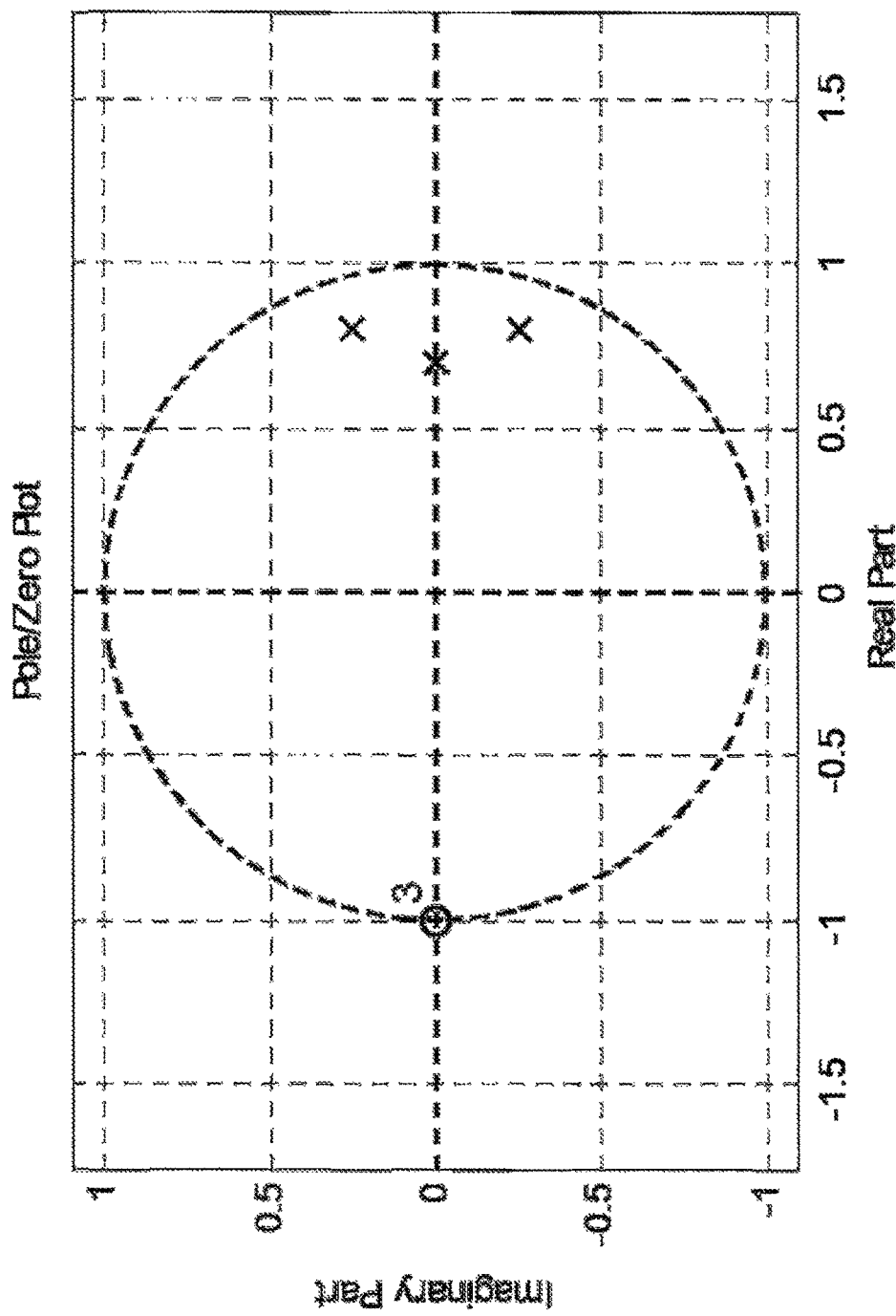
FIG. 71 depicts a pole/zero pattern of a third order, discrete time Butterworth low pass filter.

To model the change in the bandwidth of the CAF-3 we will change the bandwidth of the Butterworth LPF by changing the angle of the flanking poles slightly. For example, the filter above is modeled by setting the bandwidth at 0.44 Hz relative to an 8 Hz normalized sampling rate. In FIG. 71 we have the pole/zero pattern for a CAF-3 filter with a normalized bandwidth of 0.08 Hz with 8 Hz sampling. The center frequency offset of the CAF-3 can be represented by a complex discrete time filter by simply rotating the pole zero pattern in FIG. 71 by an amount commensurate with the frequency offset.

Figure 72:
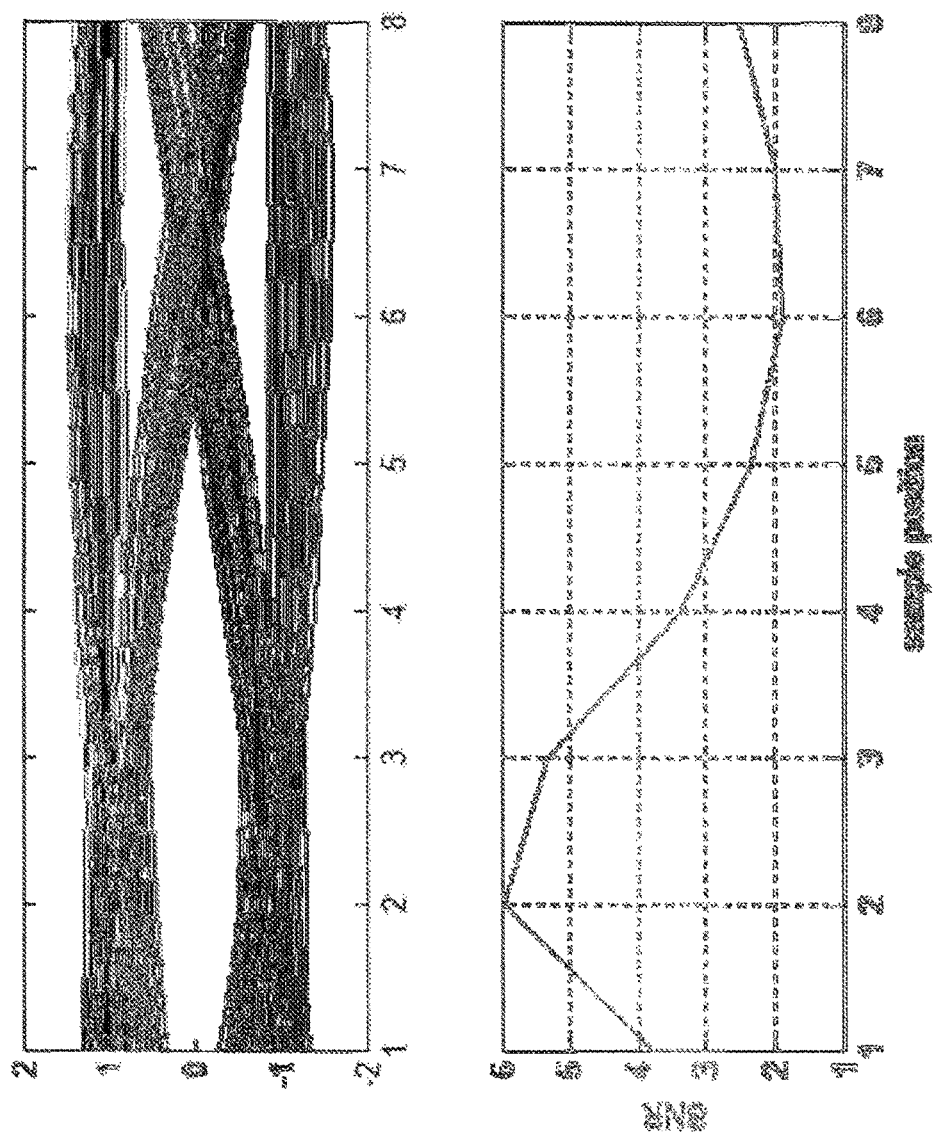
FIG. 72 shows an example of an eye diagram and the signal noise ratio of a receiver.

Finally we form the eye diagram by reorganizing the receiver filtered signal vector. The result is shown in FIG. 72 with the top plot being the eye diagram and the bottom plot being the signal to noise ratio (SNR) as a function of sample offset. The SNR is determined by the inverse variance about the two clusters of samples corresponding to the binary bit demodulation of −1 or 1. Finally one achieves the desired result where the symbol clock recovery samples at the point of maximum SNR.

The CAF-3 feedback for the optimization merely uses the maximum SNR as determined to adjust the filter controls. It is necessary to use a dithering control to do this that varies the three CAF-3 controls:

1. Q-enhancement/spoiling of the three resonators
2. Center frequency of the triplet of resonators
3. CAF-3 overall loop level two feedback gain which either increases Q of center pole and decreases Q of flanking poles (positive feedback) or decreases Q of center pole and increases Q of flanking poles (negative feedback).

Figure 73:
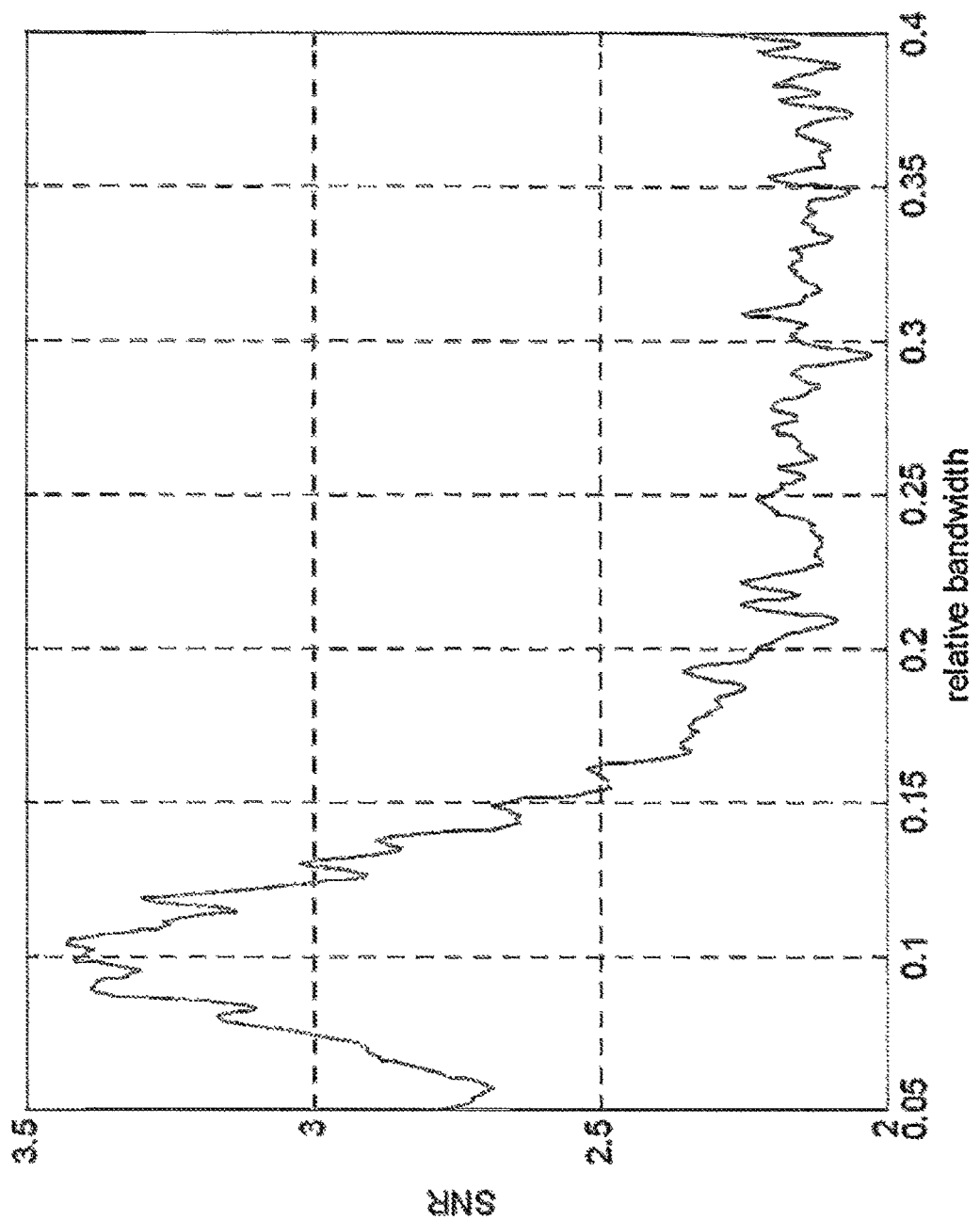
FIG. 73 depicts an example of the signal noise ratio as a function of the passband of the CAF-3.

In this simplified demonstration using a Butterworth filter we only have two controls:

1. Change bandwidth by increasing offset of flanking poles
2. Rotate pole zero pattern FIG. 73 shows the plot of the SNR which has a clear maximum inferring to a normalized bandwidth of 0.1 relative to the symbol rate is optimum. Note that the distortion caused by the CAF-3 which leads to eye closure is offset by the reduction of noise resulting from the large interference on either side of the signal passband.

Figure 74:
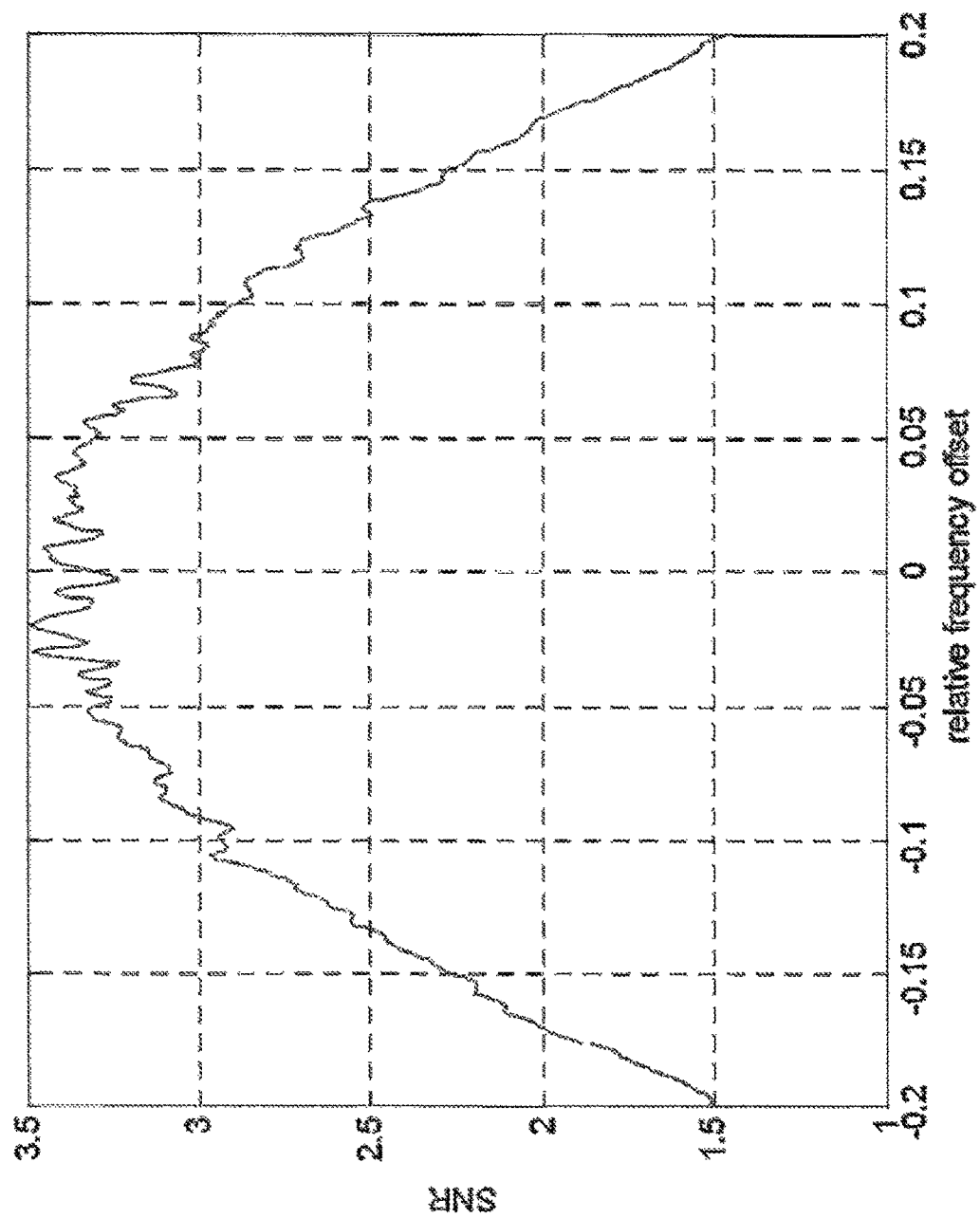
FIG. 74 depicts an example of the signal noise ratio as a function of the relative offset of the CAF-3.

Finally we consider the relative frequency offset of the CAF-3 filter as described earlier. The plot in FIG. 74 shows the SNR of the eye diagram as a function of this offset. Note again that there is a well-defined maximum in terms of the SNR.

In summary, the examples above demonstrate the ability of using the feedback from the communications receiver demodulator output into the optimizer that adjusts the CAF-3 feedback as well as the three CAF-1s. There are of course many different modulation and demodulation schemes as there are many ways of gathering metrics for the optimization of the CAF control. The SNR of the sampling, as shown in this document, is simple and available without further hardware required to the receiver.

General CAF-n Tracking Algorithm Based on Dithering

The general CAF-n will have multiple controls. These can be set in a 'feed forward' manner as will be described in the next section. However, this assumes that the optimum operating point of the CAF-n is known and a LUT (look up table) maps the desired operating point to physical voltages of {f,Q,G}. In the sensor communications tracking problem example given in the previous section the optimum operating point is not known and varies depending on the current interference conditions. The goal in this example is to optimize the SNR of the receiver output. From FIGS. 73 and 74, there is clearly at least a local optimum that depends on the two parameters of G and f. In this example the CAF-3 was assumed with the R controls of f=f1=f2=f3 and Q=Q1=Q2=Q3. Q was set first for the Rs and then the tracking loop would set G and f. Hence let the SNR of the communications receiver output for a specific instance of interference in the power spectral domain be denoted as g(G,f). It is understood that g(G,f) will change with time as the spectral interference is unknown and uncontrollable. The objective is to optimize g(G,f) which implies finding a stationary point denoted as $\{f=f_o, G=G_o\}$ where $$\frac{\partial}{\partial G} g(G, f) \Big|_{f=f_o, G=G_o} = 0$$

$$\frac{\partial}{\partial f} g(G, f) \Big|_{f=f_o, G=G_o} = 0$$

If the gradient of g(G,f) was known then the commonly used steepest ascent optimizer could be used such that the iteration of G and f would follow $$\begin{bmatrix} f \\ G \end{bmatrix}_{new} = \begin{bmatrix} f \\ G \end{bmatrix}_{present} + \alpha \nabla g \left( \begin{bmatrix} f \\ G \end{bmatrix}_{present} \right)$$

where α is some small positive real parameter selected based on how quickly the spectral interference changes. It is generally determined experimentally. However, $$g\left( \begin{bmatrix} f \\ G \end{bmatrix}_{present} \right)$$

is not generally known to a sufficient degree of accuracy, and therefore $$\nabla g\left( \begin{bmatrix} f \\ G \end{bmatrix}_{present} \right)$$

is determined numerically by determining the following three SNR values of $$\left\{ g_0 = g\left( \begin{bmatrix} f \\ G \end{bmatrix}_{present} \right), g_1 = g\left( \begin{bmatrix} f \\ g \end{bmatrix}_{present} + \begin{bmatrix} \Delta f \\ 0 \end{bmatrix} \right), \right.$$
$$\left. g_2 = g\left( \begin{bmatrix} f \\ G \end{bmatrix}_{present} + \begin{bmatrix} 0 \\ \Delta G \end{bmatrix} \right) \right\}$$

The optimizer then follows the simple algorithm of if g1>g0 then increase f by Δf otherwise decrease f by Δf if g2>g0 then increase G by ΔG otherwise decrease G by ΔG In this way the CAF-3 control is always hunting for the optimum SNR. The increments of Δf and ΔG depend on the application. This is a form of dithering control which can be applied to an optimizer when the objective function is essentially unknown. If the interference changes slowly then Δf and ΔG can be small, however, this requires a longer dwell time to measure the commensurate small change in SNR. If the interference changes more rapidly then it is necessary to use a larger dithering step size of the parameters to be optimized. Generally dithering schemes are robust and simple to implement hut seldom provide the best performance as it does not take advantage of known characteristics of the objective function.

An Alternate CAF Stability Circuit

Figure 75:
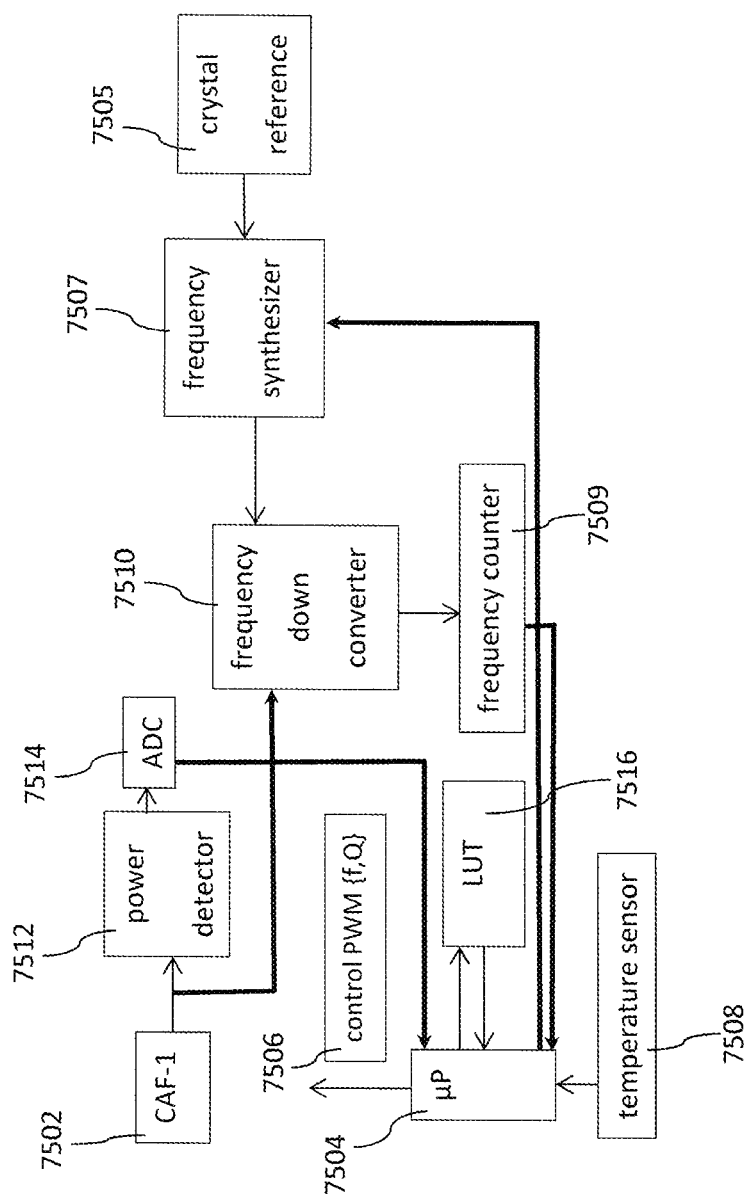
FIG. 75 is a block diagram of a CAF-1 calibration and stabilizing circuit.

In the previous example, the communications receiver output SNR was optimized via a dithering algorithm to set the CAF-3 filter controls and to track changes resulting from device drift and un-modeled parameters affecting the CAF-3 response. Another form of a stability circuit is presented in this section. FIG. 75 is based on a circuit that has processing built in for the purpose of calibrating and stabilizing the response of a CAF-1 block 7502.

The microprocessor 7504, through a DAC implemented as a PWM (pulse width modulation) circuit 7506 and based on readings from a temperature sensor 7508, adjusts the control for the frequency and Q of the CAF-1 7502. It drives this such that the CAF-1 7502 just starts to self-oscillate. The frequency of this self-oscillation is down converted in block. 7510 by a frequency synthesizer signal generated by a crystal reference 7505 and a frequency synthesizer 7507 that is set also by the microprocessor 7504. A frequency counter 7509 or other measurement means determines the frequency of the down-converted signal. In this way the resonant frequency of the CAF-1 can be determined. Also there is a power detector 7512 and ADC block 7514 that can estimate the rate of increase of the self-oscillation signal at the output of the CAF-1 7502. The microprocessor 7504 estimates this exponential rise of power and from this determines where the closed loop pole of the CAF-1 7502 is. Presently it will be just to the right of the jω axis. If the Q-enhancement is decreased slightly then the self-oscillation will continue at the same frequency to a high accuracy but will begin to decay exponentially. No the pole is on the left hand side of the jω axis. Again based on the power detector 7512, this exponential decay can be measured and the operating point measured. By repeatedly bringing the CAF-1 7502 into self-oscillation and then reducing the Q-enhancement by a controlled amount the mapping of the CAF-1 7502 to the f and Q control signals can be completed. This calibration can be done based on circuitry on chip that requires no additional off chip components except for the crystal reference source. During operation calibration breaks can be made such that the LUT 7516 is continuously updated. In the case of the wireless sensor, the transmitter and receiver functions are separated by epochs of inactivity in which the calibration processing can be done.

Figure 76:
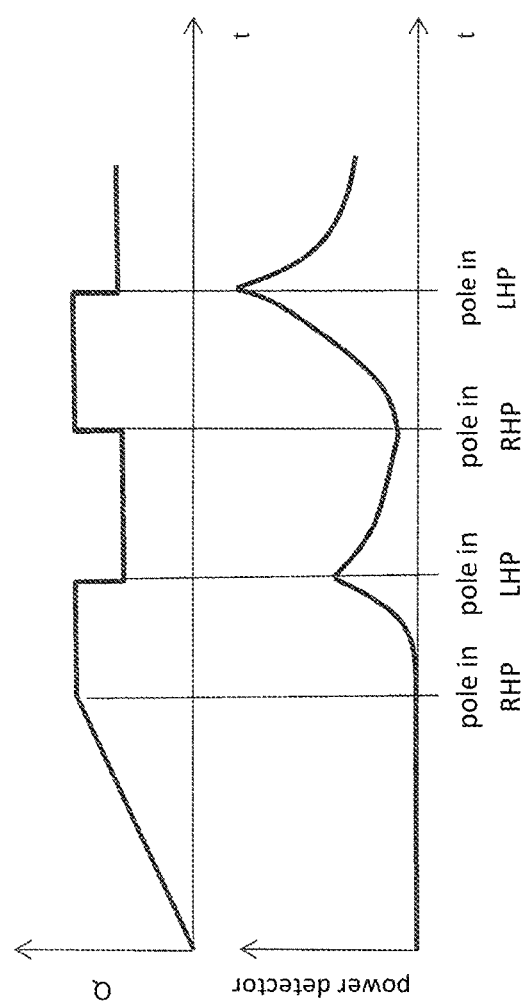
FIG. 76 is a graph depicting a rapidly alternating Q control that measures the pole position based on exponential rise and decay.

FIG. 76 shows an example of the Q control of the CAF-1 alternated between higher and lower levels that alternately places the closed loop pole of the CAF-1 in the right hand and left hand planes. The resulting exponential rise and decay is easily measured by the power detector with numerical analysis done on the microprocessor. Hence the applied Q control voltage can be mapped to a specific pole position. This is stored in the LUT such that when a pole position is required for the filtering operations of the CAF-1 then the LUT can be interpolated and the {f,Q} control voltages set.

The real part of the closed pole value is easily measured. Suppose that the pole is in the right hand plane such that it has the form of a exp (bt) where a and b are constants that are unknown. Then if the envelope voltage is measured at two different times of $t_1$ and $t_2$ resulting in $x_1$ and $x_2$ respectively then the desired parameter b can be estimated from $$x_1 = a \exp(bt_1)$$

$$x_2 = a \exp(bt_2)$$

-continued $$b = \frac{\ln\left(\frac{x_2}{x_1}\right)}{t_2 - t_1}$$

Either the times of $t_1$ and $t_2$ can be set and the voltages $x_1$ and $x_2$ measured or else fixed thresholds can be set at $x_1$ and $x_2$ and the time difference of $t_2-t_1$ measured. Either approach is straight forward.

Other Examples

It will be understood from the forgoing that the CAF-n can be designed to be relatively easy to broaden the bandwidth. As was shown above, a small amount of feedback gain G around the 3 Rs of a CAF-3 is simple and robust way to change the passband from something representing a single pole passband response to a broader response similar to a second order Chebyshev.

An application of this is the wireless sensor where the CAF-3 can be configured on the fly to be a sensor for power spectral density for a cognitive radio, then provide a transmitter fitter for this passband and a receiver filter using T/R switches to reorient the filter for transmit and receive functions. In the receive mode we can tie the CAF-3 into an adaptive loop that uses the SNR of the digital sampled output to optimize filter parameters. As the {f,Q} control is orthogonal this SNR optimization is robustly achieved with a simple dithering algorithm. Finally in setting up the CAF-3 it is necessary to know where the poles are located as a function of the controls. This can be achieved by using a CAF-1 on chip for calibration purposes. By alternating the pole position in the right and left hand planes (unstable and stable respectively) the envelope of the self oscillation of the CAF-1 can be used as a probe signal to estimate the real part of the pole location. The imaginary component is determined by the frequency of self-oscillation. The self-oscillation can be measured based on comparison with a crystal locked synthesizer frequency. Instead of the CAF-1 the Rs of the CAF-3 can also be used directly. However, implementing the CAF-1 allows for calibration to be continuous and in parallel with the operation of the CAF-3 which is then dedicated for the actual signal processing. The measurements of the CAF-1 pole location as a function of the control voltages and perhaps chip temperature is stored in a LUT. The values of the LUT are interpolated when the CAF-3 is to be configured.

Other use examples of the CAF may include, but are not limited to: Equalizer for an antenna to provide a flat antenna response (enhanced filtenna); Optimized front end module (FEM); Frequency synthesizer; Integrated sensor/cognitive radio system for remote patient monitoring; Low cost sensor transceiver network for Smart roads, Smart signs, and Smart/Driverless cars; Enhanced WiFi systems operating at both 2.4 GHz and 5.0 GHz; Enhanced Bluetooth systems; General high performance analog tunable RF filtering; Spectrum surveillance systems for electronic warfare applications; Automobile proximity radar modules operating at very high frequency (above 20 GHz) for collision avoidance; Variable and tunable delay-line modules; Phase control modules; Enhanced sensitivity detectors for remote sensing applications; Drone surveillance and control;

Phase Shifter

As is known in the art, the phase of a signal may be affected by many different factors as it passes through a circuit, some of which include stray component capacitances and inductances that may be referred to as "parasitics". As a result, it may be necessary to incorporate a phase shifter to correct the phase of a signal passing through the circuit. The phase shifter used will depend on the actual implementation of the circuit. Various types of phase shifters are known in the art, and a person of ordinary skill may incorporate a suitable phase shifter into a CAF-n as needed. There will now be described some alternative design when implementing a phase shifter to the CAF-n circuit, with the understanding that it is not possible to described all possible implementations.

In general, for a CAF-n circuit that is implemented on a chip, where parasitics are generally minimal, well modeled and understood, and where the CAF-n circuit is intended to be used over a modest frequency range, a fixed phase shifter may be adequate. In other circumstances, it may be necessary to incorporate a variable phase shifter.

It has been found that the closed loop passband of the CAF-1 forms around the range of frequency where the open loop phase shift is a multiple of 360 degrees. As it is desired to have only a single passband, the passband of the resonator may be arranged to coincide with the frequency of a multiple of 360 degrees phase shift. If the resonator peak frequency is misaligned, then the closed loop response peak will still coincide with the frequency at which a multiple of 360 is achieved, although the passband may be distorted. In addition, it has been found that a detuned resonator adds a phase shift and can be used to add a controllable modest phase shift. Furthermore, it should be recognized that there is no such thing as a true phase shifter. Any phase shifter is really an implementation of a variable delay with some associated magnitude response that is frequency dependent.

Accordingly, a variable phase shift may be introduced by starting with a variable delay line that is made up of a uniform sequence of varactor diodes along a transmission line. By varying the varactor voltage, the group delay can be varied, and by changing the group delay, the phase can be shifted.

As the array of varactors is finite in length and spacing, it will have a non-uniform amplitude response in terms of frequency. In this context, a single varactor will act similar to a low Q resonator with a variable capacitance, and three varactors will act similar to three coupled resonators as in the CAF-3, Thus, a small number of varactor diodes may be used to approximate a variable delay line by creating a structure that has variable group delay with a reasonably uniform magnitude response over a desired frequency range. Similarly, 90 degree hybrid couplers used in a quadrature modulator chip are essentially Hilbert transformers that work over a modest frequency range. In other words, variable phase shifters, resonators, delay lines and quadrature modulators may be considered as circuits arranged and optimized to provide a variable delay over a range of frequencies.

By generalizing the variable resonator and variable phase shifter and recognizing that they are functionally similar in the context of application to the CAF-n, it is possible to use a plurality of sub-circuits in the loop, where each sub-circuit can be controlled to give a desired delay and amplitude response that can be controlled by a plurality of control voltages.

Figure 77:
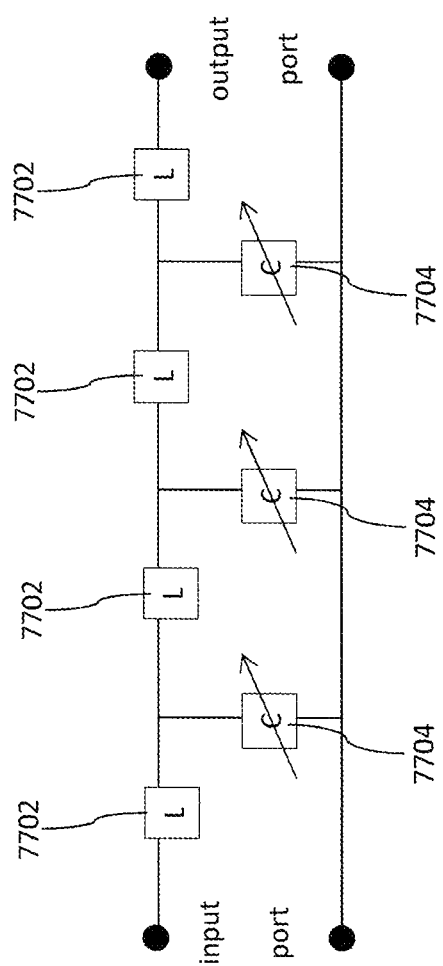
FIGS. 77 through 81 are block diagrams of examples of phase delay elements.
Figure 78:
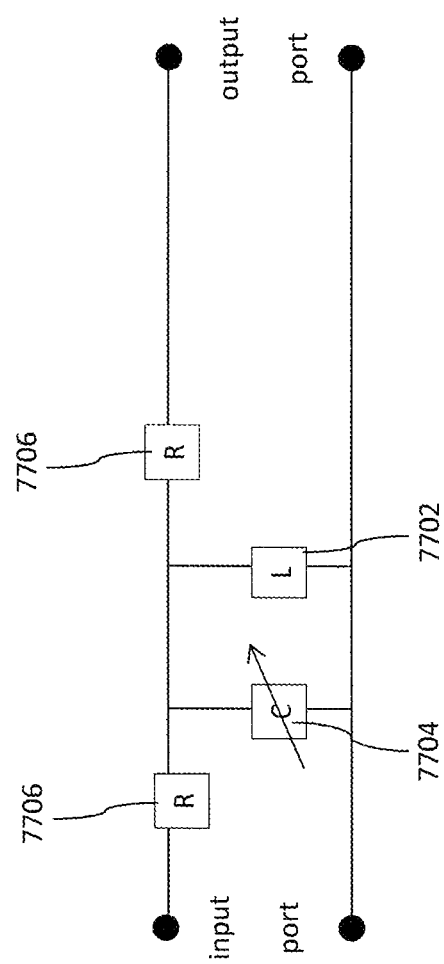
Figure 79:
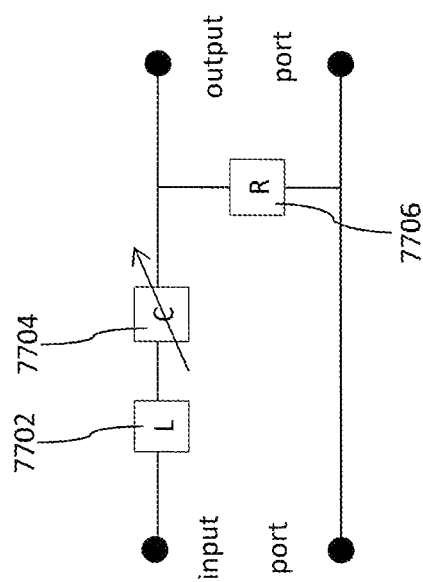

Some specific examples of such sub-circuits are shown in FIG. 77 through 79. FIG. 77 shows a variable delay line with a ladder network of inductors 7702 and capacitors 7704, where the capacitors 7704 are variable, and may be varactor diodes. Port matching of this sub-circuit gives rise to a magnitude response which may be optimized for a desired frequency range. Referring to FIGS. 78 and 79, a series or parallel resonator may be used, which include an inductor 7702, a variable capacitor 7704, and resistors 7706 as required. FIG. 78 shows a possible tunable delay line having inductors 7702 and capacitors 7704. The capacitors 7704 are controllable with a tuning voltage, as represented by the arrows. The more LC sections used, the better the approximation of a variable delay function. FIG. 79 shows a possible phase shifter having a parallel resonance circuit with resistors 7706, a variable capacitor 7704, and an inductor 7702, where the capacitor 7704 is variable by an applied tuning voltage as represented by the arrow.

Figure 80:
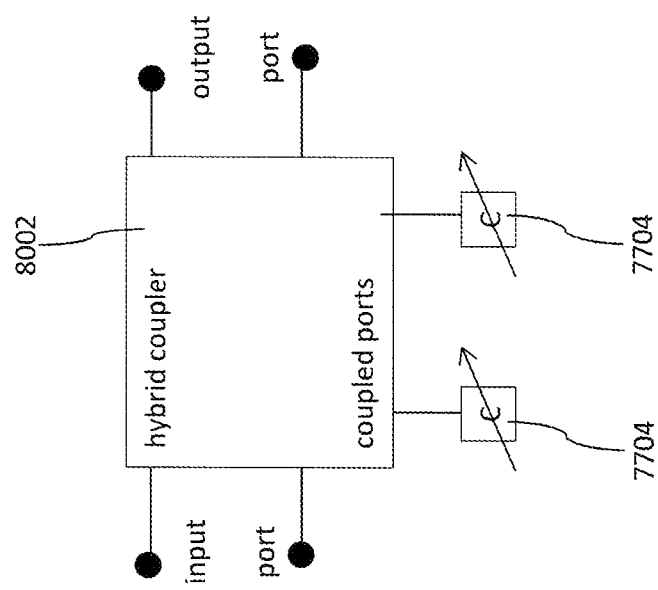

FIG. 80 shows a possible implementation of a phase shifter implemented using a hybrid coupler 8002, which may be described as a distributed or lumped element hybrid coupler, or rat race coupler, where variable capacitors 7704 are attached to the coupled ports. The phase of coupler 8002 is controllable by appropriate adjustments of the capacitors 7704.

Now consider the CAF-1 with a single variable resonator sub-circuit. Potentially, with careful design, the phase shift may be a multiple of 360 degrees at a desired frequency within the passband of the resonator. Shifting the resonant frequency equivalently shifts the phase. The CAF-1 response peak will occur where the loop phase shift is a multiple of 360 degrees. The limitation with the CAF-1 with only a variable resonator is that the phase shift adjustment of the resonator is limited. Hence if the loop has a large phase error, then there is not enough range with the single resonator, requiring a variable and fixed phase shifter to be added. However, based on the above discussion, this is equivalent to stringing a number of delay controllable sub-circuits in series.

Figure 81:
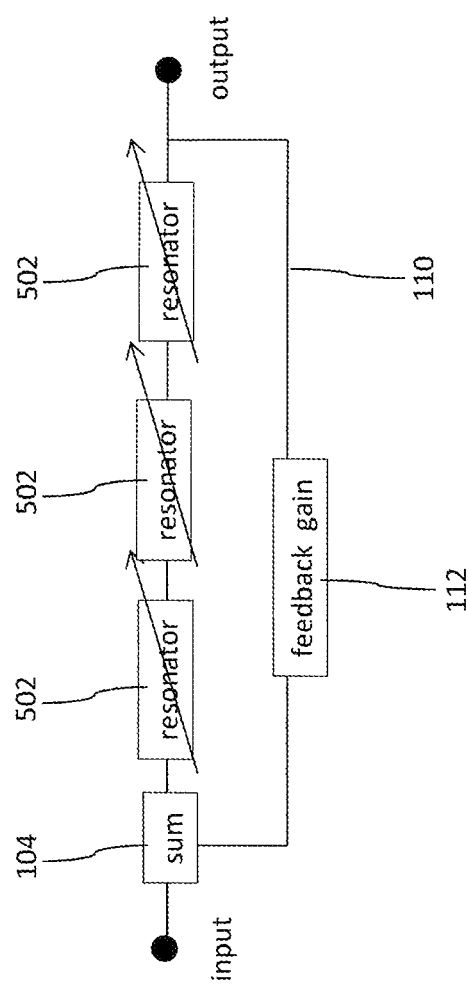

Now consider substituting another resonator for the variable phase shifter. The phase shifter has a flatter frequency response in terms of magnitude and can therefore be used over a larger frequency range, but this comes at a cost of adding more components, some of which are difficult to integrate into a chip. If three resonators are added, this is equivalent to a CAF-3. This is shown in FIG. 81, with three variable resonators 502, which may be CAF-1 elements, a feedback path 110, a coupler 104, and a gain element 112, which may be controllable.

It will be recognized that there may also be more than three resonators. With more controllable resonators present, more delay adjustment is possible and this implies a broader frequency range of tuning without having to add fixed phase shifters.

In this patent document, the word "comprising" is used in its non-limiting sense to mean that items following the word are included, but items not specifically mentioned are not excluded.

A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

The invention claimed is:

1. A variable analog filter, comprising:
a signal loop comprising a signal path and a feedback path connected between a signal input and a signal output; and
a plurality of circuit elements connected in the signal loop, the plurality of circuit elements comprising:
a plurality of frequency tunable resonators connected in series; and
an adjustable scaling block that applies a gain factor that is adjustable in a range that comprises a positive gain and a negative gain; and
a controller connected to tune the frequency of each frequency tunable resonator and to adjust the gain factor of the adjustable scaling block toward a desired frequency response.

2. The variable analog filter of claim 1, wherein the frequency tunable resonators and the adjustable scaling block are connected in series in the signal path of the signal loop.

3. The variable analog filter of claim 1, wherein the controller adjusts the frequency tunable resonators to achieve a desired phase shift in the signal loop.

4. The variable analog filter of claim 1, wherein two or more frequency tunable resonators are connected in primary signal loops, the primary signal loops being connected in series within the signal loop, each primary signal loop comprising a primary adjustable scaling block that is controlled by the controller between a negative gain factor and a positive gain factor.

5. The variable analog filter of claim 1, wherein the controller is programmed to selectively Q-spoil or Q-enhance one or more frequency tunable resonators toward the desired frequency response.

6. The variable analog filter of claim 5, wherein the controller is programmed to Q-spoil the one or more frequency tunable resonators by applying a negative gain factor, and Q-enhance the one or more frequency tunable resonators by applying a non-negative gain factor.

7. A multipole filter comprising a plurality of variable analog filters of claim 1 connected in series, in parallel, or combinations thereof.

8. A method of filtering an analog electromagnetic signal, the method comprising the steps of:
providing a filter comprising:
a signal loop comprising a signal path and a feedback path connected between a signal input and a signal output; and
a plurality of circuit elements connected in the signal loop, the plurality of circuit elements comprising:
a plurality of frequency tunable resonators connected in series; and
an adjustable scaling block that applies a gain factor that is adjustable in a range that comprises a positive gain and a negative gain; and
tuning the frequency of the frequency tunable resonators and adjusting the gain factor of the adjustable scaling block toward a desired frequency response.

9. The method of claim 8, further comprising the step of controlling a phase shift within the signal loop by adjusting the frequency tunable resonators.

10. The method of claim 9, wherein controlling the phase shift comprises detuning the frequency tunable resonators from a central frequency of the filter.

11. The method of claim 8, wherein the frequency tunable resonators and the adjustable scaling block are connected in series in the signal path of the signal loop.

12. The method of claim 8, wherein two or more frequency tunable resonators are connected in primary signal loops, the primary signal loops being connected in series within the signal loop, each primary signal loop comprising a primary adjustable scaling block that is adjusted between a negative gain factor and a positive gain factor.

13. The method of claim 8, wherein the frequency tunable resonators are selectively Q-spoiled or Q-enhanced toward the desired frequency response.

14. The method of claim 13, wherein the frequency tunable resonators are Q-spoiled by applying a negative gain factor or Q-enhanced by applying a non-negative gain factor.

\* \* \* \* \*